(12) United States Patent (10) Patent No.: US 7,754,293 B2
Aoyama et al. (45) Date of Patent: Jul. 13, 2010

(54) FILM FORMING METHOD

(75) Inventors: Shintaro Aoyama, Nirasaki (JP);
Masanobu Igeta, Albany, NY (US);
Kazuyoshi Yamazaki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 296 days.

(21) Appl. No.: 11/454,095

(22) Filed: Jun. 16, 2006

(65) Prior Publication Data
US 2006/0234515 A1 Oct. 19, 2006

Related U.S. Application Data

(63) Continuation of application No. PCT/JP2004/018827, filed on Dec. 16, 2004.

(30) Foreign Application Priority Data
Dec. 18, 2003 (JP) .............................. 2003-421481

(51) Int. Cl.
*B05D 3/00* (2006.01)
*C08J 7/18* (2006.01)
*G21H 5/00* (2006.01)
*G21H 1/00* (2006.01)
*B01J 19/08* (2006.01)
*B29C 71/02* (2006.01)
*B29C 71/04* (2006.01)
*C04B 41/00* (2006.01)
*H01F 41/00* (2006.01)

(52) U.S. Cl. ...................... 427/553; 427/532; 427/457
(58) Field of Classification Search ............ 427/255.11, 427/255.18, 255.23, 255.26, 255.27, 255.28, 427/255.29, 255.37
See application file for complete search history.

(56) References Cited

U.S. PATENT DOCUMENTS
4,028,135 A * 6/1977 Vig et al. ..................... 134/1
(Continued)

FOREIGN PATENT DOCUMENTS
JP 09-153489 6/1997
(Continued)

OTHER PUBLICATIONS

English Translation of Summary of Office Action mailed Oct. 6, 2009 Issued With Respect To The Japanese Patent Application No. 2005-516343.*
Offenberg, M., et al., J. Vac. Sci. Technol., A9(3), May/Jun. 1991, pp. 1058-1065, "Surface Etching and Roughening in Integrated Processing of Thermal Oxides".
(Continued)

*Primary Examiner*—Michael Cleveland
*Assistant Examiner*—Michael G Miller
(74) *Attorney, Agent, or Firm*—Oblon, Spivak, McClelland, Maier & Neustadt, L.L.P.

(57) ABSTRACT

A film forming method for forming an oxide film on a surface of a substrate to be processed in a processing vessel at a predetermined processing temperature, wherein the method includes a temperature elevating step of elevating a temperature of said substrate to a predetermined processing temperature, the step of elevating the temperature including a step of holding the substrate in an atmosphere containing oxygen before the substrate reaches a temperature of 450° C. The film forming method further comprises, after the step of elevating the temperature, a film forming step of forming a radical oxide film by irradiating the substrate surface with energy capable of exciting an oxygen gas.

19 Claims, 38 Drawing Sheets

U.S. PATENT DOCUMENTS

| | | | |
|---|---|---|---|
| 4,558,660 A * | 12/1985 | Nishizawa et al. | 118/725 |
| 4,702,936 A * | 10/1987 | Maeda et al. | 427/583 |
| 4,839,145 A * | 6/1989 | Gale et al. | 118/725 |
| 4,951,601 A * | 8/1990 | Maydan et al. | 118/719 |
| 5,009,926 A * | 4/1991 | Fukuda | 427/557 |
| 5,330,935 A * | 7/1994 | Dobuzinsky et al. | 438/767 |
| 6,927,112 B2 | 8/2005 | Igeta et al. | |
| 6,975,018 B2 | 12/2005 | Ohmi et al. | |
| 2004/0185676 A1 | 9/2004 | Hasegawa | |
| 2004/0241991 A1 | 12/2004 | Aoyama et al. | |

FOREIGN PATENT DOCUMENTS

| | | |
|---|---|---|
| JP | 11-162970 | 6/1999 |
| JP | 2002-100627 A | 4/2002 |
| JP | 2003-031565 A | 1/2003 |
| JP | 2003-218082 A | 7/2003 |
| WO | WO 02/23614 A1 | 3/2002 |

OTHER PUBLICATIONS

Kasi, S.R., et al., J. Vac. Sci. Technol., A10(4), Jul./Aug. 1992, pp. 795-801, "Preoxidation Si Cleaning and Its Impact on Metal Oxide Semiconductor Characteristics".

Kawase, K., et al., Technical Report of IEICE SDM2002-189 (Oct. 2002) pp. 7-12, The Institute of Electronics, Information and Communication Engineers, "XPS Study of H-Terminated Silicon Surface Annealed in Non-Oxidizing Atmosphere".

Takahashi, K., et al., Jpn. J. Appl. Phys., vol. 41(2002), pp. L-223-L225, Part 2, No. 3A, Mar. 1, 2002, "Energy Barrier for Valence Electrons at $SiO_2$/Si(111)Interface".

* cited by examiner

Suboxide

Oxide

UV O2/RFN 450C a thickness reaching 1 nm is formed already on the substrate surface at the time of starting the desired film forming process, in the event the film formation is to be made at the temperature of about 900° C. In the case of forming a gate insulation film, in particular, such increase of film thickness causes an increase in the lower limit thickness of the gate insulation film, thus imposing limitations to the improvement of operational speed in miniaturized semiconductor devices attained by decrease of the gate length. Particularly, in the case the insulation film thus formed is used for an interface film and a high-K dielectric gate insulation film is to be formed by forming a high-K dielectric film on such an interface film, the effect of decreasing the oxide film equivalent thickness attained by using such a high-K dielectric film is cancelled out.

FILM FORMING METHOD

CROSS-REFERENCE TO RELATED APPLICATIONS

The present invention is a continuation application filed under 35 U.S.C.111(a) claiming benefit under 35 U.S.C.120 and 365(c) of PCT application JP2004/018827 filed on Dec. 18, 2004 and Japanese patent application 2003-421481 filed on Dec. 18, 2003, the entire contents of each are incorporated herein as reference.

BACKGROUND OF THE INVENTION

The present invention generally relates to semiconductor devices and more particularly to a film forming method of an insulation film suitable for production of ultra-miniaturized high-speed semiconductor devices.

With the progress in the art of device miniaturization, it is becoming possible in ultra high-speed semiconductor devices of these days to realize a semiconductor device having a gate length of 0.1 μm or less.

Generally, operational speed of a semiconductor device is improved with device miniaturization, while with such highly miniaturized semiconductor devices, there is a need of reducing the film thickness of the gate insulation film in accordance with scaling law with decrease of the gate length.

On the other hand, when the gate length has become 0.1 μm or less, it becomes necessary to set the thickness of the gate insulation film to 1-2 nm in the case a conventional thermal oxide film is used for the gate insulation film. With such a very thin gate insulation film, however, there occurs an increase of tunneling current, and it is not possible to avoid the problem of increase of the gate leakage current.

In the case of forming a gate insulation film with such a high-K dielectric material, it is preferable to form a silicon oxide film or silicon oxynitride film at the interface between the silicon substrate and the gate insulation film as the interface film with a film thickness of preferably 0.4 nm. Reference should be made to WO03/049173 official gazette, for example.

With the technology of WO03/049173, it becomes possible to form a high-quality insulation film on the silicon substrate surface at a low temperature of 450° C. or less, with a film thickness of about 0.4 nm in the case of a silicon oxide film or with the film thickness of about 0.5 nm in the case of a silicon oxynitride film.

However, in the case attempt has been made to form an oxide film or oxynitride film of the thickness of 0.4-0.5 nm at the temperature that exceeds 450° C., on the other hand, there arise various problems as will be explained below.

Conventionally, it has been practiced, when a silicon substrate is introduced into a processing vessel of a deposition apparatus as a substrate to be processed, to hold the substrate in the processing vessel in an oxygen gas atmosphere until a predetermined processing temperature is reached. Thereby, the problem of formation of projections and depressions on the substrate surface due to the etching reaction of volatile SiO, which may be formed when the substrate to be processed is held in an atmosphere of extremely low oxygen partial pressure as a result of the reaction caused between residual oxygen remaining in the atmosphere with extremely small amount and silicon on the substrate surface (M. Offenberg, J. Vac. Sci. Technol. A9, pp. 1058, 1991), is avoided.

However, when an oxidizing atmosphere is used in the temperature elevating step at the beginning phase of film formation, there arises a problem in that an oxide film having In the case the initial temperature elevating step is carried out under a non-oxidizing atmosphere such that there is formed no oxide film, on the other hand, it is known that there arises a problem, in addition to the foregoing problem of formation of projections and depressions, in that the organic substance, contained in the air and adhered to the silicon substrate surface, forms SiC with elevation of temperature, by causing reaction with silicon on the substrate surface. Reference should be made for example to WO03/063220 or Kawase, et al., Technical Report of IEICE, SDM 2002-189, (2002-10).

When there is formed an insulation film such as oxide film on the substrate surface where SiC is formed, there is caused a tunneling leakage current in view of small bandgap of SiC, leading to the problem of remarkable increase of leakage current of the insulation film.

SUMMARY OF THE INVENTION

According to an aspect of the present invention, there is provided a film forming method for forming an oxide film on a surface of a substrate to be processed in a processing vessel at a predetermined processing temperature, said method comprising:

a temperature elevating step of elevating a temperature of said substrate to a predetermined processing temperature, said step of elevating the temperature including a step of holding said substrate in an atmosphere containing oxygen before said substrate reaches a temperature of 450° C., and wherein said film forming method further comprises, after said step of elevating the temperature, a film forming step of forming a radical oxide film by irradiating said substrate surface with energy capable of exciting an oxygen gas.

In another aspect, the present invention provides a film forming method, comprising the steps of:

forming an oxide film on a surface of said substrate to be processed; and annealing said oxide film in an inert gas atmosphere, said step of forming said oxide film comprises the steps of:

supplying a gas containing oxygen to said substrate surface;

forming oxygen radicals by exciting said gas containing oxygen by ultraviolet radiation; and oxidizing said substrate surface with said oxygen radicals, said step of oxidizing said substrate surface being carried out at a substrate processing temperature of 450° C. or less, said thermal annealing step being carried out at a temperature higher than said substrate processing temperature.

In another aspect, the present invention provides a film forming method capable of forming a high-quality silicon oxide film or silicon oxynitride film with high throughput by a simple process at the temperature of 450° C. or higher, without causing increase of film thickness, without causing SiC formation on the substrate surface and without forming projections and depressions on the substrate surface.

In another aspect, the present invention provides a substrate processing method capable of suppressing SiC formation in a temperature elevation step for elevating the temperature of a substrate to be processed to 450° C. or higher, without causing increase of film thickness.

In another aspect, the present invention provides a substrate processing method capable of improving an insulation film formed on a silicon substrate with regard to film quality and interface characteristics between the insulation film and the silicon substrate.

DETAILED DESCRIPTION OF THE PREFERRED EMBODIMENTS

According to the present invention, in which ultraviolet radiation is applied to the atmosphere containing oxygen at the time of elevating the temperature of the substrate to be processed, the substrate surface is covered promptly by oxygen atoms as the substrate surface is activated due to desorption of hydrogen terminating the substrate surface when the substrate temperature has exceeded 450° C., and organic substances or carbon remaining on the substrate surface is removed by causing reaction with oxygen. Thereby, it becomes possible to suppress formation of SiC on the substrate surface effectively. Particularly, it becomes possible to lower the partial pressure of the oxygen gas, which has to be introduced for suppressing the SiC formation during the temperature elevation step of the substrate to be processed, by applying the ultraviolet irradiation, and formation of oxide film on the silicon substrate surface during the temperature elevation step, and hence before commencement of substantial film forming step. As a result, it becomes possible to conduct the desired film formation with high throughput while suppressing the SiC formation.

Further, according to the present invention, it becomes possible to suppress the formation of SiC even when the substrate temperature is elevated to a temperature exceeding 450° C. for the purpose of thermal annealing process to be carried out later, by forming an oxide film first on the surface of the substrate to be processed by the oxygen radicals excited by ultraviolet radiation, and the film properties are improved. Further, a flat interface is obtained between the substrate and the oxide film, and the interface characteristics are improved.

[Apparatus]

First, the substrate processing apparatus 20 used with the present invention will be explained.

Figure 1:
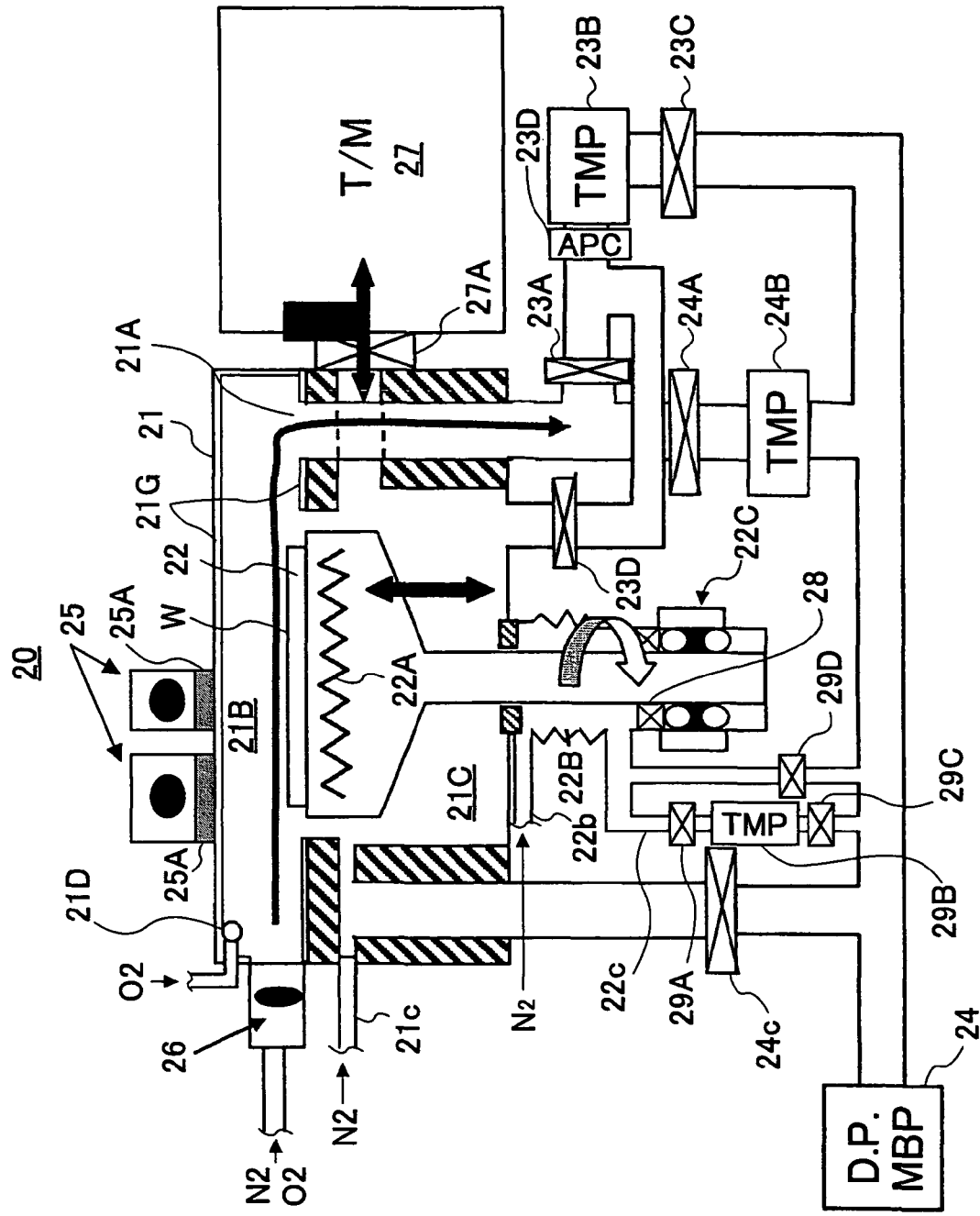
FIG. 1 is a diagram showing the construction of a substrate processing apparatus used with the present invention.

FIG. 1 shows the construction of a substrate processing apparatus 20 used with the present invention.

Referring to FIG. 1, the substrate processing apparatus 20 includes a processing vessel 21 accommodating therein a stage 22 equipped with a heater 22A such that the stage 22 is movable vertically between a process position and a substrate load/unload position. The stage 22 is rotated by a drive mechanism 22C, and the processing vessel 21 defines a process space 21B therein together with the stage 22. The inner surface of the processing vessel 21 is covered with an inner liner 21G of a quartz glass, and the inner liner 21G suppresses the metal contamination of the substrate to be processed to the level of $1 \times 10^{10}$ atoms/cm$^2$ or less.

Further, there is provided a magnetic seal 28 at the connecting part of the stage 22 and the drive mechanism 22C such that the magnetic seal 28 separates a magnetic seal chamber 22B held in a vacuum environment from the drive mechanism 22C formed in the atomic environment. Because the magnetic seal 28 is a liquid, the stage 22 is held so as to be able to rotate freely.

In the illustrated state, the stage 22 is held at the process position and there is formed a load/unload chamber 21C underneath the stage 22 for loading and unloading the substrate. The processing vessel 21 is connected to a substrate transfer unit 27 via a gate valve 27A, and thus, the substrate W is transported to the stage 22 from the substrate transfer unit 27 via the gate valve 27A in the state that stage 22 has been lowered to the load/unload chamber 21C. Further, the processed substrate W is transferred to the substrate transfer unit 27 from the stage 22.

In the substrate processing apparatus 20 of FIG. 1, there is formed an evacuation port 21A near the gate valve 27 of the processing vessel 21, and a turbo molecular pump 23B is connected to the evacuation port 21A via the valve 23A and an APC (automatic pressure controller) 24B. The turbo molecular pump 23B is further connected to a pump 24 formed of a dry pump and a mechanical booster pump via a valve 23C, and the pressure inside the process space 21B can be reduced to the level of $1.33 \times 10^{-1}$–$1.33 \times 10^{-4}$ Pa ($10^{-3}$–$10^{-6}$ Torr) by driving the turbo molecular pump 23B and the dry pump 24.

It should be noted that the evacuation port 21A is connected also to the pump 24 directly via a valve 24A and an APC 24B, and thus, the pressure of the process space is reduced to the level of 1.33 Pa-1.33 kPa (0.01-10 Torr) by the pump 24 when the valve 24A is opened.

The processing vessel 21 is provided with a process gas supplying nozzle 21D at the side opposite to the evacuation port 21A across the substrate W, and an oxygen gas is supplied to the process gas supplying nozzle 21D. The oxygen gas thus supplied to the process gas supplying nozzle 21D is caused to flow in the process space 21B along the surface of the substrate W and is evacuated from the evacuation port 21A.

In order to activate the process gas thus supplied from the process gas supplying nozzle 21D, the substrate processing apparatus 20 of FIG. 1 is provided with an ultraviolet optical source 25 having a quartz window 25A on the processing vessel 21 in correspondence to the region located between the process gas supplying nozzle 21D and the substrate W. Thus, by driving the ultraviolet source 25, the oxygen gas introduced in to the process space 21B from the process gas supplying nozzle 21D is activated, and there are formed oxygen radicals. The oxygen radicals thus formed are caused to flow along the surface of the substrate W. As a result, it becomes possible to form a radical oxide film on the surface of the substrate W with a thickness of 1 nm or less, particularly with the thickness of about 0.4 nm, which corresponds to the thickness of 2-3 atomic layers.

Further, the processing vessel 21 is provided with a remote plasma source 26 at the side thereof opposite to the evacuation port 21A with respect to the substrate W to be processed. Thus, nitrogen radicals are formed by supplying a nitrogen gas to the remote plasma source 26 together with an inert gas such as Ar and by activating the nitrogen gas thus supplied with plasma. The nitrogen radicals thus formed are caused to flow along the surface of the substrate W and causes nitridation of the substrate surface. By introducing oxygen into the remote plasma source 26 in place of nitrogen, it is also possible to oxidize the substrate surface.

In the substrate processing apparatus 20 of FIG. 1, there is provided a purge gas line 21c for purging the load/unload chamber 21C with a nitrogen gas. Further, there is provided a purge line 22b for purging the magnetic seal chamber 22B with a nitrogen gas and an evaluation line 22c of the purge gas.

In more detail, the evacuation line 22c is connected to a turbo molecular pump 29B via a valve 29A, and the turbo molecular pump 29B is connected to the pump 24 via a valve 29C. Further, the evacuation line 22c is connected directly to the pump 24 via a valve 29D. With this, it becomes possible to maintain the magnetic seal chamber 22B at various pressures.

The load/unload chamber 21C is evacuated by the pump 24 via the valve 24C or by the turbo molecular pump 23B via the valve 23D. Further, in order to avoid contamination in the process space 21B, the load/unload chamber 21C is held at a lower pressure than the process space 21B, and the magnetic seal chamber 21B is held at a further lower pressure than the load/unload chamber 21C by a carrying out differential evacuation process.

Hereinafter, the ultraviolet radical oxidation process and the remote plasma radical nitridation process carried out subsequently to the radical oxidation process on the surface of the substrate W by using the substrate processing apparatus 20 of FIG. 3 will be explained.

[Ultraviolet Radical Oxidation (UV-O$_2$) Processing]

Figure 2:
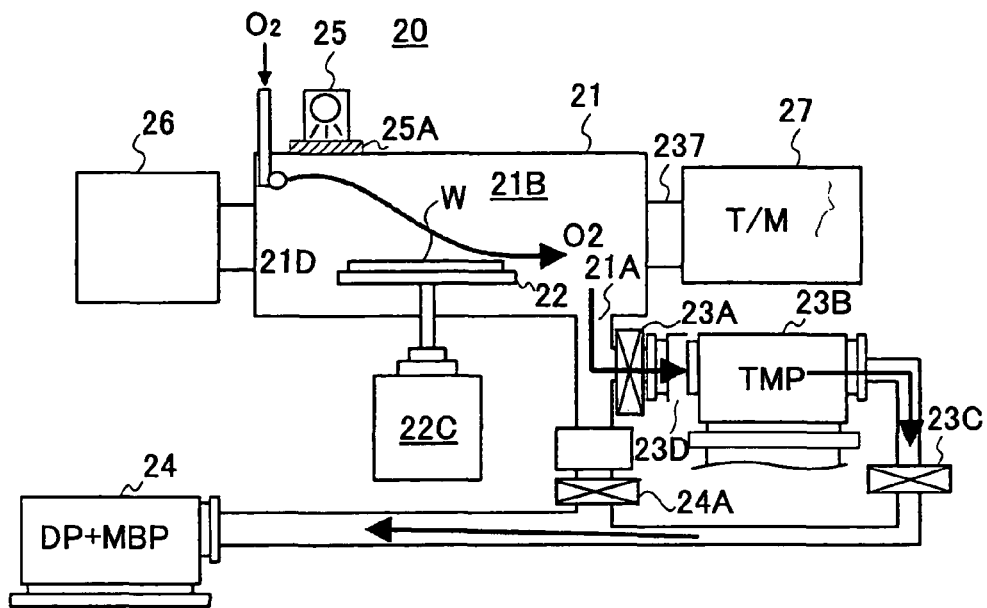
FIG. 2 is a diagram showing the outline of UV-$O_2$ processing carried out by using the substrate processing apparatus of FIG. 1.

FIG. 2 is a diagram showing the radical oxidation process of the substrate W to be processed by using the substrate processing apparatus 20 of FIG. 1 in a side view.

Referring to FIG. 2, an oxygen gas is supplied to the process space 21B from the process gas supplying nozzle 21D and the oxygen gas thus supplied is evacuated, after flowing along the surface of the substrate W, via the evacuation port 21A, the APC 23D, the turbo molecular pump 23B and the pump 24. By using the turbo molecular pump 23B and the APC 23D, the base pressure in the process space 21B is set to the level of $1 \times 10^{-3}$-$10^{-6}$ Torr, which is needed for the oxidation of the substrate by oxygen radicals.

Simultaneously to this, the ultraviolet source 25, preferably the one that produces ultraviolet radiation of 172 nm wavelength, is activated, and oxygen radicals are formed in the oxygen gas flow thus formed. The oxygen radicals thus formed cause oxidation of the substrate surface as they are caused to flow along the rotating substrate W to be processed. Thus, as a result of the oxidation of the substrate W by the ultraviolet-activated oxygen radicals (referred to hereinafter as UV-$O_2$ processing), a very thin oxide film having a thickness of 1 nm or less, particularly the thickness of about 0.4 nm corresponding to the thickness of 2-3 atomic layers, is formed on a surface of a silicon substrate stably and with excellent reproducibility.

Figure 3:
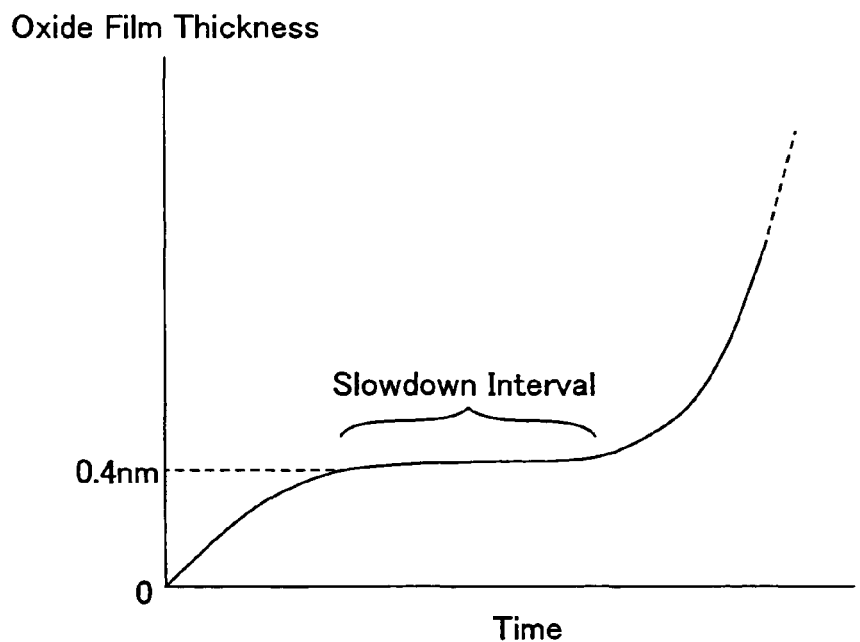
FIG. 3 is a diagram showing a slow-down phenomenon of oxide film growth that appears in the UV-$O_2$ processing of FIG. 2.

FIG. 3 shows schematically the relationship between the film thickness of the oxide film, in other words oxide film growth, and the processing time for the case of forming a silicon oxide film on a silicon substrate W to be processed by the process of FIG. 2 in the substrate processing apparatus of FIG. 1.

As can be seen in FIG. 3, that there appears a slowdown of oxide film growth (the state in which the film growth is stopped) after the start of the growth and when the oxide film has reached a thickness of about 0.4 nm. The growth of the oxide film is restarted only after a certain time has elapsed in the slowdown state.

The relationship of FIG. 3 means that there is a possibility of forming an extremely thin oxide film of the thickness of about 0.4 nm stably in the oxidation process of a silicon substrate surface. Further, the fact that the slowdown state continues for some time indicates that the oxide film thus formed has a uniform thickness. Thus, according to the present invention, it is possible to form an oxide film having a thickness of about 0.4 nm on a silicon substrate with uniform thickness with the process of FIG. 2. Here, it should be noted that the foregoing film thickness of the 0.4 nm is obtained by XPS method and is equal to the thickness of 2-3 silicon atomic layers.

Figure 4A:
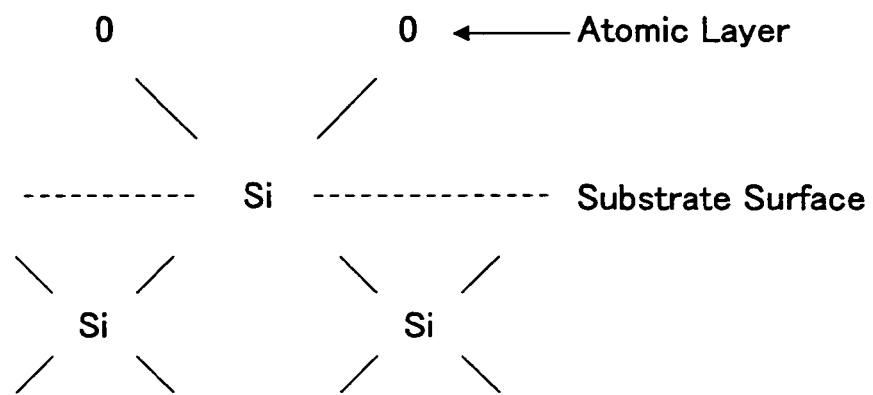
FIG. 4A is a diagram showing the situation in the vicinity of the silicon substrate surface the time of the UV-$O_2$ processing of FIG. 2.
Figure 4B:
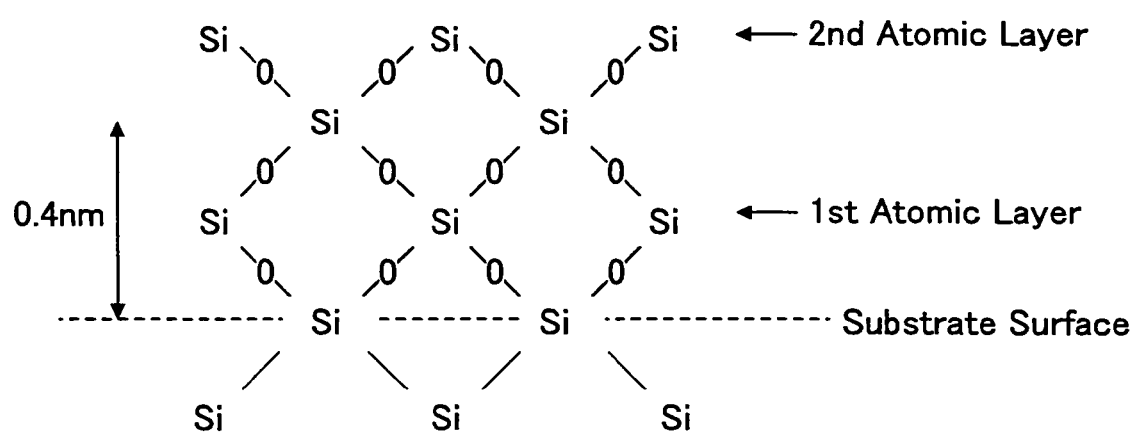
FIG. 4B is another diagram showing the situation in the vicinity of the silicon substrate surface the time of the UV-$O_2$ processing of FIG. 2.

FIGS. 4A and 4B schematically depicts the manner of oxide film formation on such a silicon substrate. In these drawings, it should be noted that the structure formed on a (100) silicon substrate is very much simplified.

Referring to FIG. 4A, it can be seen that two oxygen atoms are bonded to a single silicon atom at the surface of the silicon substrate, and thus, there is formed a single oxygen atomic layer. In this representative state, each silicon atom on the substrate surface are coordinated by two silicon atoms inside the substrate and two oxygen atoms at the substrate surface, and there is formed a sub-oxide ($Si^{2+}$).

In the state of FIG. 4B, on the other hand, each silicon atom at the uppermost part of the silicon substrate is coordinated with four oxygen atoms and takes the stable state of $Si^{4+}$. It is believed that this is the reason why the oxidation proceeds fast in the state of FIG. 4A and slows down when the state of FIG. 4B has appeared. The thickness of the oxide film for the state of FIG. 4B is about 0.4 nm, while this value is in good agreement with the oxide film thickness observed for the slowdown state of FIG. 3.

Such a slowdown of oxide film growth at the thickness of 0.4 nm is thought as not being limited to the UV-$O_2$ radical oxidation process explained with reference to FIG. 2. Rather, this phenomenon would be observed also in any oxide film formation process as long as it is capable of forming extremely thin oxide films with high precision.

By continuing the oxidation process further from the state of FIG. 4B, the thickness of the oxide film starts to increase again.

As a result of slowdown of the oxide film growth at the thickness of 0.4 nm explained with reference to FIG. 3, there occurs a slowdown of film thickness at the time of oxide film growth at the thickness of about 0.4 nm as represented in the diagram (B) of FIG. 5 even in the case there exists a change of film thickness or projections and depressions in the initial oxide film 42 formed on the silicon substrate 41 as shown in the diagram (A) of FIG. 5. Thus, by continuing the oxide film growth during the slowdown period, it becomes possible to obtain an extremely flat oxide film 42 of uniform film thickness as represented in the diagram (C) of FIG. 5.

[Remote Plasma Radical Nitridation (RF-$N_2$) Processing]

Figure 6:
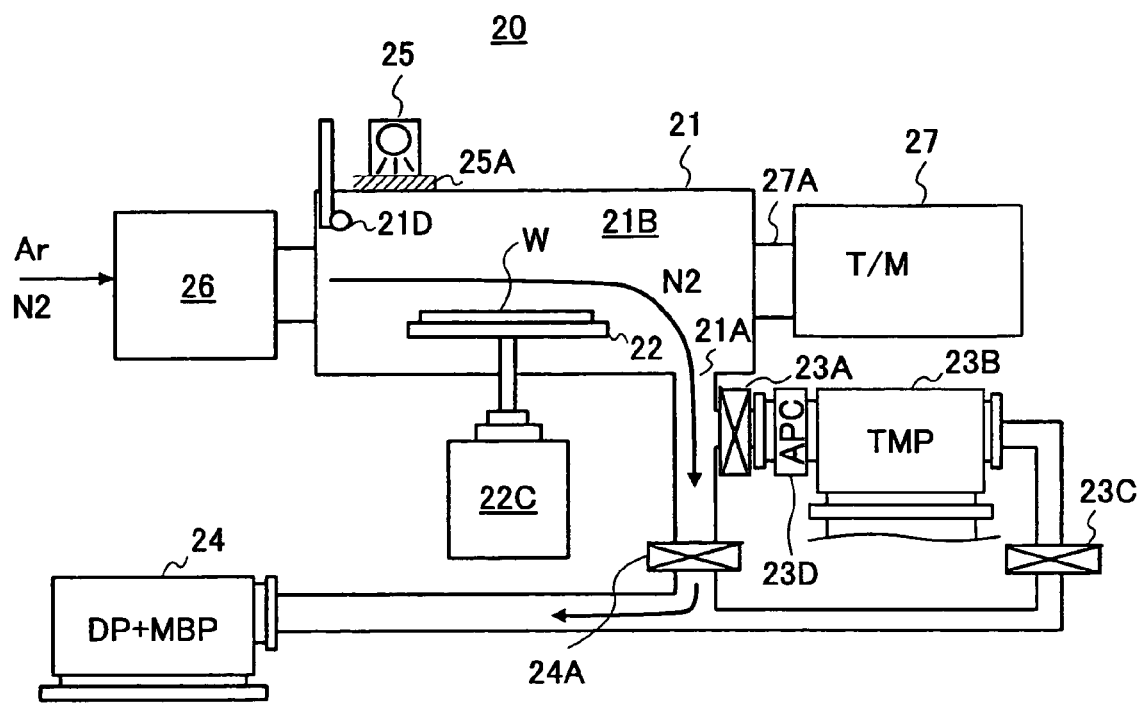
FIG. 6 is a diagram showing the outline of a RF-$N_2$ processing carried out by using the substrate processing apparatus of FIG. 1.

FIG. 6 shows the radical nitridation (RF-$N_2$) processing carried out by the substrate processing apparatus 20 of FIG. 1 in a side view.

Referring to FIG. 6, a remote plasma source of toroidal construction is used in the substrate processing apparatus 20 for the remote plasma radical source 26, wherein the remote plasma radical source 26 is supplied with an Ar gas and a nitrogen gas and nitrogen radicals are formed as a result of excitation of plasma with the high frequency power of several hundred kilohertz frequency. The nitrogen radicals thus formed are caused to flow along the surface of the substrate W and are evacuated via the evacuation port 21A and the pump 24. As a result, the process space 21B is held at a process pressure in the range of 1.33 Pa-1.33 kPa (0.01-10 Torr) suitable for the radical nitridation of the substrate W. Particularly, use of the pressure range of 6.65-133 Pa (0.05-1.0 Torr) is preferable. The nitrogen radicals thus formed cause nitridation in the surface of the substrate W as they are caused to flow along the surface of the substrate W.

Thus, by using the substrate processing apparatus 20 of FIG. 1, it becomes possible to form an extremely thin oxide film on the surface of the substrate W and further nitriding the surface of the oxide film thus formed.

In the nitridation process of FIG. 6, the valves 23A and 23C are opened in the purging step preceding the nitridation step, and the pressure of the processing space 21B is reduced to $1.33 \times 10^{-1}$-$1.33 \times 10^{-4}$ Pa with closure of the valve 24A. With this, oxygen or moisture remaining in the processing space 21B is purged. In the nitridation-processing carried out thereafter, the valves 23A and 23C are closed, wherein the turbo molecular pump 23B is not included in the evacuation path of the processing space 21B. Because the process is carried out at the processing pressures of 1.33 Pa-1.33 kPa (0.01-10 Torr) in the nitridation process of FIG. 6, oxygen or moisture remaining in the processing vessel at the time of the decompressing process to the pressure of $1.33 \times 10^{-1}$-$1.33 \times 10^{-4}$ Pa, is replaced by the nitrogen gas by the time of the processing, and there is caused no increase of film thickness in the nitridation process of FIG. 6 by oxidation.

FIRST EMBODIMENT

Hereinafter, the present invention will be explained with reference to preferred embodiments.

Figure 7:
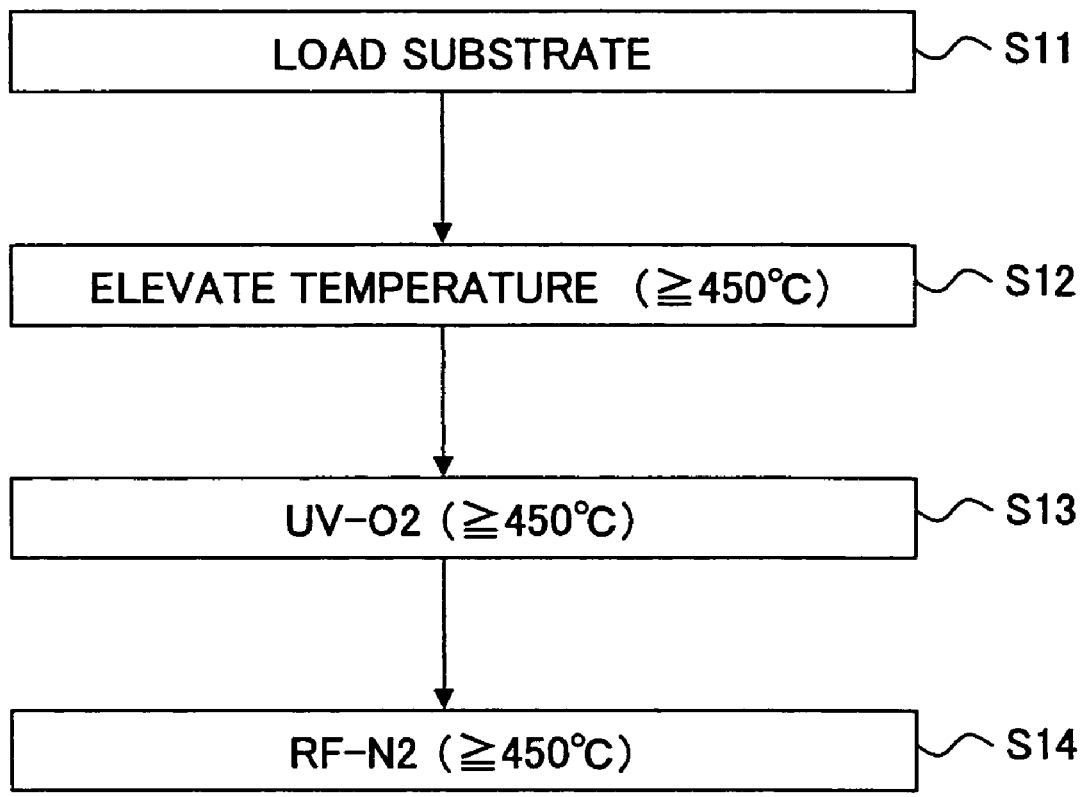
FIG. 7 is a flowchart showing a film forming method according to a first embodiment of the present invention.

FIG. 7 is a flowchart showing a film formation processing according to a first embodiment of the present invention.

Referring to FIG. 7, a silicon substrate is introduced into the processing vessel 21 of the substrate processing apparatus 20 of FIG. 1 in a step 11 of the present invention, wherein the substrate is heated in a step 12 to a processing temperature of 450° C. or higher, such as 650-750° C., for example, and the UV-$O_2$ processing is carried out in the step 13 at the foregoing processing temperature. With this, a silicon oxide film (radical oxide film) of high quality is formed on the silicon substrate surface. Further, according to the needs, the silicon oxide film is converted to an oxynitride film in a step 14 by applying the RF-$N_2$ processing to the silicon oxide film.

Figure 8:
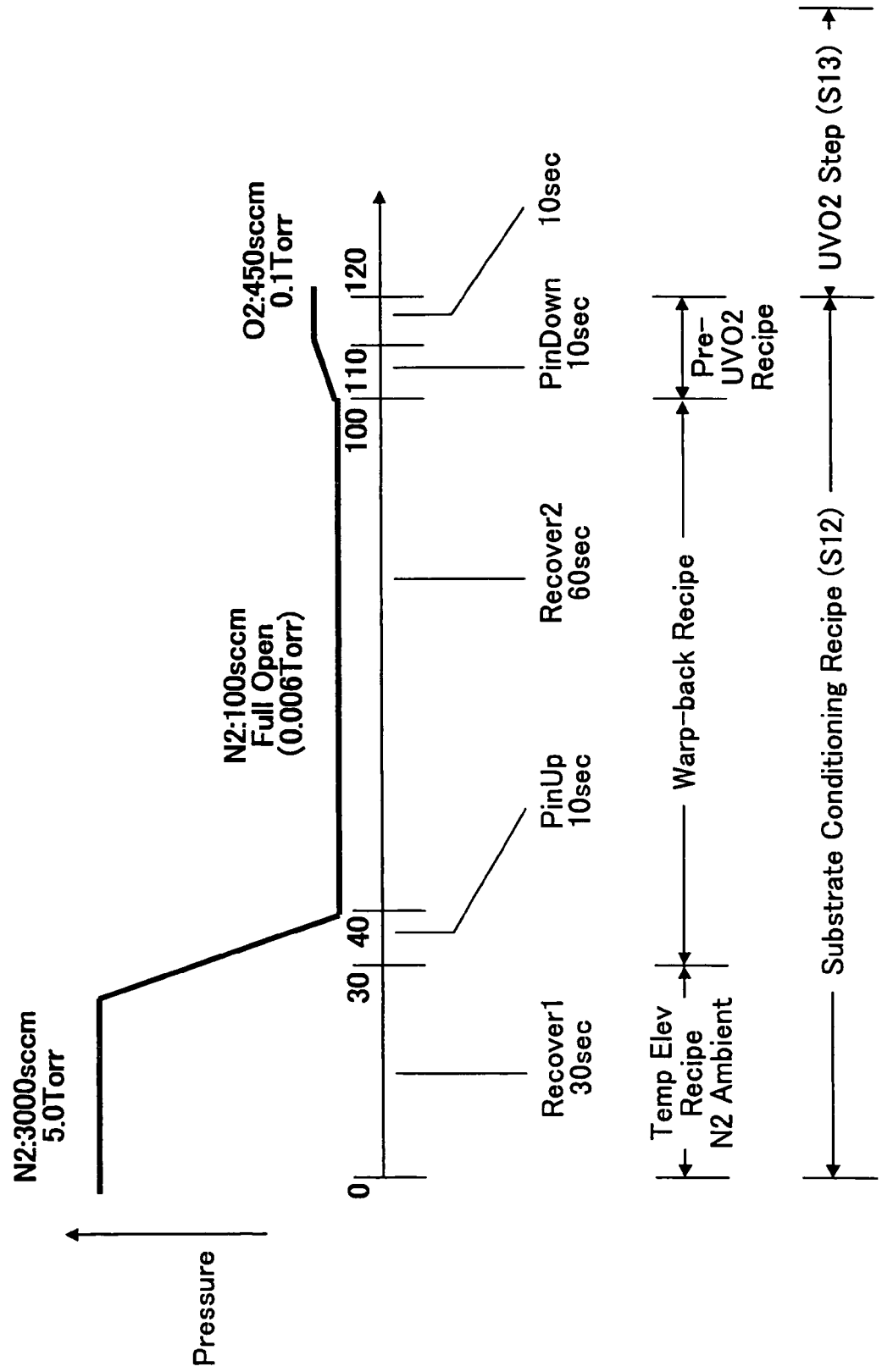
FIG. 8 is a diagram showing an example of the present invention.

FIG. 8 shows one of the temperature elevation recipes used conventionally for temperature elevation step 12 of FIG. 7.

Referring to FIG. 8, a silicon substrate of 30 cm diameter having a clean surface cleaned by DHF (diluted hydrofluoric acid) is introduced to the processing vessel 21 as the substrate W to be processed, and a nitrogen gas is supplied under the pressure of 665 Pa (5 Torr) with the flow rate of 3000 SCCM. Further, the silicon substrate is held in this state on the stage 22 maintained at the temperature of 750° C. for 30 seconds (Recover 1). During this interval, the temperature of the substrate W to be processed is elevated to a predetermined processing temperature (Temperature Elevation Recipe).

After the temperature elevation recipe, a warp-back recipe is carried out for eliminating the warp of the substrate W to be processed. This warp-back recipe constitutes, together with the temperature elevation recipe and a pre-$UVO_2$ recipe to be explain below, a substrate conditioning recipe of the temperature elevation step 12 that precedes the UV-$O_2$ processing in the step 13 of FIG. 7.

More specifically, the nitrogen gas flow rate is set to from 3000 SCCM to 100 SCCM, and the substrate W is lifted up from the stage 22 by actuating a lifter pin provided to the stage 22 (Pin-Up). Further, the processing space 21B inside the processing vessel 21 is reduced to the pressure of 0.798 Pa (0.006 Torr) over the duration of 10 seconds by using the turbo molecular pump 23B. Further, this state is maintained for 60 seconds while maintaining the pressure of 0.798 Pa by supplying the nitrogen gas to the processing space 21B with the flow rate of 100 SCCM. With this, the warp of the substrate W is eliminated (Recover 2).

Thereafter, the supply of the nitrogen gas is stopped, and the lifter pin is lowered (Pin-Down). Thereby, the substrate W free from warp is held on the stage 22. Further, in this state, an oxygen gas is introduced into the processing vessel 21 with the flow rate of 450° C. for 10 seconds, either concurrently to the stopping of supply of the nitrogen gas or after the stopping of supply of the nitrogen gas, such that the pressure of the processing space 21B is set to 13.3 Pa (0.1 Torr). Further, a pre-$UVO_2$ processing of applying ultraviolet radiation is carried out (ultraviolet radiation is not mandatory), and the process is ready for commencement of the UV-$O_2$ processing of the step 13 explained before. In the experiments hereinafter, it should be noted that there is a temperature difference of 50° C. between the holding temperature of the stage 22 and the substrate temperature measured by a substrate equipped with a thermocouple. Thus, the actual substrate processing temperature is about 700° C. in this case. As a result of such a pre-$UVO_2$ processing, the nitrogen gas inside the processing vessel is replaced with the oxygen as, and preflowing of the oxygen gas is made in preparation for the UV-$O_2$ processing. With this, the oxygen flow rate is stabilized.

Figure 9:
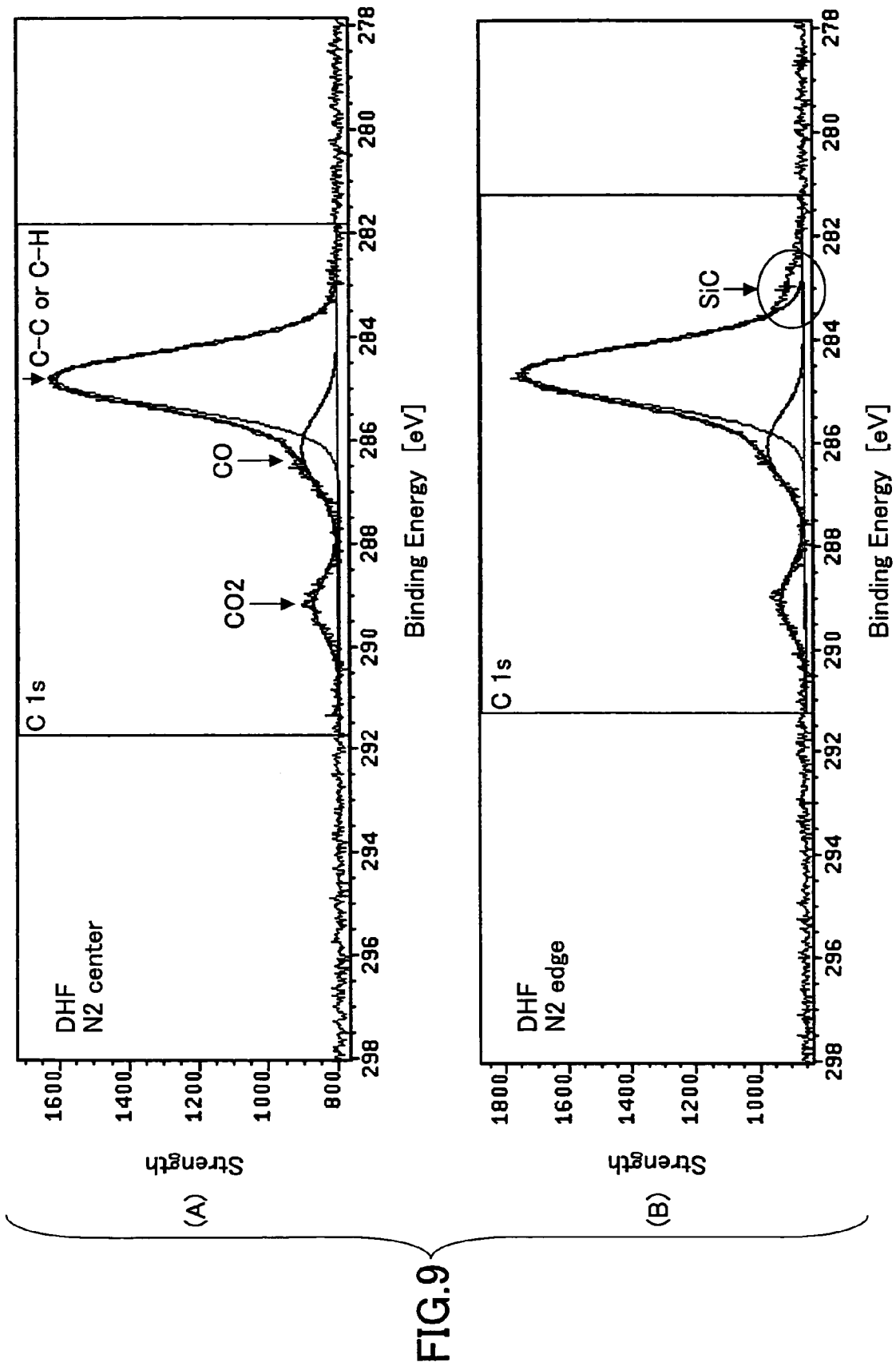
FIG. 9 is another diagram showing an example of the present invention.

FIG. 9 shows an XPS (X-ray photoelectron spectroscopy) spectrum of C1s (carbon 1s orbital) obtained for the silicon substrate heated according to the recipe of the FIG. 8, wherein the diagram (A) of FIG. 9 shows the XPS spectrum at the central part of the substrate, while the diagram (B) of FIG. 9 shows the XPS spectrum at the peripheral part of the substrate. Referring to FIG. 9, the XPS spectrum of carbon 1s orbital shows a peak in the vicinity of 285 eV wherein this carbon is thought as originating primarily from the organic substance absorbed to the substrate surface from the environment. Further, in the vicinity of this peak, there exists a peak of SiC at a slightly lower energy side thereof. With the diagram (B) of FIG. 9 with regard to the peripheral part of the substrate, it can be seen that there exists a substantial peak of SiC originating from the adsorbed organic molecules.

The result of FIG. 9 implies that SiC originating from organic substance is tend to be formed as impurities particularly in the peripheral part of the silicon substrate when such a temperature elevation recipe is executed.

Figure 10:
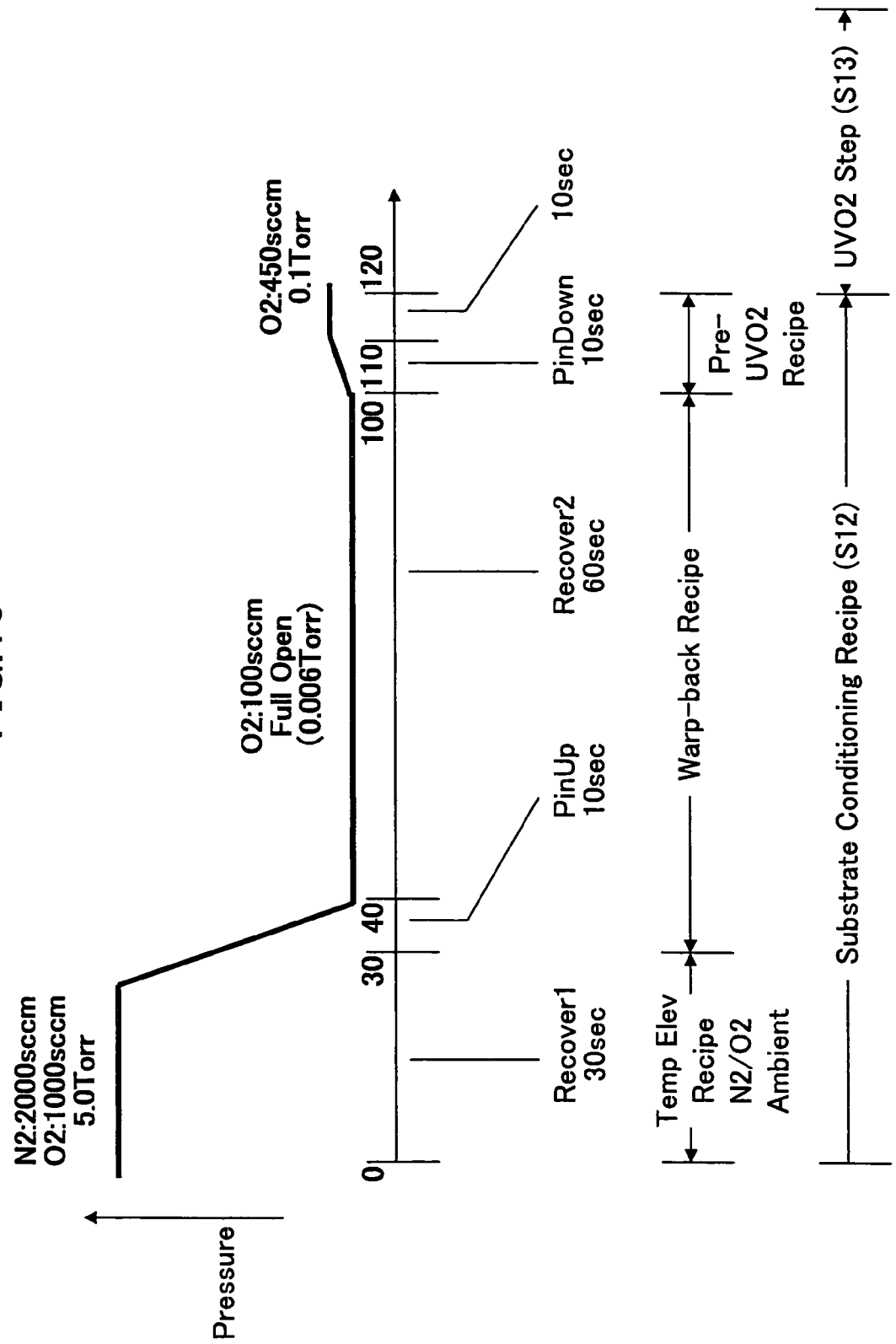
FIG. 10 is another diagram showing an example of the present invention.

FIG. 10 shows the temperature elevation recipe according to an example of the present invention.

Referring to FIG. 10, a silicon substrate of 30 cm diameter having a clean surface cleaned by DHF (diluted hydrofluoric acid) is introduced to the processing vessel 21 as the substrate W to be processed, and a nitrogen gas and an oxygen gas are supplied under the pressure of 665 Pa (5 Torr) respectively with the flow rates of 2000 SCCM and 1000 SCCM. Further, the silicon substrate is held in this state on the stage 22 maintained at the temperature of 750° C. for 30 seconds (Recover 1). During this interval, the temperature of the substrate W to be processed is elevated to a predetermined processing temperature (Temperature Elevation Recipe). In this step of Recover 1, it is important to hold the substrate to be processed in an oxygen gas atmosphere until the temperature reaches 450° C. and it is important that a very thin oxide film, having a thickness of 0.4 nm or less, is formed on the surface of the silicon substrate. By forming such an oxide film before occurrence of desorption of hydrogen terminating the silicon substrate surface, it becomes possible to block the contact of carbon with Si.

After the temperature elevation recipe, a warp-back recipe is carried out for eliminating the warp caused in the substrate W to be processed during the temperature elevation step. This warp-back recipe constitutes, together with the temperature elevation recipe and a pre-$UVO_2$ recipe to be explain below, a substrate conditioning recipe of the temperature elevation step 12 that precedes the UV-$O_2$ processing in the step 13 of FIG. 7.

More specifically, the substrate W is lifted up from the stage 22 by actuating a lifter pin provided to the stage 22 (Pin-Up). Further, the supply of the nitrogen gas is terminated and the flow rate of the oxygen gas is reduced to 100 SCCM at the same time, and the processing space 21B inside the processing vessel 21 is reduced to the pressure of 0.798 Pa (0.006 Torr) over the duration of 10 seconds by using the turbo molecular pump 23B. Further, this state is maintained for 60 seconds while maintaining the pressure of 0.798 Pa by supplying the oxygen gas to the processing space 21B with the flow rate of 100 SCCM. With this, the warp of the substrate W is eliminated (Recover 2).

Thereafter, the lifter pin is lowered (Pin-Down), and the substrate W free from warp is held on the stage 22. Further, in this state, the oxygen gas flow rate is increased to 450 SCCM over the duration of 10 seconds, and the pressure of the processing space 21B is set to 13.3 Pa (0.1 Torr). Further, a pre-$UVO_2$ processing of applying ultraviolet radiation is carried out (ultraviolet radiation is not mandatory), and the process is ready for commencement of the UV-$O_2$ processing of the step 13 explained before. As a result of such a pre-$UVO_2$ processing, the nitrogen gas inside the processing vessel is replaced with the oxygen as, and preflowing of the oxygen gas is made in preparation for the UV-$O_2$ processing. With this, the oxygen flow rate is stabilized.

Figure 11:
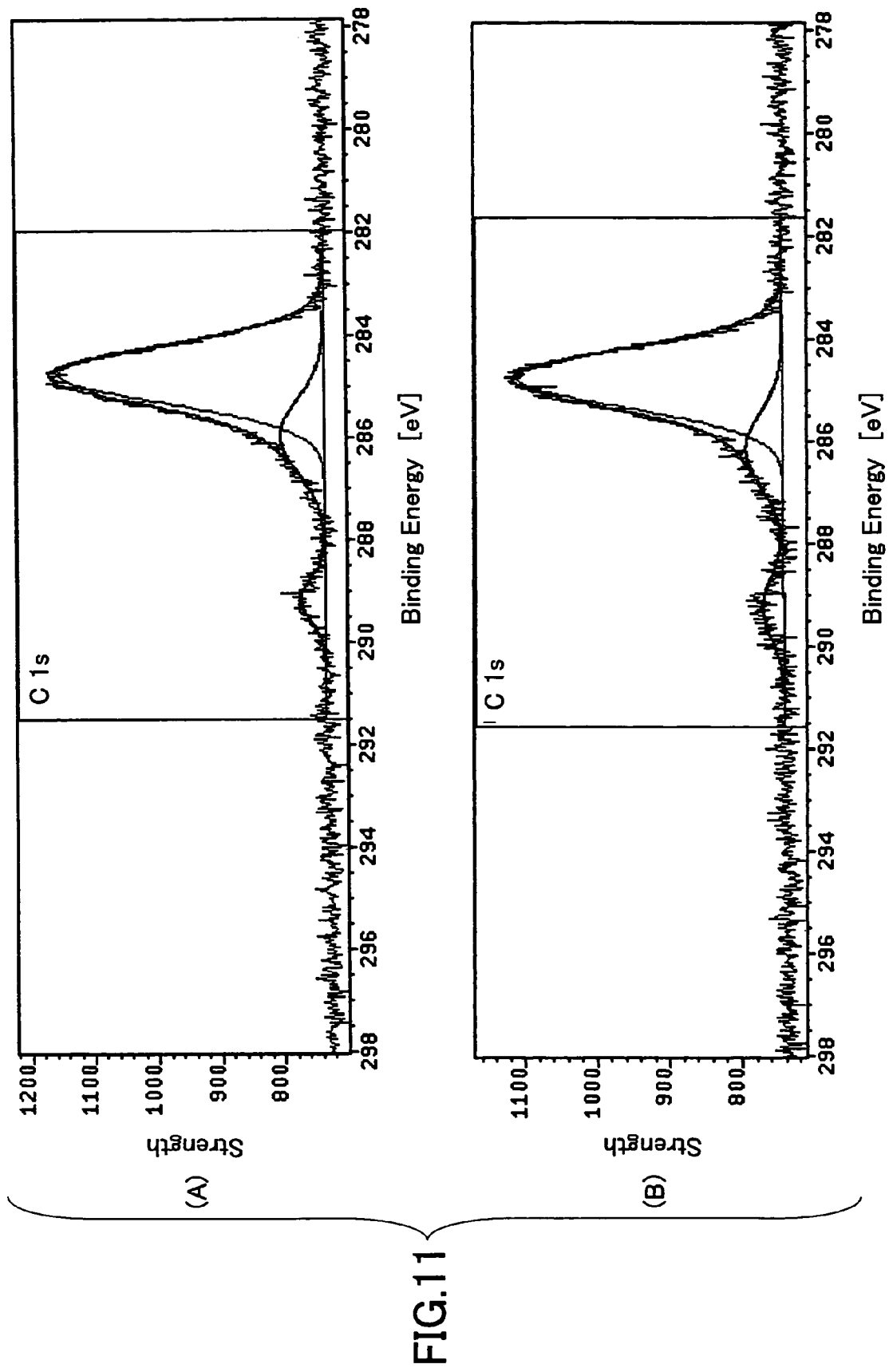
FIG. 11 is another diagram showing an example of the present invention.

FIG. 11 shows an XPS (X-ray photoelectron spectroscopy) spectrum of C1s (carbon 1s orbital) obtained for the silicon substrate heated according to the recipe of the FIG. 10, wherein the diagram (A) of FIG. 11 shows the XPS spectrum at the central part of the substrate, while the diagram (B) of FIG. 11B shows the XPS spectrum at the peripheral part of the substrate.

Referring to FIG. 11, it can be seen that, no SiC peak is observed in any of the central part and peripheral part with the silicon substrate heated with such a temperature elevation recipe.

Figure 12:
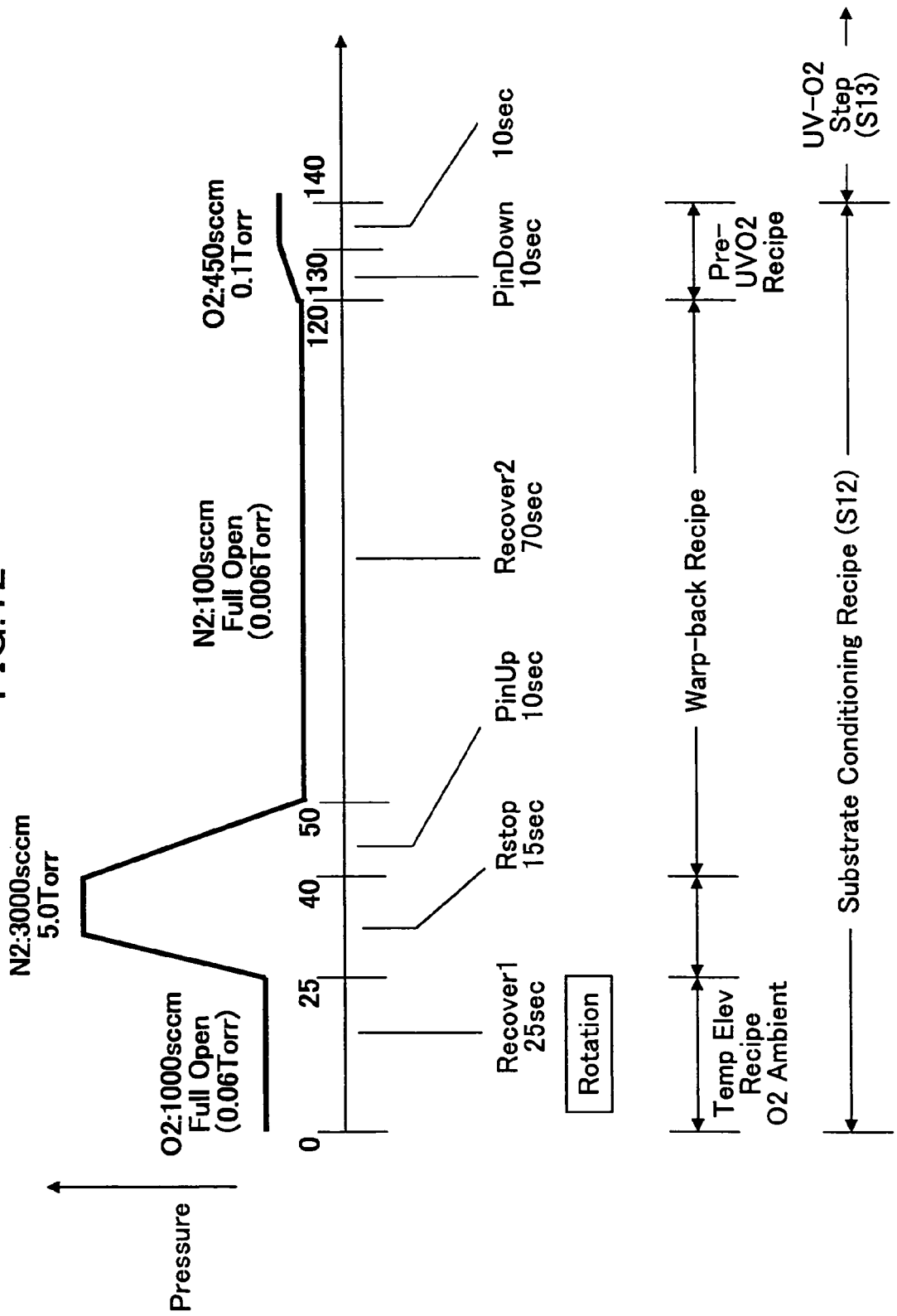
FIG. 12 is another diagram showing an example of the present invention.

FIG. 12 shows the temperature elevation recipe according to another example of the present invention.

Referring to FIG. 12, a silicon substrate of 30 cm diameter having a clean surface cleaned by DHF (diluted hydrofluoric acid) is introduced to the processing vessel 21 as the substrate W to be processed, and the pressure of the processing space 21B is set to 665 Pa (5 Torr) by using the turbo molecular pump 23B.

Further, while rotating the silicon substrate W, an oxygen gas is supplied under the pressure of 7.98 Pa with a flow rate of 1000 SCCM, and the substrate W to be processed is held in this state for 25 seconds (Recover 1). Further, the rotation of the substrate is stopped (Rstop), and supply of the oxygen gas is stopped. Further, the flow rate of a nitrogen gas is increased gradually to 3000 SCCM, and the process pressure of the processing space is increased to 665 Pa (5.0 Torr) over the duration of 15 seconds. During this interval, the temperature of the substrate W to be processed is elevated to a predetermined processing temperature (Temperature Elevation Recipe).

After the temperature elevation recipe, a warp-back recipe is carried out for eliminating the warp of the substrate W to be processed caused in the temperature elevation step.

More specifically, the substrate W is lifted up from the stage 22 by actuating a lifter pin provided to the stage 22 (Pin-Up) upon end of the temperature elevation step. Further, by lifting up the substrate W from the stage 22, the warp-back recipe is started. It should be noted that this warp-back recipe constitutes, together with the temperature elevation recipe and the pre-UVO$_2$ recipe to be explained below, the substrate conditioning recipe of the temperature elevation step preceding the UV-O$_2$ process in the step 13 of FIG. 7.

After moving up the lifter pin, the flow rate of the nitrogen gas is reduced to 100 SCCM and the oxygen gas remaining in the processing space 21B is purged. Further, the processing space 21B is evacuated by using the turbo molecular pump 23B, and the pressure of the processing space 21B is set to 0.798 Pa (0.006 Torr) over the duration of 10 seconds. (Recover 2).

By continuing the state of the foregoing Recover 2 for 70 seconds, the warp of the substrate W is eliminated, and the lifter pin is moved down again (PinDown). Further, the process pressure in the processing space 21B is set to 13.3 Pa (0.1 Torr) by stopping the supply of the nitrogen gas and by supplying an oxygen gas with the flow rate of 450 SCCM. Further, the pre-UVO$_2$ processing is carried out by irradiating ultraviolet radiation (ultraviolet radiation is not mandatory), and the process is ready for commencement of the subsequent UV-O$_2$ processing.

Figure 13:
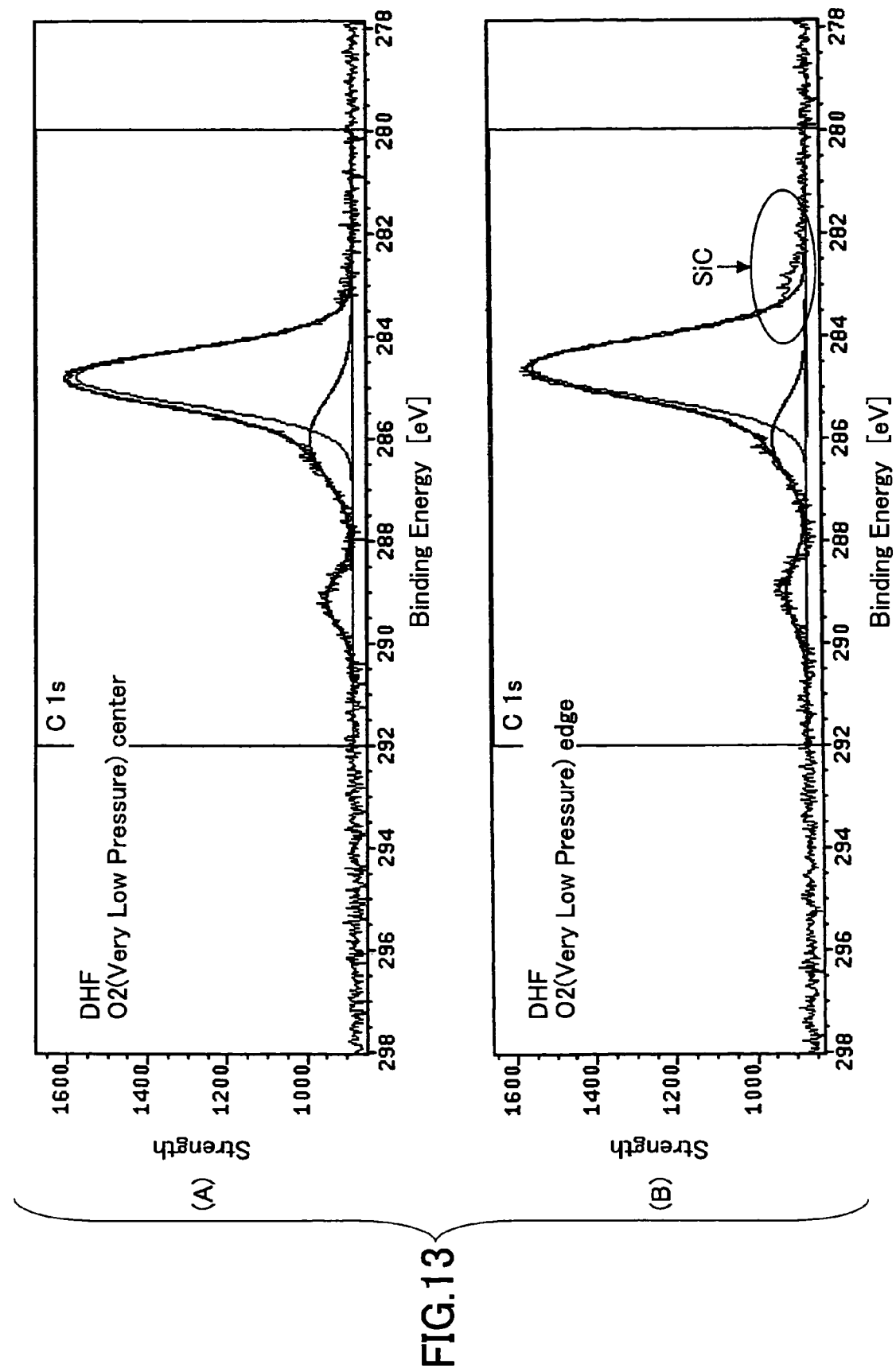
FIG. 13 is another diagram showing an example of the present invention.

FIG. 13 shows an XPS (X-ray photoelectron spectroscopy) spectrum of C1s (carbon 1s orbital) obtained for the silicon substrate heated according to the recipe of the FIG. 12, wherein the diagram (A) of FIG. 13 shows the XPS spectrum at the central part of the substrate, while the diagram (B) of FIG. 13 shows the XPS spectrum at the peripheral part of the substrate.

Referring to FIG. 13, it can be seen that, no SiC peak is observed in any of the central part and peripheral part with the silicon substrate heated with such a temperature elevation recipe.

Figure 14:
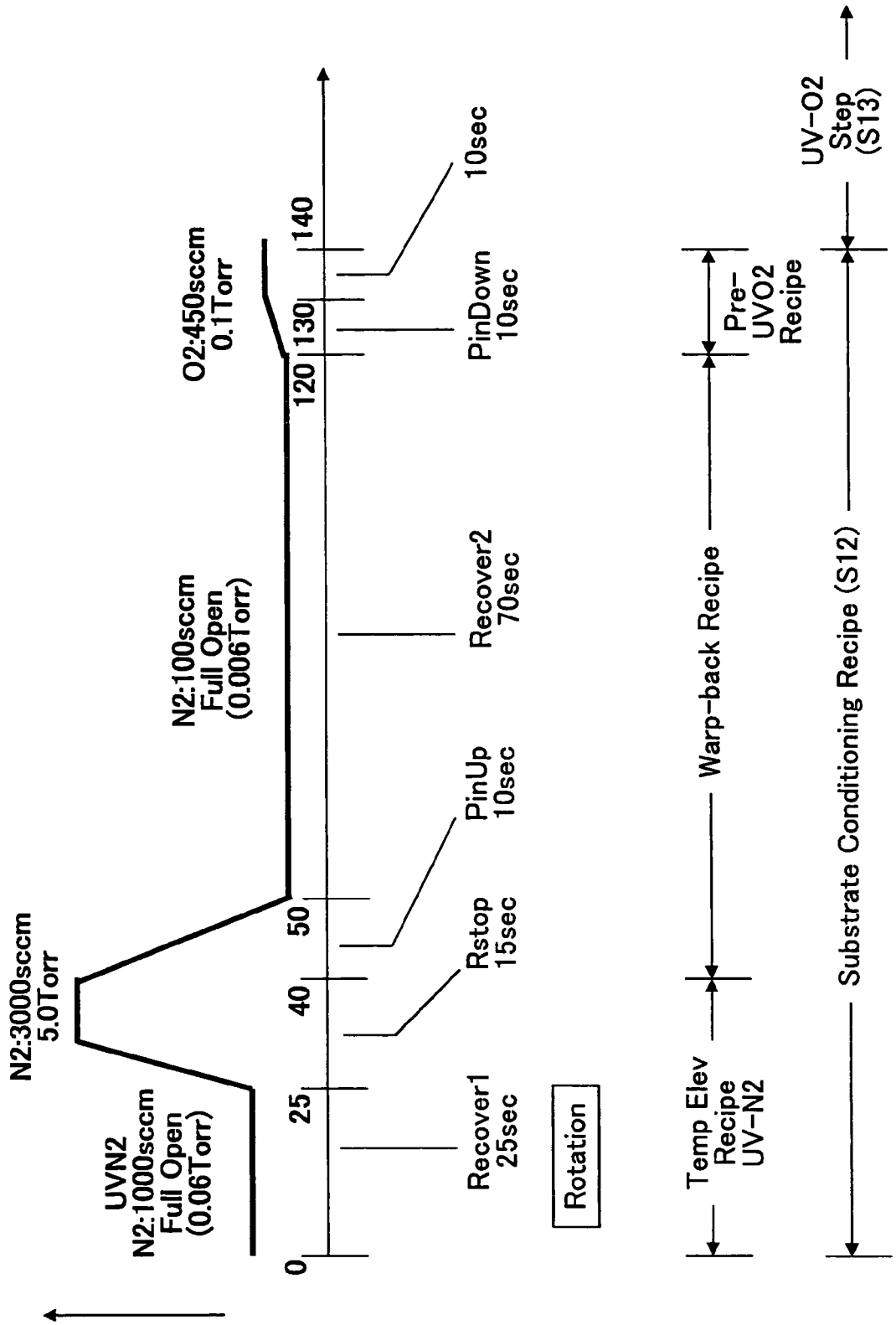
FIG. 14 is another diagram showing an example of the present invention.

FIG. 14 shows another temperature elevation recipe used with the present embodiment and includes the step of driving the ultraviolet optical source 25 in the temperature elevating step.

Referring to FIG. 14, a silicon substrate of 30 cm diameter having a clean surface cleaned by DHF (diluted hydrofluoric acid) is introduced to the processing vessel 21 as the substrate W to be processed, and the pressure of the processing space 21B is set to 7.98 Pa (0.06 Torr) by using the turbo molecular pump 23B.

Further, while rotating the silicon substrate W, a nitrogen gas is supplied under the pressure of 7.98 Pa with a flow rate of 1000 SCCM, and the substrate W to be processed is held in this state for 25 seconds (Recover 1). Further, the rotation of the substrate is stopped (Rstop), and the flow rate of the nitrogen gas is increased gradually to 3000 SCCM, and the process pressure of the processing space is increased to 665 Pa (5.0 Torr). During this interval, the temperature of the substrate W to be processed is elevated to a predetermined processing temperature (Temperature Elevation Recipe).

After the temperature elevation recipe, a warp-back recipe is carried out for eliminating the warp of the substrate W to be processed caused in the temperature elevation step. This warp-back recipe constitutes, together with the temperature elevation recipe and a pre-UVO$_2$ recipe to be explain below, a substrate conditioning recipe of the temperature elevation step 12 that precedes the UV-O$_2$ processing in the step 13 of FIG. 7.

More specifically, the substrate W is lifted up from the stage 22 by actuating a lifter pin provided to the stage 22 (Pin-Up) after 15 seconds elapsed from the end of the temperature elevation step, and with this, the warp-back recipe is started.

Simultaneously to the moving up of the lifter pin (PinUp), the flow rate of the nitrogen gas is reduced to 100 SCCM and the processing space 21B is evacuated by using the turbo molecular pump 23B. Thereby, the processing pressure of the processing space 21B is set to 0.798 Pa (0.006 Torr) over the duration of 10 seconds. (Recover 2).

By continuing the state of the foregoing Recover 2 for 70 seconds, the warp of the substrate W is eliminated, and the lifter pin is moved down again (PinDown). Further, the process pressure in the processing space 21B is set to 13.3 Pa (0.1 Torr) by stopping the supply of the nitrogen gas and by supplying an oxygen gas with the flow rate of 450 SCCM. Further, the pre-UVO$_2$ processing is carried out by irradiating ultraviolet radiation (ultraviolet radiation is not mandatory), and the process is ready for commencement of the subsequent UV-O$_2$ processing.

Figure 15:
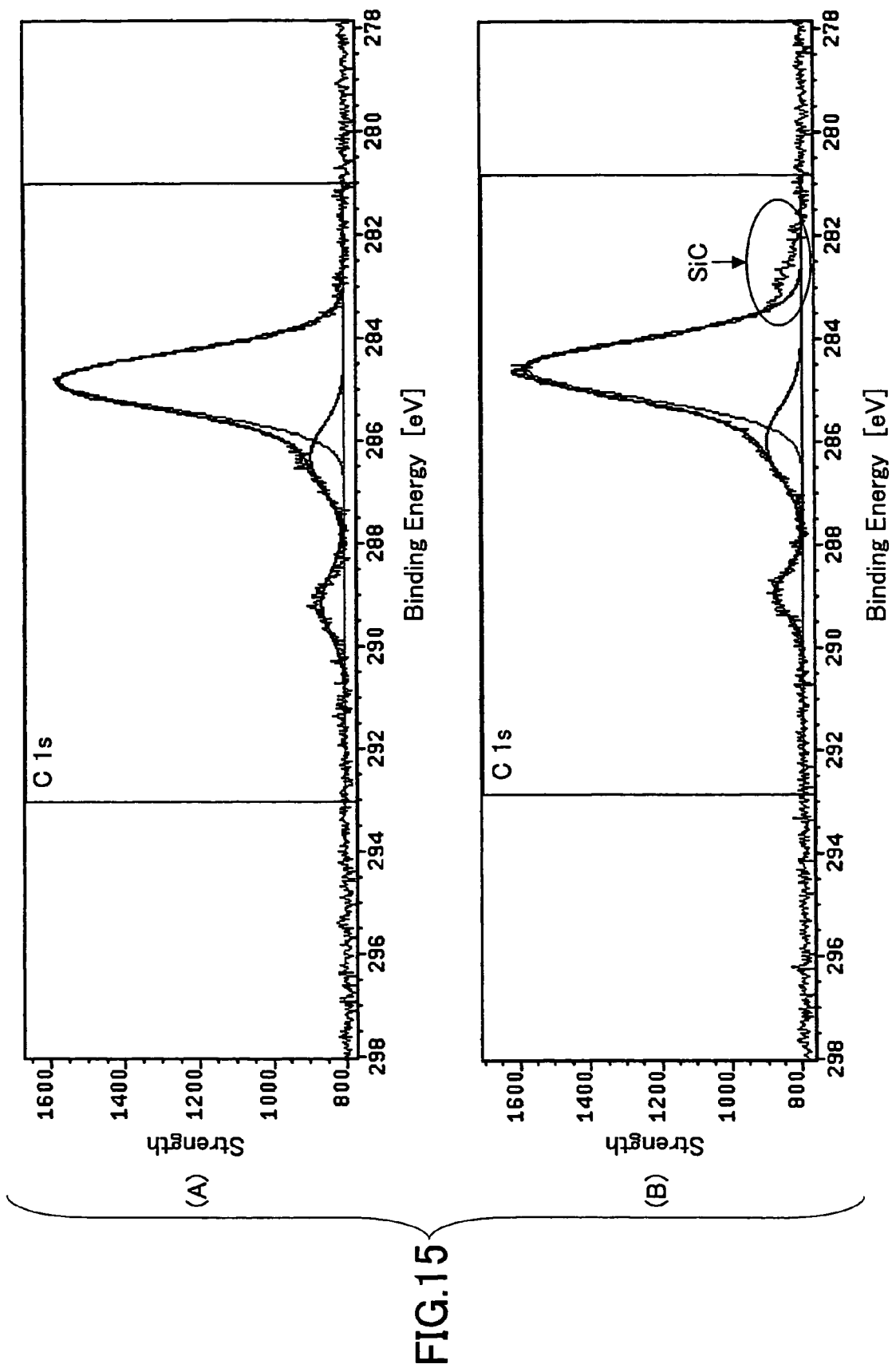
FIG. 15 is another diagram showing an example of the present invention.

FIG. 15 shows an XPS (X-ray photoelectron spectroscopy) spectrum of C1s (carbon 1s orbital) obtained for the silicon substrate heated according to the recipe of the FIG. 14, wherein the diagram (A) of FIG. 15 shows the XPS spectrum at the central part of the substrate, while the diagram (B) of FIG. 15 shows the XPS spectrum at the peripheral part of the substrate.

Referring to FIG. 15, it can be seen that, formation of SiC is suppressed at the central part of the substrate with the recipe of FIG. 14, while in the peripheral part, there still occurs formation of SiC. This result will be discussed later together with the results of other examples.

Figure 16:
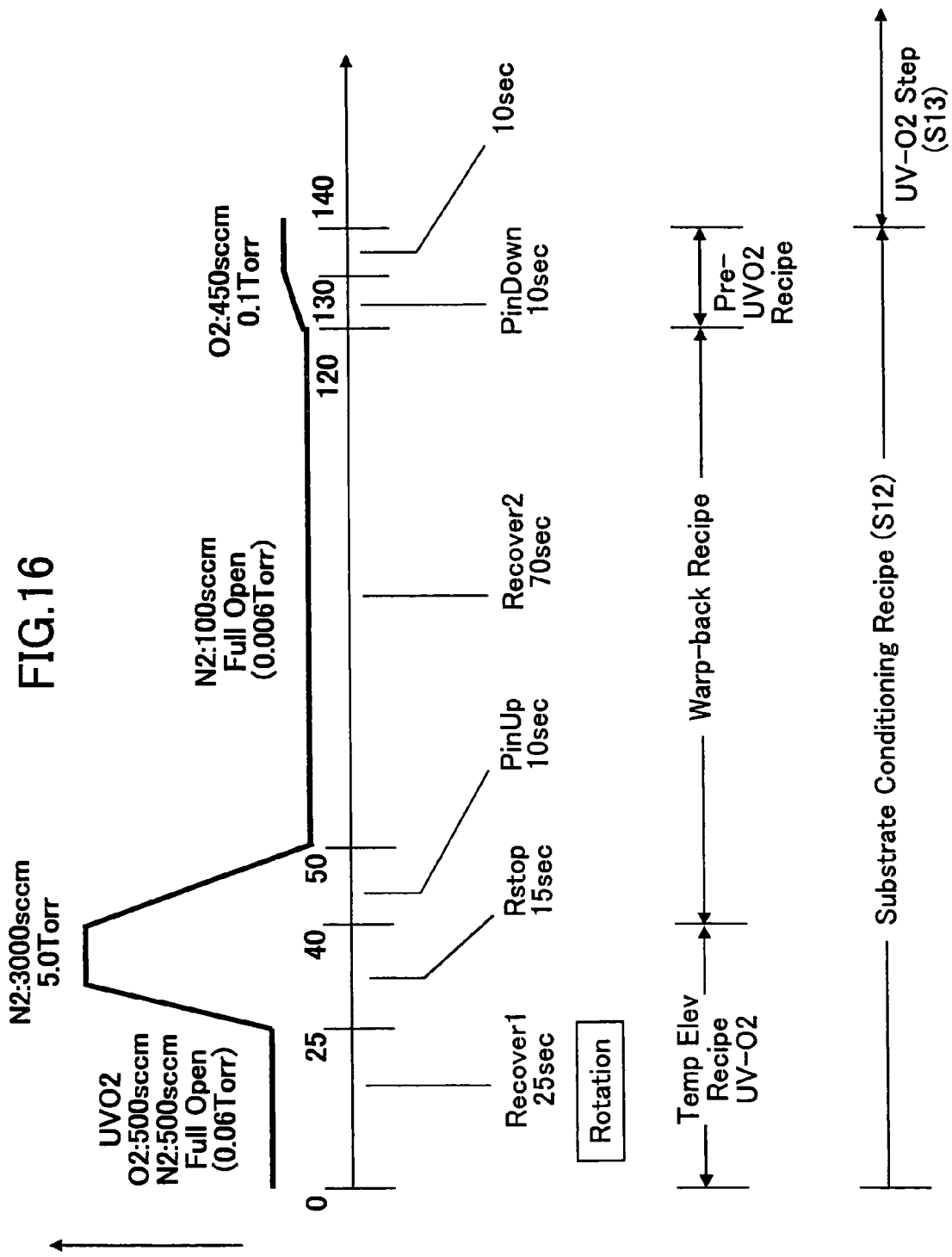
FIG. 16 is another diagram showing an example of the present invention.

FIG. 16 shows another temperature elevation recipe used by the inventor of the present invention in an example of the present invention.

Referring to FIG. 16, a silicon substrate of 30 cm diameter having a clean surface cleaned by DHF (diluted hydrofluoric acid) is introduced to the processing vessel 21 as the substrate W to be processed, and the pressure of the processing space 21B is set to 7.98 Pa (0.06 Torr) by using the turbo molecular pump 23B.

Further, while rotating the silicon substrate W, an oxygen gas and a nitrogen gas are supplied under the pressure of 7.98 Pa with respective flow rates of 500 SCCM and 1000 SCCM, and the substrate W to be processed is held in this state for 25 seconds while irradiating a ultraviolet radiation of the wavelength of 172 nm (Recover 1). Further, the rotation of the substrate is stopped (Rstop), the supply of the oxygen gas is stopped, and the flow rate of the nitrogen gas is increased gradually to 3000 SCCM, such that the process pressure of the processing space set to 665 Pa (5.0 Torr). During this interval, the temperature of the substrate W to be processed is elevated to a predetermined processing temperature (Temperature Elevation Recipe).

After the temperature elevation step, a warp-back recipe is carried out for eliminating the warp of the substrate W to be processed caused in the temperature elevation step. This warp-back recipe constitutes, together with the temperature elevation recipe and a pre-UVO$_2$ recipe to be explain below, a substrate conditioning recipe of the temperature elevation step 12 that precedes the UV-O$_2$ processing in the step 13 of FIG. 7.

More specifically, the substrate W is lifted up from the stage 22 by actuating a lifter pin provided to the stage 22 (Pin-Up) after 15 seconds elapsed from the end of the temperature elevation step, and with this, the warp-back recipe is started.

Simultaneously to the moving up of the lifter pin (PinUp), the flow rate of the nitrogen gas is reduced to 100 SCCM and the processing space 21B is evacuated by using the turbo molecular pump 23B. Thereby, the processing pressure of the processing space 21B is set to 0.798 Pa (0.006 Torr) over the duration of 10 seconds. (Recover 2).

By continuing the state of the foregoing Recover 2 for 70 seconds, the warp of the substrate W is eliminated, and the lifter pin is moved down again (PinDown). Further, the process pressure in the processing space 21B is set to 13.3 Pa (0.1 Torr) by stopping the supply of the nitrogen gas and by supplying an oxygen gas with the flow rate of 450 SCCM. Further, the pre-UVO$_2$ processing is carried out by irradiating ultraviolet radiation (ultraviolet radiation is not mandatory), and the process is ready for commencement of the subsequent UV-O$_2$ processing.

Figure 17:
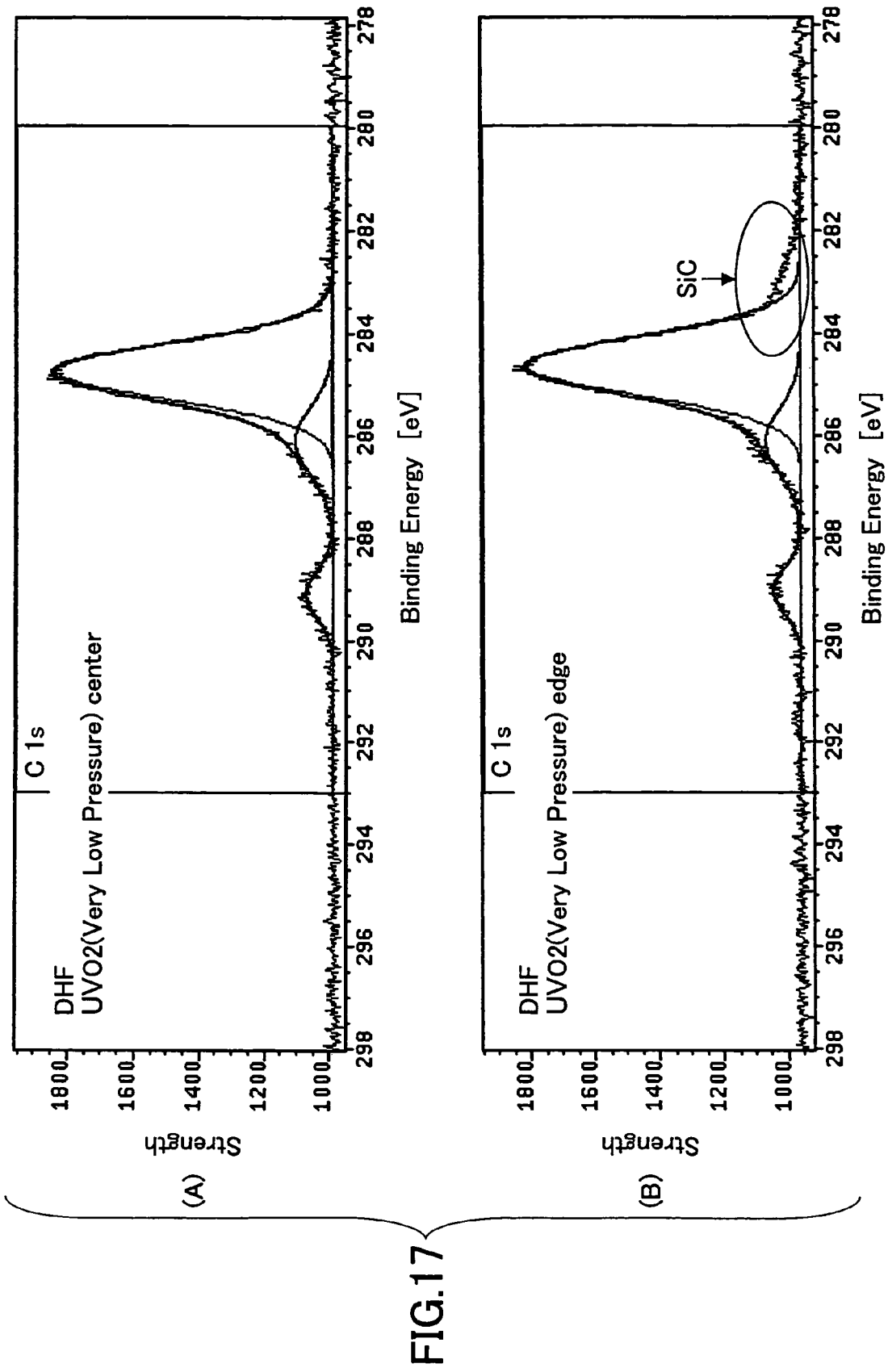
FIG. 17 is another diagram showing an example of the present invention.

FIG. 17 shows an XPS (X-ray photoelectron spectroscopy) spectrum of C1s (carbon 1s orbital) obtained for the silicon substrate heated according to the recipe of the FIG. 16, wherein the diagram (A) of FIG. 17 shows the XPS spectrum at the central part of the substrate, while the diagram (B) of FIG. 17 shows the XPS spectrum at the peripheral part of the substrate.

Referring to FIG. 17, it can be seen that, formation of SiC is suppressed at the central part of the substrate with the recipe of FIG. 16, while in the peripheral part, there still occurs formation of SiC. This result will be discussed later together with the results of other examples.

Figure 18:
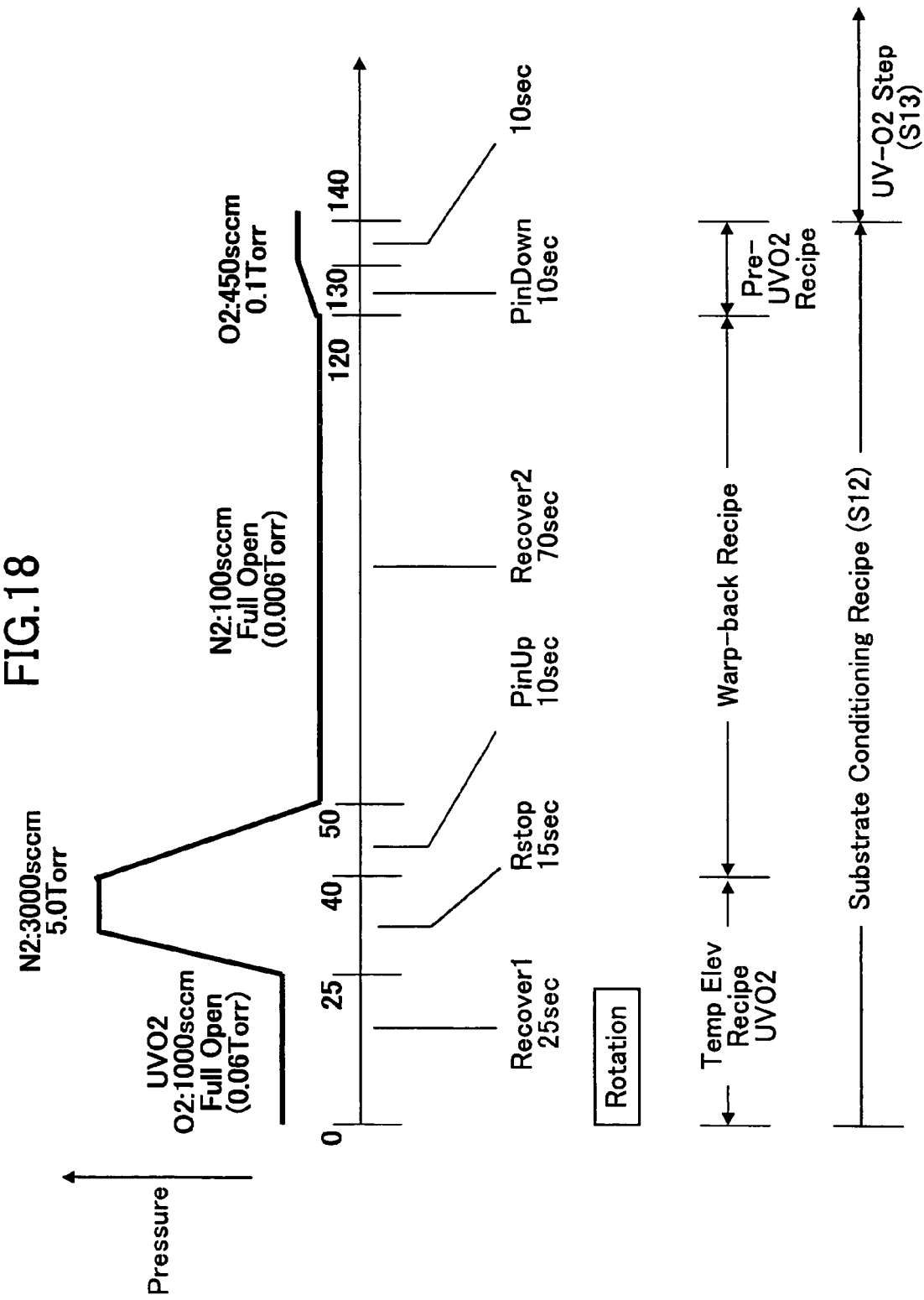
FIG. 18 is another diagram showing an example of the present invention.

FIG. 18 shows another temperature elevation recipe used by the inventor of the present invention in an example of the present invention.

Referring to FIG. 18, a silicon substrate of 30 cm diameter having a clean surface cleaned by DHF (diluted hydrofluoric acid) is introduced to the processing vessel 21 as the substrate W to be processed, and the pressure of the processing space 21B is set to 7.98 Pa (0.06 Torr) by using the turbo molecular pump 23B.

Further, while rotating the silicon substrate W, an oxygen gas is supplied under the pressure of 7.98 Pa with a flow rates of 1000 SCCM, and the substrate W to be processed is held in this state for 25 seconds while irradiating a ultraviolet radiation of the wavelength of 172 nm (Recover 1). This processing is carried out at the substrate temperature of 450° C. or less. Further, the rotation of the substrate is stopped (Rstop), the supply of the oxygen gas is stopped, and a nitrogen gas is supplied gradually until the flow rate thereof reaches 3000 SCCM. Thereby, the process pressure of the processing space is set to 665 Pa (5.0 Torr). During this interval, the temperature of the substrate W to be processed is elevated to a predetermined processing temperature (Temperature Elevation Recipe). In this step of Recover 1, it is important that a very thin oxide film, having a thickness of 0.4 nm or less, is formed on the surface of the silicon substrate by carrying out ultraviolet irradiation to the substrate surface in the oxygen atmosphere during the interval in which the substrate is heated to the temperature of 450° C. By forming such an oxide film before occurrence of desorption of hydrogen terminating the silicon substrate surface, it becomes possible to block the contact of carbon with Si.

After the temperature elevation step, a warp-back recipe is carried out for eliminating the warp of the substrate W to be processed caused in the temperature elevation step. This warp-back recipe constitutes, together with the temperature elevation recipe and a pre-UVO$_2$ recipe to be explain below, a substrate conditioning recipe of the temperature elevation step 12 that precedes the UV-O$_2$ processing in the step 13 of FIG. 7.

More specifically, the substrate W is lifted up from the stage 22 by actuating a lifter pin provided to the stage 22 (Pin-Up) after 15 seconds elapsed from the end of the temperature elevation step, and with this, the warp-back recipe is started.

Simultaneously to the moving up of the lifter pin (PinUp), the flow rate of the nitrogen gas is reduced to 100 SCCM and the processing space 21B is evacuated by using the turbo molecular pump 23B. Thereby, the processing pressure of the processing space 21B is set to 0.798 Pa (0.006 Torr) over the duration of 10 seconds. (Recover 2).

By continuing the state of the foregoing Recover 2 for 70 seconds, the warp of the substrate W is eliminated, and the lifter pin is moved down again (PinDown). Further, the process pressure in the processing space 21B is set to 13.3 Pa (0.1 Torr) by stopping the supply of the nitrogen gas and by supplying an oxygen gas with the flow rate of 450 SCCM so as to replace or purge the nitrogen gas. Further, the pressure inside the processing chamber is stabilized and the pre-UVO$_2$ processing is carried out by irradiating ultraviolet radiation (ultraviolet radiation is not mandatory), and the process is ready for commencement of the subsequent UV-O$_2$ processing.

Figure 19:
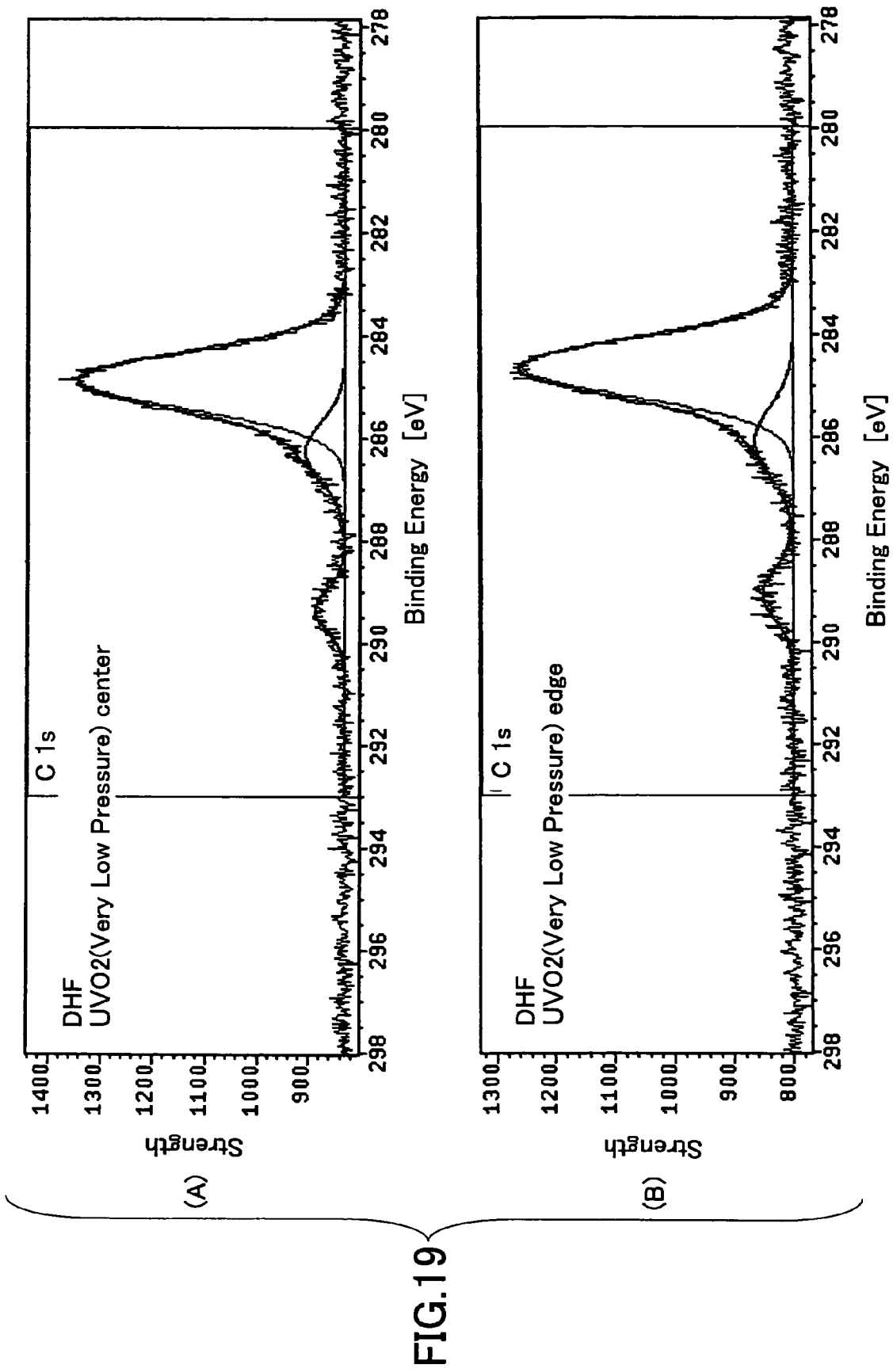
FIG. 19 is another diagram showing an example of the present invention.

FIG. 19 shows an XPS (X-ray photoelectron spectroscopy) spectrum of C1s (carbon 1s orbital) obtained for the silicon substrate heated according to the recipe of the FIG. 18, wherein the diagram (A) of FIG. 19 shows the XPS spectrum at the central part of the substrate, while the diagram (B) of FIG. 19 shows the XPS spectrum at the peripheral part of the substrate.

Referring to FIG. 19, it can be seen that the peak of SiC is not observed at any of the central part and the peripheral part of the substrate with the recipe of FIG. 18, and that the formation of SiC is effectively suppressed. This result will be discussed later together with the results of other examples.

Figure 20:
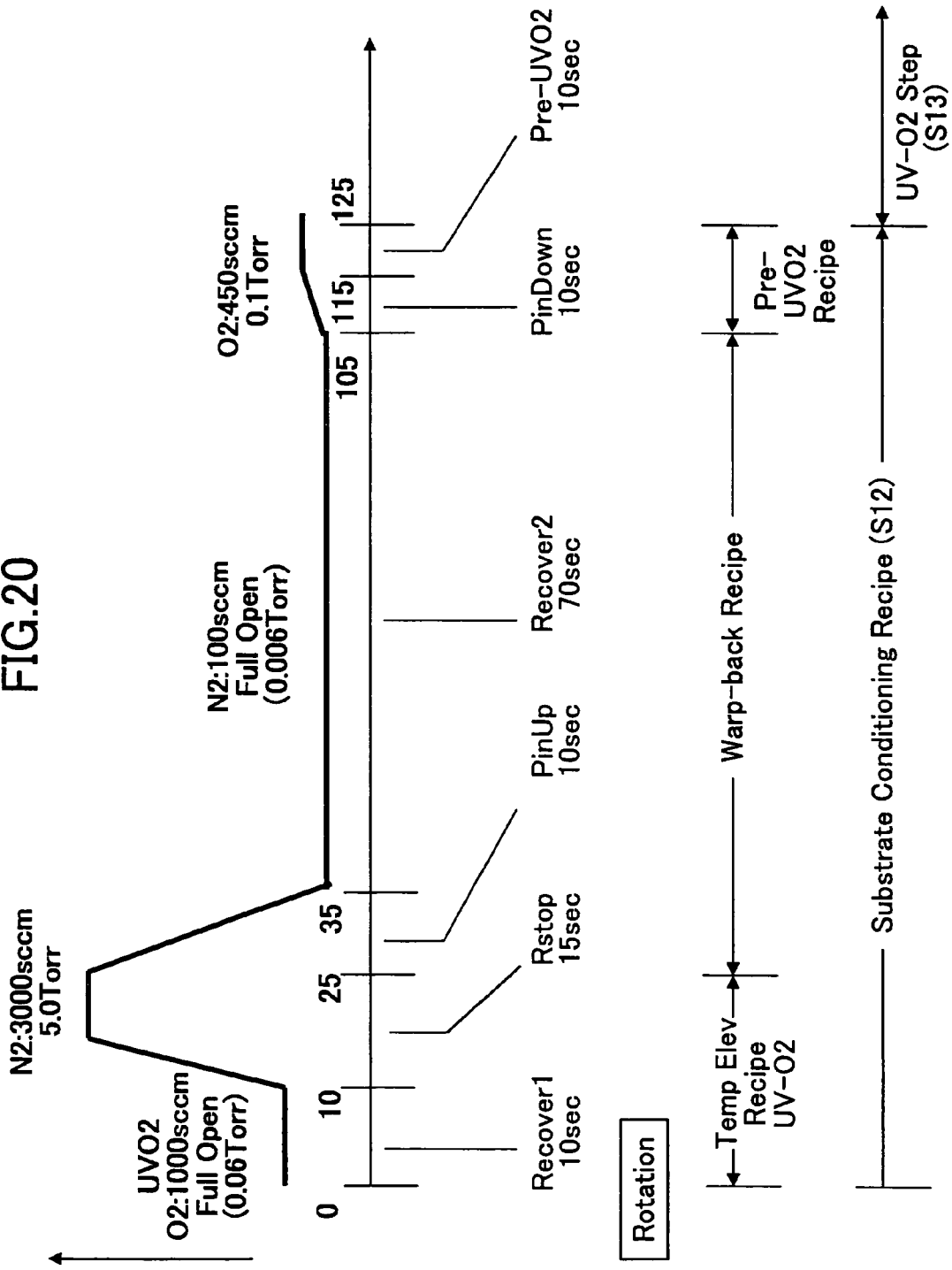
FIG. 20 is another diagram showing an example of the present invention.

FIG. 20 shows another temperature elevation recipe used by the inventor of the present invention in an example of the present invention.

Referring to FIG. 20, a silicon substrate of 30 cm diameter having a clean surface cleaned by DHF (diluted hydrofluoric acid) is introduced to the processing vessel 21 as the substrate W to be processed, and the pressure of the processing space 21B is set to 7.98 Pa (0.06 Torr) by using the turbo molecular pump 23B.

Further, while rotating the silicon substrate W, an oxygen gas is supplied under the pressure of 7.98 Pa with a flow rates of 1000 SCCM, and the substrate W to be processed is held in this state for 10 seconds while irradiating a ultraviolet radiation of the wavelength of 172 nm (Recover 1). Further, the rotation of the substrate is stopped (Rstop), the supply of the oxygen gas is stopped, and a nitrogen gas is supplied gradually until the flow rate thereof reaches 3000 SCCM. Thereby, the process pressure of the processing space is set to 665 Pa (5.0 Torr). During this interval, the temperature of the substrate W to be processed is elevated to a predetermined processing temperature (Temperature Elevation Recipe).

After the temperature elevation step, a warp-back recipe is carried out for eliminating the warp of the substrate W to be processed caused in the temperature elevation step. This warp-back recipe constitutes, together with the temperature elevation recipe and a pre-UVO$_2$ recipe to be explain below, a substrate conditioning recipe of the temperature elevation step 12 that precedes the UV-O$_2$ processing in the step 13 of FIG. 7.

More specifically, the substrate W is lifted up from the stage 22 by actuating a lifter pin provided to the stage 22 (Pin-Up) after 15 seconds elapsed from the end of the temperature elevation step, and with this, the warp-back recipe is started.

Simultaneously to the moving up of the lifter pin (PinUp), the flow rate of the nitrogen gas is reduced to 100 SCCM and the processing space 21B is evacuated by using the turbo molecular pump 23B. Thereby, the processing pressure of the processing space 21B is set to 0.798 Pa (0.006 Torr) over the duration of 10 seconds. (Recover 2).

By continuing the state of the foregoing Recover 2 for 70 seconds, the warp of the substrate W is eliminated, and the lifter pin is moved down again (PinDown). Further, the process pressure in the processing space 21B is set to 13.3 Pa (0.1 Torr) by stopping the supply of the nitrogen gas and by supplying an oxygen gas with the flow rate of 450 SCCM. Further, the pressure inside the processing chamber is set to 13.3 Pa (0.1 Torr), and the pre-UVO$_2$ processing is carried out by irradiating ultraviolet radiation (ultraviolet radiation is not mandatory), and the process is ready for commencement of the subsequent UV-O$_2$ processing.

Figure 21:
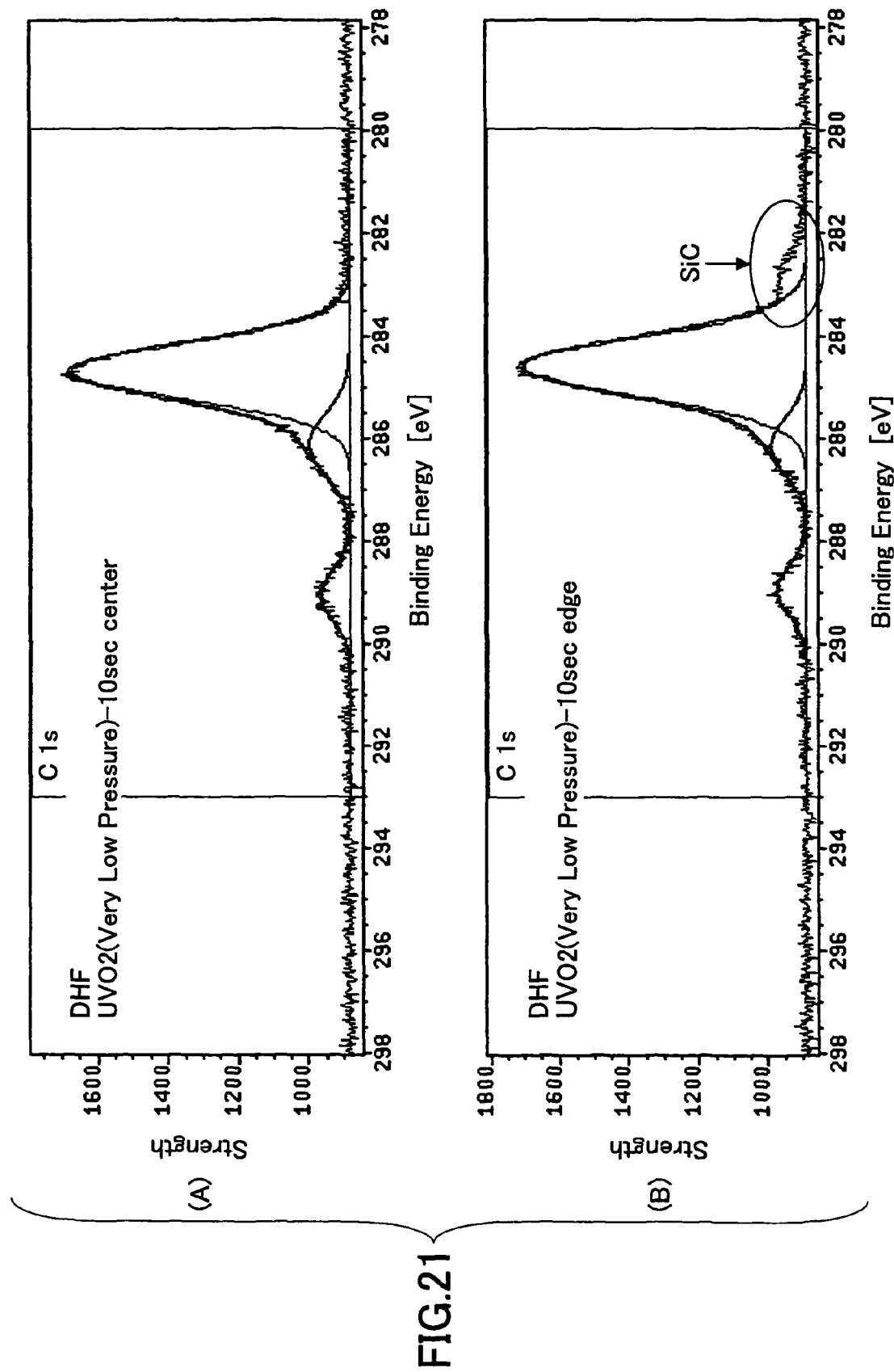
FIG. 21 is another diagram showing an example of the present invention.

FIG. 21 shows an XPS (X-ray photoelectron spectroscopy) spectrum of C1s (carbon 1s orbital) measured for the silicon substrate heated according to the recipe of the FIG. 20, wherein the diagram (A) of FIG. 20 shows the XPS spectrum at the central part of the substrate, while the diagram (B) of FIG. 21 shows the XPS spectrum at the peripheral part of the substrate.

Referring to FIG. 21, it can be seen that the formation of SiC is suppressed at the central part of the substrate with the recipe of FIG. 20, while there is caused formation of SiC in the peripheral part of the substrate.

Figure 22:
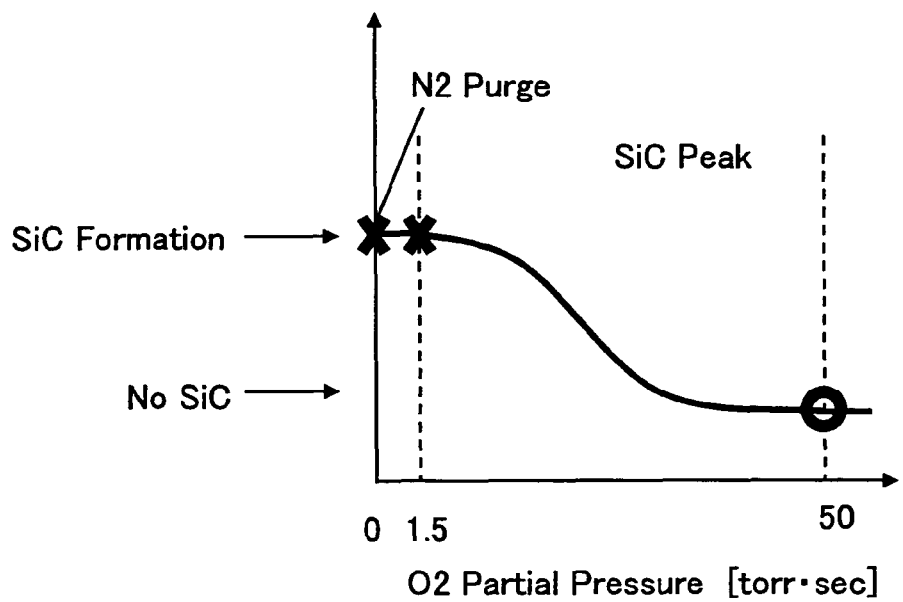
FIG. 22 is a diagram showing a summary of results of the examples of the present invention.

FIG. 22 is a diagram showing the relationship between the oxygen partial pressure and SiC formation obtained from the foregoing examples with regard to the case in which the temperature elevation step includes UV irradiation step and the case in which the temperature elevation step does not include UV irradiation.

Referring to FIG. 22, it can be seen that there occurs SiC formation on the silicon substrate surface in the event the temperature elevation step up to 450° C. is carried out in the low oxygen partial pressure atmosphere of 50 Torr·sec (6.65 kPa·sec) or less during the temperature elevation step of Recover 1, while the SiC formation is suppressed when the foregoing temperature elevation step is carried out in the oxygen partial pressure atmosphere of 50 Torr·sec (6.65 kPa·sec) or more. This means that there exists a critical oxygen partial pressure capable of suppressing SiC formation in the vicinity of 50 Torr·sec (6.65 kPa·sec). It is believed that the foregoing results have been caused as a result of formation of extremely thin SiO$_2$ film on the silicon substrate surface before desorption of hydrogen that terminate the silicon substrate surface, by carriying out temperature elevation in an oxygen partial pressure atmosphere of 50 Torr·sec or more during the interval in which the substrate temperature is raised up to 450° C. and as a result of the extremely thin SiO$_2$ film thus formed blocking the contact of carbon with Si on the substrate surface.

Figure 23:
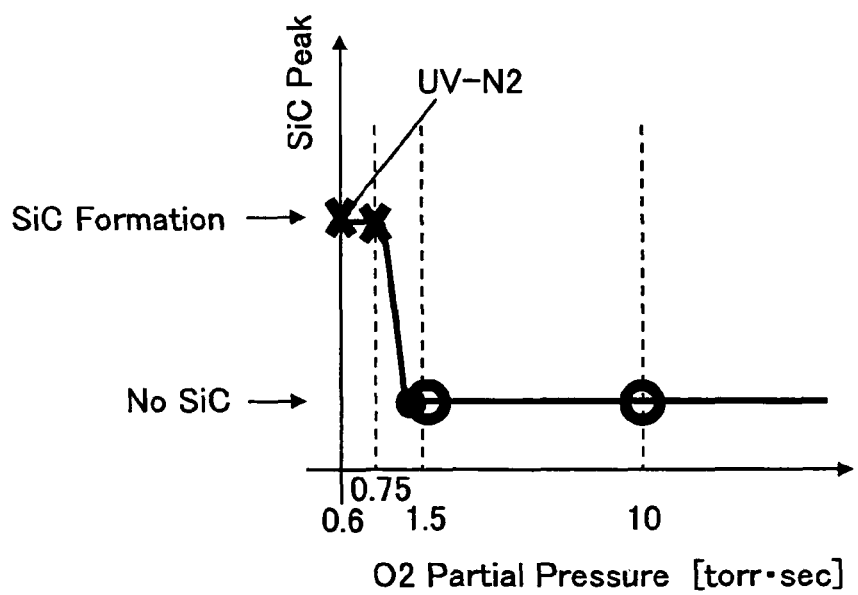
FIG. 23 is another diagram showing a summary of results of the examples of the present invention.

FIG. 23 shows the relationship between existence or non-existence of SiC formation and oxygen partial pressure for the case the ultraviolet irradiation is carried out during the temperature elevation process.

Referring to FIG. 23, the tendency that SiC formation is suppressed when the oxygen partial pressure during the temperature elevation process is low is observed also in FIG. 23 similarly to FIG. 22, while it is also observed that the SiC formation changes with the duration of ultraviolet irradiation. For example, there occurs SiC formation in the event ultraviolet irradiation is carried out under the oxygen partial pressure of 0.06 Torr (7.98 Pa) for ten seconds (0.06 Torr·sec=79.8 Pa·sec), while the SiC formation is suppressed in the event the same ultraviolet irradiation is carried out for 25 seconds (1.5 Torr·sec). In practice, SiC formation can be suppressed even when the oxygen partial pressure is reduced to 0.04 Torr (5.28 Pa) when the ultraviolet irradiation is carried out for 25 seconds. Further, while FIG. 23 shows SiC formation when the oxygen partial pressure is 0.03 Torr (4.0 Pa) even when the ultraviolet irradiation is carried out for 25 seconds (0.75 Torr·sec=99.8 Pa·sec), there is a possibility that this SiC formation is suppressed by carrying out the ultraviolet irradiation for longer duration.

The result of FIG. 23 suggests the mechanism of the hydrogen atoms terminating the silicon substrate are substituted with oxygen atoms by processing the silicon substrate surface by oxygen radicals at the time of elevating the temperature of the silicon substrate before the substrate temperature reaches 450° C., at which temperature there is caused SiC formation of the substrate surface, and the organic substance is removed by causing reaction with the oxygen atoms.

Thus, according to the present embodiment, it becomes possible to lower the oxygen partial pressure necessary for suppressing the SiC formation by carrying out the ultraviolet irradiation at the time of the temperature elevating step of the silicon substrate. Associated with this, it becomes possible to suppress the thickness of the oxide film formed on the silicon oxide film before the actual film forming process is started to 0.15 nm or less.

While the present embodiment uses a silicon substrate processed by DHF and terminated with hydrogen for the substrate W to be processed, it is also possible to reduce the duration of the ultraviolet irradiation by using a silicon substrate cleaned by combined process of an SC-1 cleaning process that uses a mixed solution of $NH_4OH/H_2O_2/H_2O$ and the DHF cleaning process.

According to the present invention, in which ultraviolet radiation is applied to the atmosphere containing oxygen at the time of elevating the temperature of the substrate to be processed, the substrate surface is covered promptly by oxygen atoms as the substrate surface is activated due to desorption of hydrogen terminating the substrate surface as the substrate temperature exceeds 450° C., and organic substances or carbon remaining on the substrate surface is removed by causing reaction with oxygen. Thereby, it becomes possible to suppress formation of SiC on the substrate surface effectively. Particularly, it becomes possible to lower the partial pressure of the oxygen gas, which has to be introduced for suppressing the SiC formation during the temperature elevation step of the substrate to be processed, by applying the ultraviolet irradiation, and formation of oxide film on the silicon substrate surface during the temperature elevation step, and hence before commencement of substantial film forming step. As a result, it becomes possible to conduct the desired film formation with high throughput while suppressing the SiC formation.

Further, according to the present invention, it becomes possible to suppress the formation of SiC even when the substrate temperature is elevated to a temperature exceeding 450° C. for the purpose of thermal annealing process to be carried out later, by forming an oxide film first on the surface of the substrate to be processed by the oxygen radicals excited by ultraviolet radiation, and the film properties are improved. Further, a flat interface is obtained between the substrate and the oxide film, and the interface characteristics are improved.

SECOND EMBODIMENT

Figure 24:
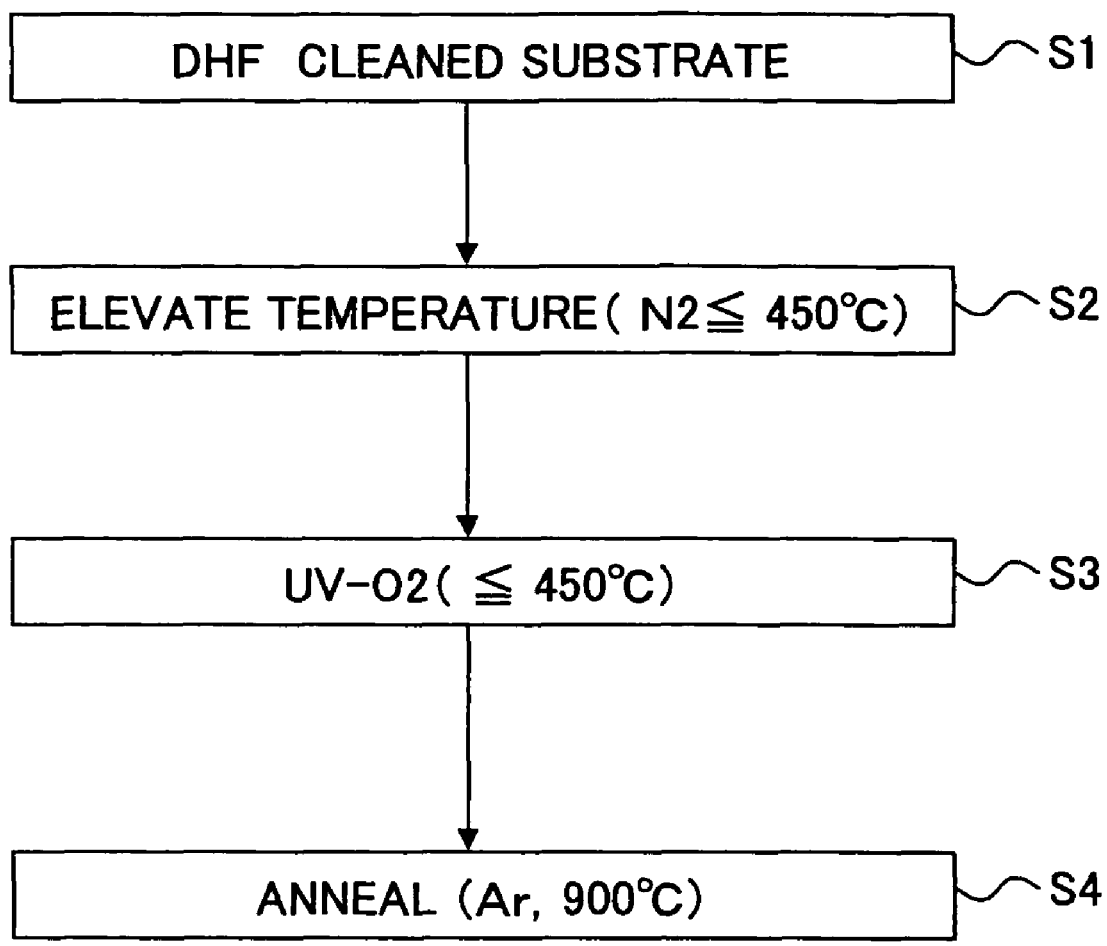
FIG. 24 is a flowchart showing the film forming method according to a second embodiment of the present invention.

FIG. 24 shows a film forming method according to a second embodiment of the present invention.

Referring FIG. 24, in a step 1, a silicon substrate cleaned by a DHF (dilution HF) solution is introduced into the processing vessel 21 of the substrate processing apparatus 20 with the present embodiment as the substrate W to be processed, and the temperature of the substrate is increased in a step 2 to the temperature of 450° C. in an inert gas atmosphere such as $N_2$ or Ar, such that SiC is not formed. Further, the foregoing UV-$O_2$ processing is carried out in the step 3, and a uniform silicon oxide film is formed on the silicon substrate surface with the thickness of about 0.4 nm. In the case the substrate temperature is set to 450° or lower, the hydrogen atoms terminating the silicon substrate surface are not desorbed, and the UV-$O_2$ oxidation is caused in the state that the surface of the silicon substrate is terminated with hydrogen. Thereby, there occurs no SiC formation on the substrate surface.

With the film forming method of FIG. 24, the silicon oxide film thus formed is converted further to a dense silicon oxide film in a step 4 by applying a thermal annealing process in an Ar gas atmosphere at 900° C. for 30 seconds.

Figure 25A:
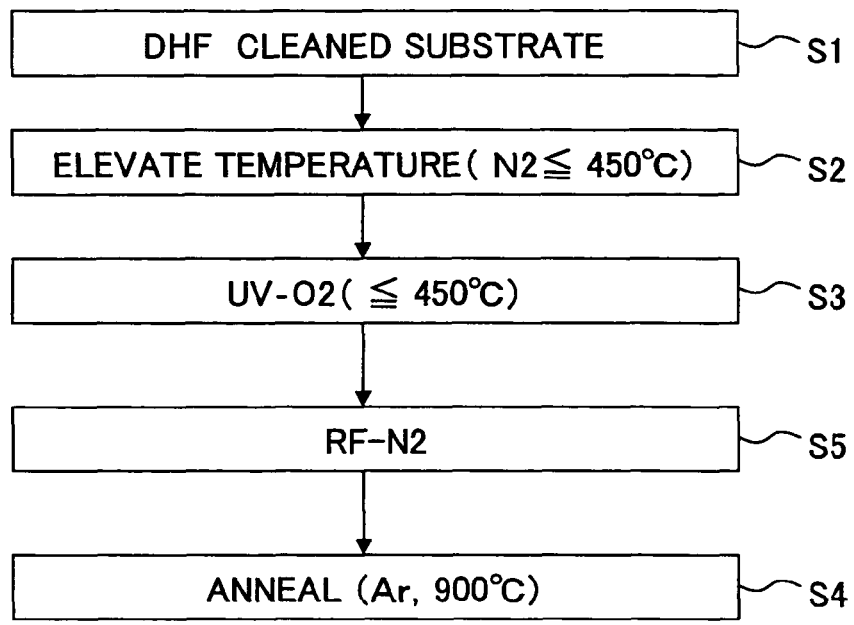
FIG. 25A is a flowchart showing the film forming method according to a modification of FIG. 24.
Figure 25B:
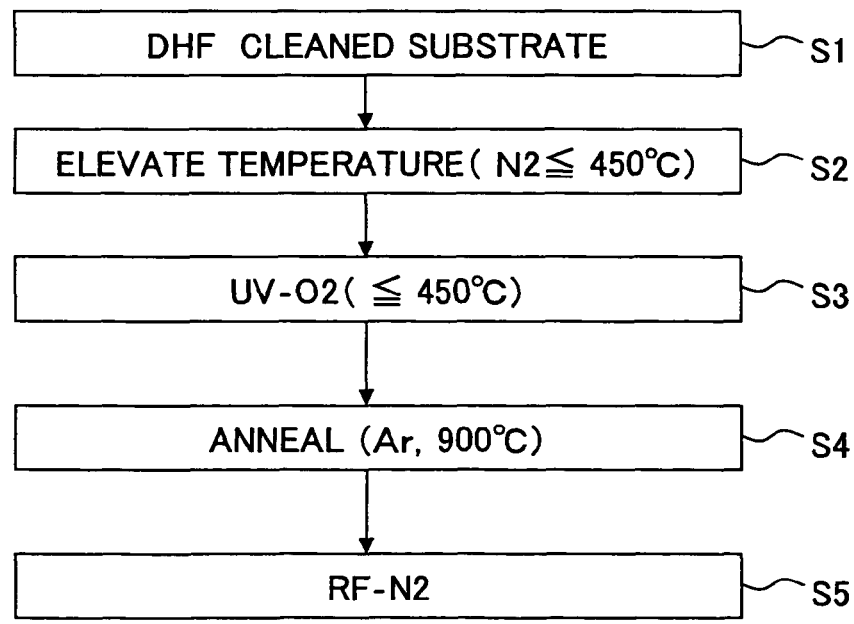
FIG. 25B is a flowchart showing the film forming method according to a modification of FIG. 24.

FIGS. 25A and 25B show modifications of the film forming method of FIG. 24.

Referring to FIG. 25A, a silicon oxide film is formed with the present embodiment with a film thickness of 0.4 nm in the step 3 by the UV-$O_2$ processing, and a step 5 is conducted before the thermal annealing process of the step 4 by conducting the RF-$N_2$ processing by activating the remote radical source 26 of FIG. 1 for modifying the silicon oxide film to a silicon oxynitride film. With this step 5, it is not necessarily to carry out the RF-$N_2$ processing at the temperature of 450° C. or less, and thus, it is possible to carry out the processing with higher temperature.

With the process of FIG. 25B, on the other hand, the order of the step 5 and the step 4 of FIG. 25A is reversed, and the RF-$N_2$ processing is conducted in the step 5 to the dense oxide film applied with the thermal annealing process with the step 4.

Figure 26:
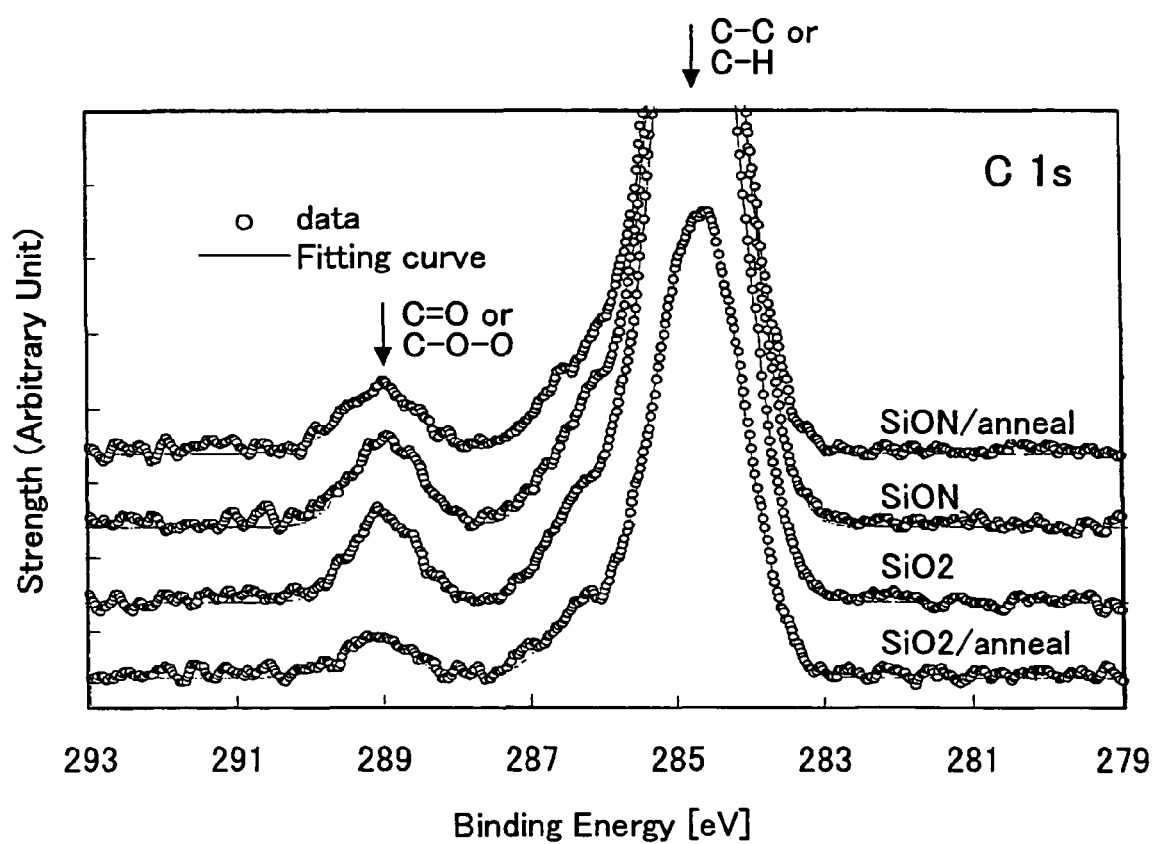
FIG. 26 is a diagram showing an experiment constituting the foundation of the present invention.

FIG. 26 shows the C1s XPS spectrum obtained for the silicon oxide film or silicon oxynitride film formed with such a process. In FIG. 26, "$SiO_2$" represents the silicon oxide film was formed in the step 3 of FIG. 24, while "$SiO_2$/anneal" represents the silicon oxide film formed with the step 4 of FIG. 24. Further, "SiON" in FIG. 26 represents the silicon oxynitride film formed in the step 5 of FIG. 25. Further, "SiON/anneal" of FIG. 26 represents the silicon oxynitride film formed in the step 4 of FIG. 25.

Referring to FIG. 26, it can be seen that no peak of SiC is observed. In FIG. 26, the line fitting the data points is a curve in which Gaussian curves corresponding to C—C bond, C—O bond and C—$O_2$ bond energy are synthesized.

The result of FIG. 26 indicates that formation of SiC is suppressed by forming an extremely thin silicon oxide film of about 0.4 nm on the silicon substrate surface by an UV-$O_2$ processing at the temperature of 450° C. or less, above which the formation of SiC takes place as a result of reaction between the organic substance on the substrate surface and the silicon atoms.

The silicon oxide film thus formed by the UV-$O_2$ processing is stable has high quality. In one example, it was confirmed that such a silicon oxide film has a film thickness of 0.39 nm in the as-formed state of the step 3 of FIG. 24. In the case the silicon oxide film is annealed at 900° C. in Ar gas atmosphere in the step 4, on the other hand, the film thickness is 0.42 nm, while this means that there is caused little increase of film thickness.

Figure 5:
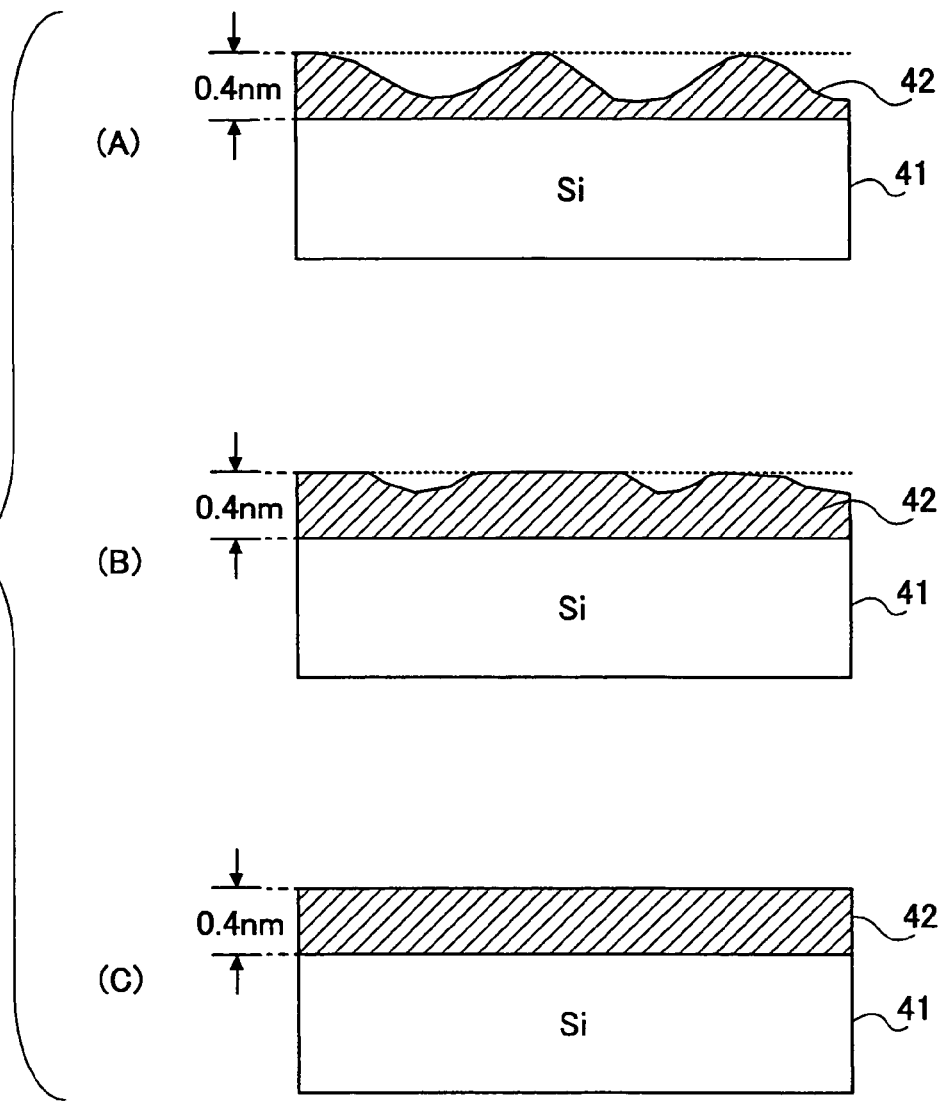
FIG. 5 is a diagram showing the situation of growth of the oxide film by the UV-$O_2$ processing of FIG. 2.

In the case of the silicon nitride film of FIG. 25, on the other hand, it can be seen that there is caused an increase of film thickness from 0.56 nm in the state immediately after the step of FIG. 5 to 0.60 nm after the step 4. Associated with this, the nitrogen concentration in the film is decreased from the concentration of 11.83 atomic % in the state immediately after the step 5 to 9.21% after the step 4, indicating that there is caused some desorption of the nitrogen atoms.

Because a change was observed with regard to the nitrogen concentration and film thickness with the silicon nitride film of FIG. 25 before and after the thermal annealing process of the step 4, investigation was made on the state of nitrogen in the film by using the XPS spectrum of nitrogen N1s orbital.

Figure 27:
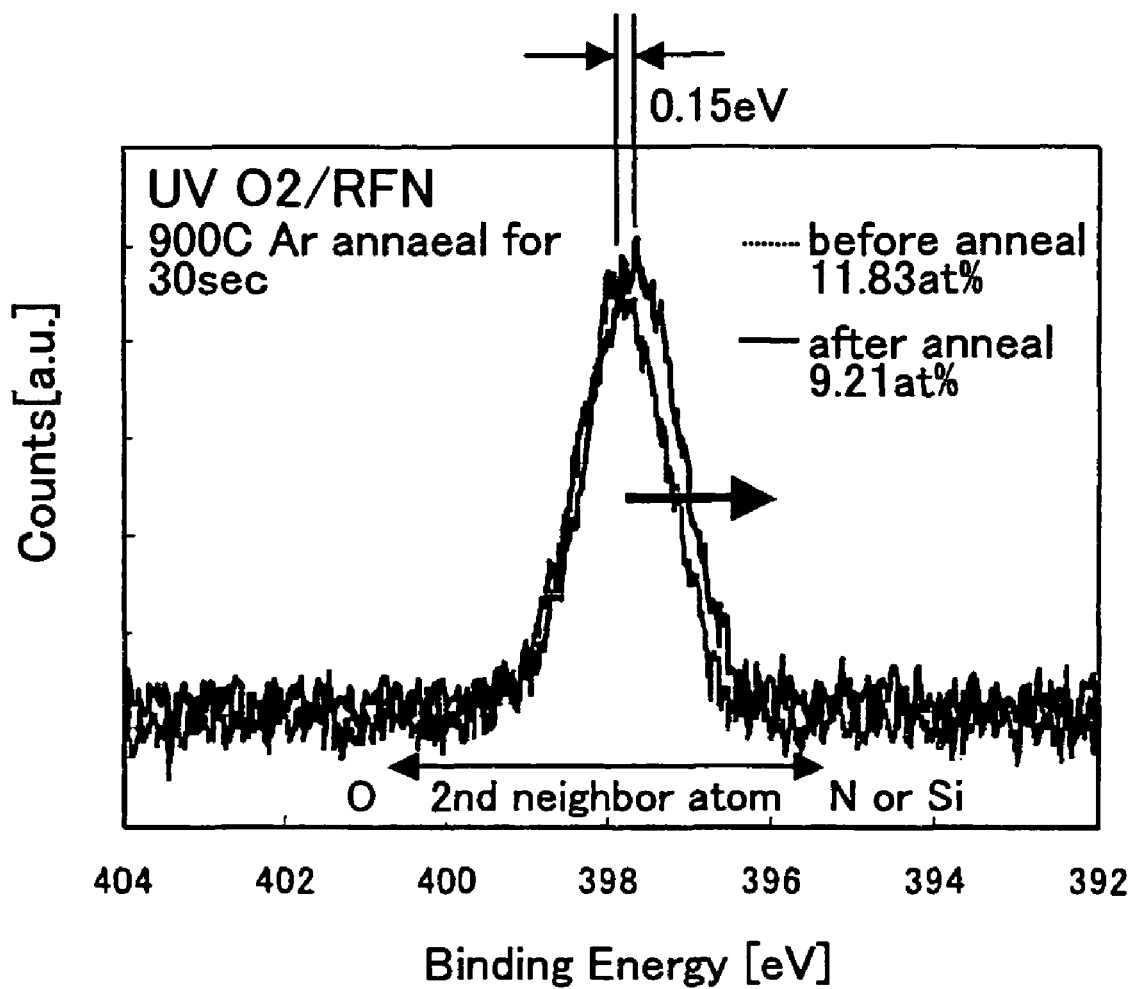
FIG. 27 is another diagram showing the experiment that constitutes the foundation of the present invention.

FIG. 27 compares the N1s XPS spectrum of the silicon oxynitride film before and after the thermal annealing process of the step 4 of FIG. 25.

Referring to FIG. 27, it can be seen that there is caused a shift in the peak of N1s to the lower energy side by about 0.15 eV after the thermal annealing process as compared with the state before the thermal annealing process, while this indicates that there is caused an increase of proportion of the silicon atoms constituting a second nearest neighbor. In other words, this indicates that the nitrogen atoms in the vicinity of the surface are desorbed. Because there is observed no large change in the spectrum itself, it is thought that there is caused no significant precipitation of nitrogen atoms at the silicon/oxide film interface that can form interface states.

Figure 28:
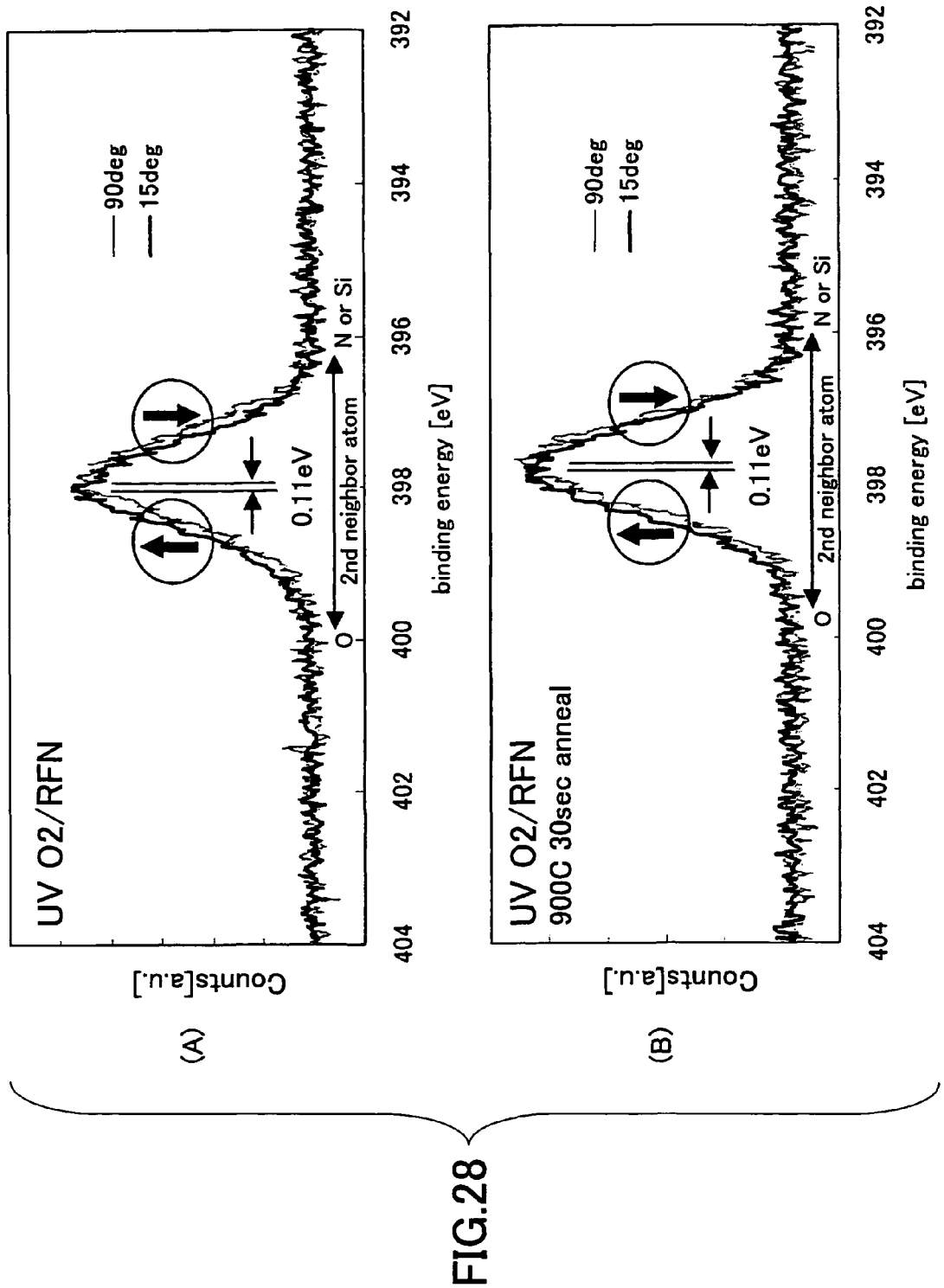
FIG. 28 is another diagram showing the experiment that constitutes the foundation of the present invention.

Further, the diagram (A) of FIG. 28 represents the N1s XPS spectrum of the silicon oxynitride film obtained in the step 5 of FIG. 25, while the diagram (B) of FIG. 28 represents the N1s XPS spectrum of the silicon oxide film obtained in the step 4 of FIG. 25. In any of these, the measurements obtained with the detection angles of 15 degrees and 90 degrees are presented. Here, the XPS spectrum of the detection angle of 15 degrees represents primarily the state of the nitrogen atoms in the vicinity of the surface of the silicon oxide film, while the XPS spectrum of the detection angle of 90 degrees represents primarily the state of the nitrogen atoms in a deep interior of the silicon oxide film.

Both of the diagrams (A) and (B) of FIG. 28 represent the expected result that there are more number of silicon atoms constituting the second nearest neighbor with regard to the nitrogen atoms existing in the deep interior of the film and that there are more number of oxygen atoms constituting the second nearest neighbor with regard to the nitrogen atoms in the surface part of the film.

Further, comparing the diagram (B) of FIG. 28 with the diagram (A) of FIG. 28, it is noted that there is no substantial change in the spectrum structure between any of these detection angles, while this means that there occurs no accumulation of nitrogen atoms in the vicinity of the interface to he silicon substrate by causing migration through the silicon oxynitride film, even when a thermal annealing process is applied.

Thus, the result of FIG. 28 indicates that, there is caused no significant change of nitrogen atom distribution in the silicon oxynitride film or accumulation of the nitrogen atoms in the vicinity of the silicon oxide film and the silicon substrate, even when the high temperature thermal annealing process of the step 4 of FIG. 25 is conducted.

Figure 29:
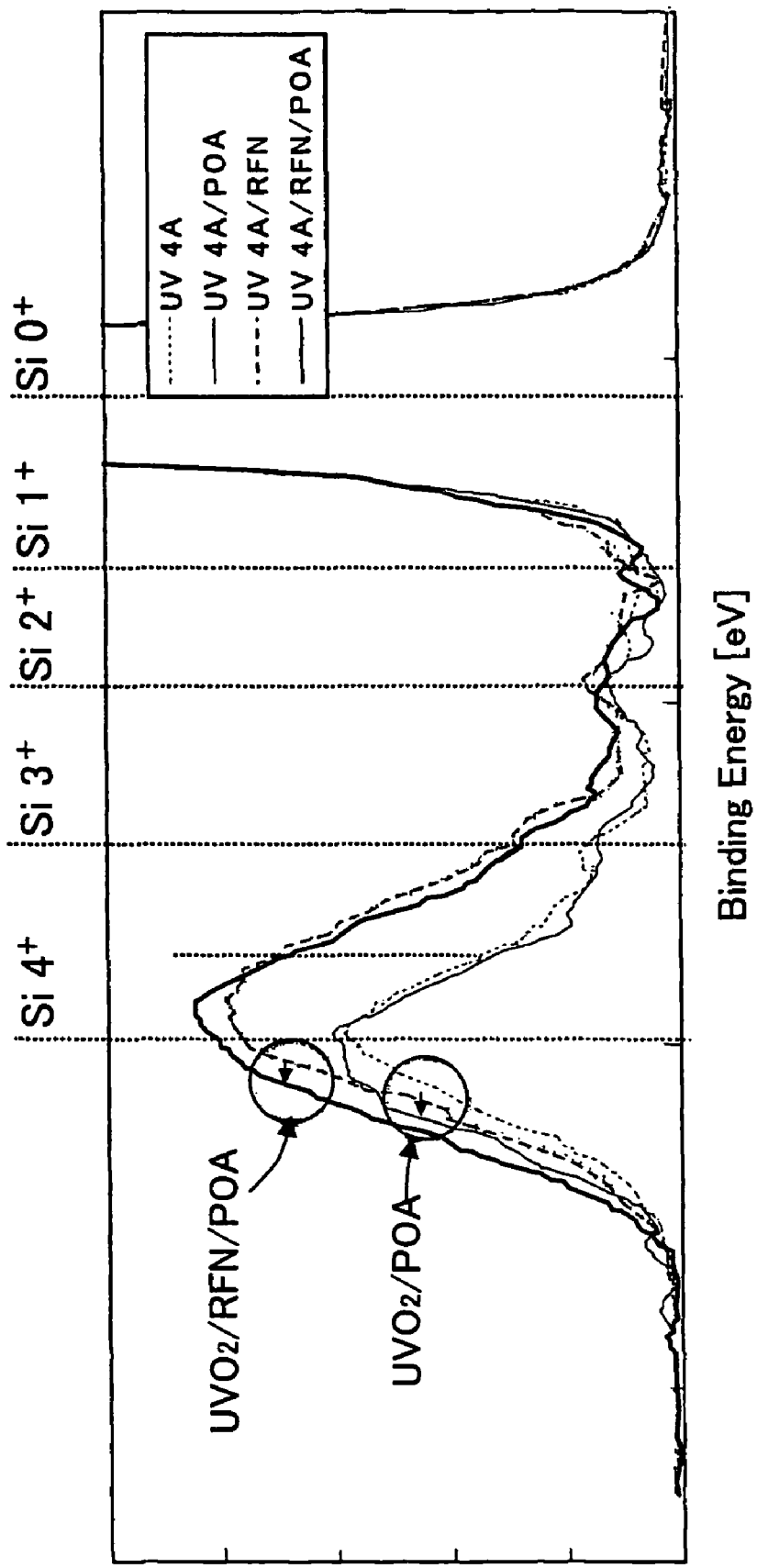
FIG. 29 is another diagram showing the experiment that constitutes the foundation of the present invention.

Further, FIG. 29 shows the XPS spectrum of $Si2p_{3/2}$ observed with regard to the silicon oxide film or silicon oxynitride film formed with the process of FIG. 23 or FIG. 24. In the data of $UVO_2$/POA (post anneal) of the drawing, the broken line represents the XPS spectrum of $Si2p_{3/2}$ of the silicon oxide film in the state of the step 3 of FIG. 24, while the continuous line represents the XPS spectrum of $Si2p_{3/2}$ of the silicon oxide film of the state of the step 4. Further, in the data of $UVO_2$/POA of FIG. 29, the broken line represents the XPS spectrum of $Si2p_{3/2}$ of the silicon oxide film in the state of the step 5 of FIG. 25, while the continuous line represents the XPS spectrum of $Si2p_{3/2}$ of the silicon oxide film of the state of the step 4. In the drawing, the XPS spectrum is normalized by the $Si2p_{3/2}$ peak.

Referring to FIG. 29, it can be seen that there is caused a shift of spectrum peak in the direction of higher energy side with the thermal annealing process of the step 4 in any of the specimens, indicating that the bond between the Si atom and oxygen atom becomes stronger, while this indicates that the interatomic distance is decreased and the film density has been increased.

Figure 30:
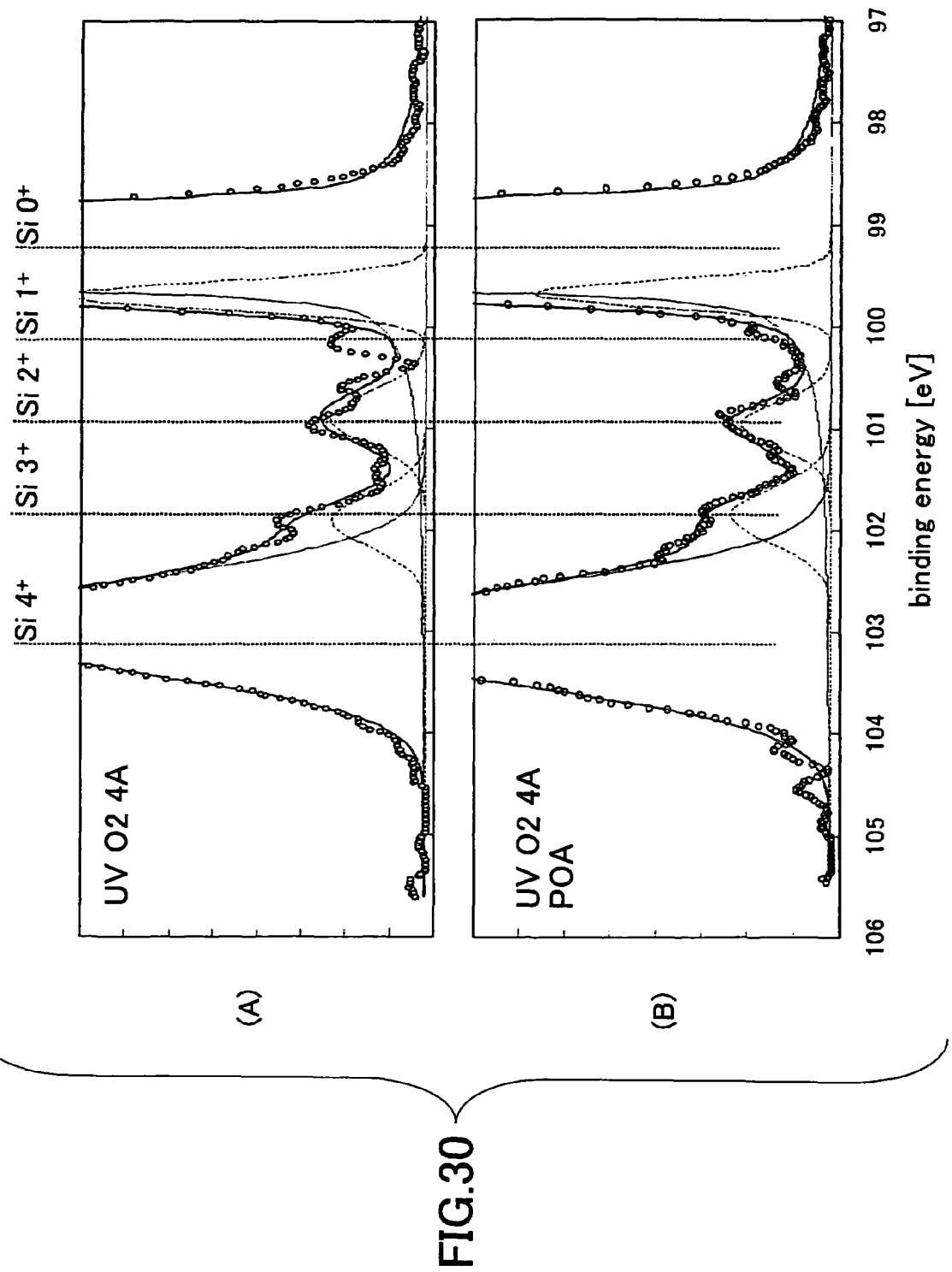
FIG. 30 is another diagram showing the experiment that constitutes the foundation of the present invention.

The diagrams (A) and (B) of FIG. 30 represent the XPS spectra of Si4+, Si3+, Si2+, Si1+ and Si0+ obtained with the step 3 and step 4 of FIG. 24, respectively, wherein the thin continuous lines in the drawings represent the result of fitting these XPS peaks by a Gauss function or Voigt function. In the drawings, the XPS spectrum is normalized by the Si2p3/2 peak.

Comparing the diagram (A) and the diagram (B) of FIG. 30, it can be seen that the peak area ratio between Si2+ and Si0+ is reduced from 0.018 before the thermal annealing process (diagram (A) of FIG. 30) to 0.014 after the thermal annealing process (diagram (B) of FIG. 30), while this indicates that the interface between the silicon substrate and the silicon oxide film is planarized as a result of the thermal annealing process.

Figure 31:
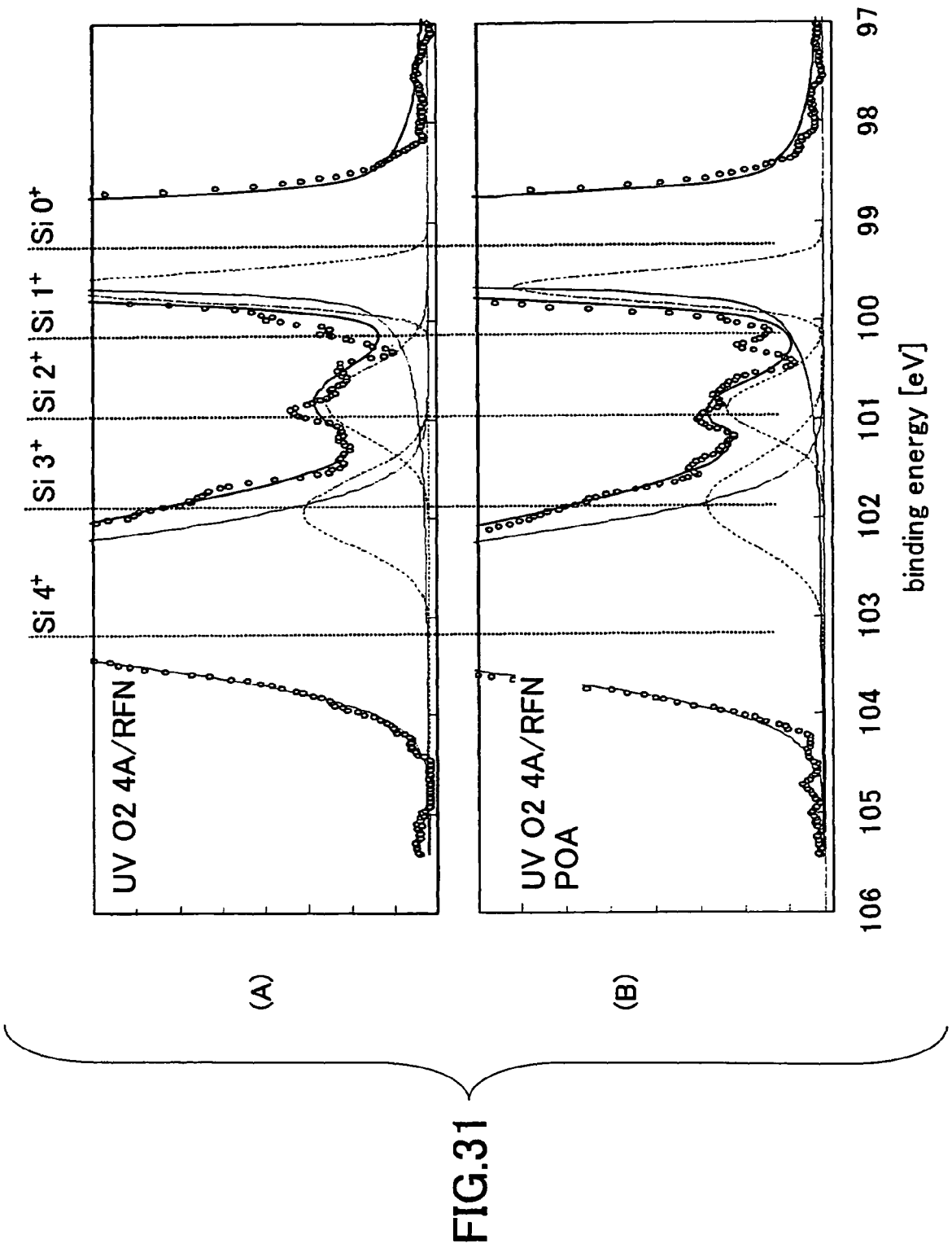
FIG. 31 is another diagram showing the experiment that constitutes the foundation of the present invention.

The diagrams (A) and (B) of FIG. 31 represents the XPS spectrum of Si4+, Si3+, Si2+, Si1+ and Si0+ in the silicon oxynitride film obtained in the step 5 and step 4 of FIG. 25, wherein the thin lines in the drawings represent the result of fitting these XPS peaks by a Gauss function or Voigt function. In the drawings, the XPS spectrum is normalized by the Si2p3/2 peak.

Comparing the diagram (A) and the diagram (B) of FIG. 31, it can be seen that the peak area ratio between Si2+ and Si0+ is reduced from 0.027 before the thermal annealing process (diagram (A) of FIG. 31) to 0.019 after the thermal annealing process (diagram (B) of FIG. 31), while this indicates that the interface between the silicon substrate and the silicon oxide film is planarized as a result of the thermal annealing process.

With the film forming method according to the process of FIG. 25 or FIG. 26, it becomes possible to suppress the SiC formation on the silicon substrate and also improvement in the film characteristics and interface characteristics.

Figure 32A:
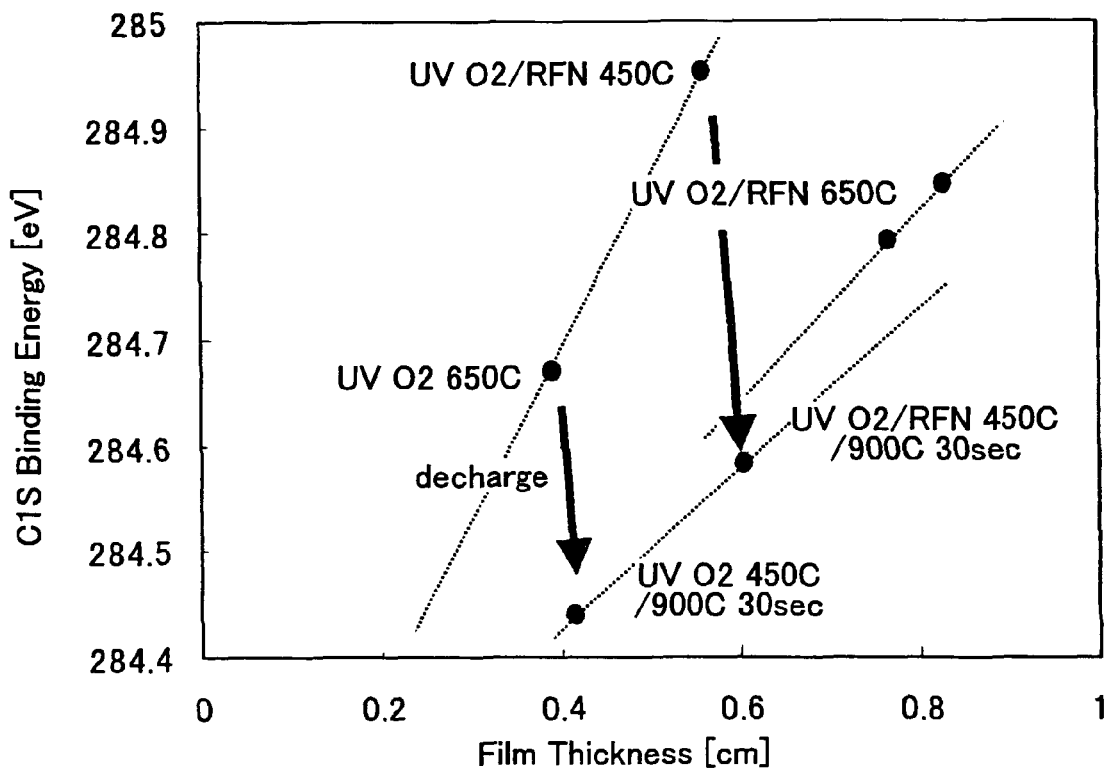
FIG. 32A is a diagram showing the effect of the present invention.

FIG. 32A shows the binding energy of carbon C1s absorbed to the silicon oxide film or the silicon oxynitride film formed by the process of FIG. 24 or FIG. 25.

Referring to FIG. 32A, it can be seen that the C1s binding energy of carbon absorbed to the silicon oxide film formed by the step 3 of FIG. 24 is decreased after the annealing process of the step 4. Similarly, it can be seen that the C1s binding energy of carbon absorbed to the silicon oxynitride film formed with the step 5 of FIG. 24 is decreased after the thermal annealing process of the step 4.

Figure 32B:
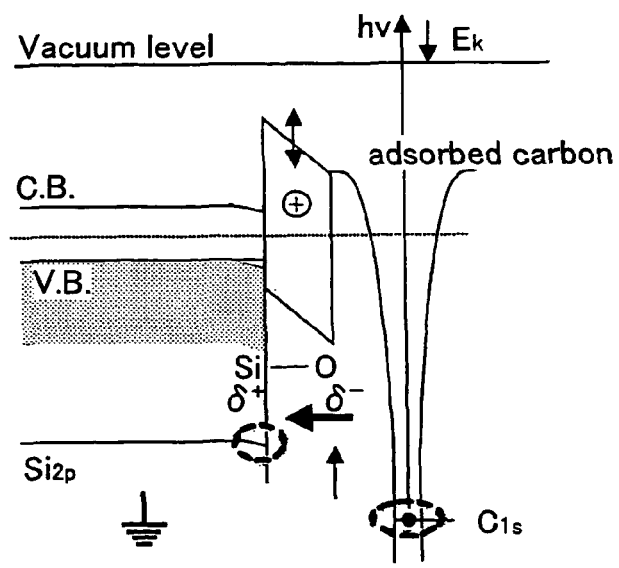
FIG. 32B is another diagram showing the effect of the present invention.

FIG. 32B shows the band structure of the system of silicon substrate/silicon oxide film/adsorbed carbon atoms in which the effect of FIG. 32A is taken into consideration.

Referring to FIG. 32B, it can be seen that the C1s level of the carbon atom adsorbed to the substrate surface is influenced by the surface potential originating from electric charges or dipole density in the film when a grounded silicon substrate is taken as a reference.

Further, from FIG. 32B, it can be seen that the band bending is reduced in the case the electric charges in the film are reduced as a result of the thermal annealing process and that there is caused also a decrease of C1s binding energy.

From the foregoing, it can be seen that the silicon oxide film or silicon oxynitride film annealed at high temperatures is a high-quality film in which electric charges in the film are reduced. Summarizing above, it is concluded that it becomes possible to obtain a high-quality oxide film or nitride film, in which not only the interface characteristics are improved but also the properties of the film itself are improved, as a result of the thermal annealing process in the step 4 of FIG. 24 or FIG. 25 or as a result of the RF-$N_2$ processing of the step 5 of FIG. 25.

Figure 33:
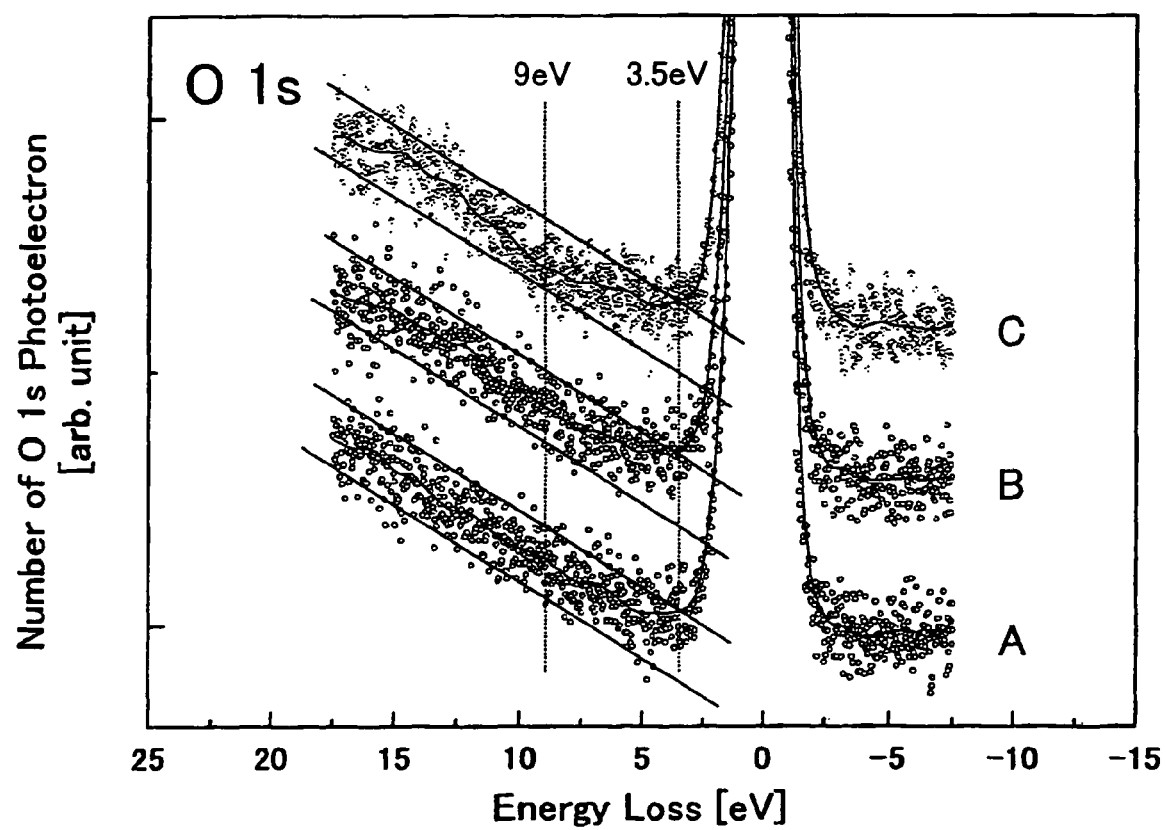
FIG. 33 is a diagram showing the effect of the second embodiment of the present invention.

FIG. 33 represent an energy loss spectrum of O1s photoelectron of oxynitride films A, B and C having a generally the same film thickness obtained by XPS method. In FIG. 33, each of the spectra A-C is normalized such that the peak area of O1s photoelectron becomes identical wherein the spectra A-C are represented with suitable displacement in the vertical direction for facilitating understanding. Further, the drawing represents, in addition to the raw data points obtained by the XPS method, a spectrum obtained by smoothing these data points by FFT (high-frequency Fourier transform) with a thin continuous line.

With regard to the oxynitride films A, B and C, it should be noted that the oxynitride film A is formed based on a radical oxide film, which in turn is formed on a silicon substrate by using oxygen radicals excited by SPA (Slot Pate Antenna) microwave plasma at a low temperature (400° C.), while the oxynitride film B is formed based on a radical oxide film, which in turn is formed on a silicon substrate by using oxygen radicals excited by the foregoing microwave plasma at a high temperature (700° C.). Further, the film C is formed based on a radical oxide film (UV-$O_2$ film), which in turn is formed on a silicon substrate with the thickness of 0.4 nm by using the UV-$O_2$ processing up to the temperature of 450° C. and then processing the oxide film thus formed with UV-excited oxygen radicals excited ultraviolet radiation of the wavelength of 172 nm at a high temperature (700° C.). It should be noted that the formation of the radical oxide film C is conducted under the processing pressure of 67 Pa and for 300 seconds while supplying oxygen with the flow rate of 450 SCCM. In any of the oxynitride films A-C, the base oxide film is formed such that no SiC defect is formed.

Next, the nitridation processing of the base oxide film is conducted in any of the films A-C by the SPA microwave plasma processing. More specifically, the nitridation processing is conducted under the processing pressure of 127 Pa for 11 seconds while supplying an Ar gas and a nitrogen gas with respective flow rates of 2000 SCCM and 150 SCCM and further supplying a microwave with the power of 1600 W. With regard to the SPA microwave plasma processing, reference should be made to Japanese Laid Open Patent Application 2000-294550. Additionally, for the plasma source, it is also possible to use ICP (induction-coupled plasma) or surface wave interference plasma. Further, the oxidation may be conducted by a rapid thermal oxidation processing.

Referring to the FFT-smoothed spectra of FIG. 33, it can be seen that there occurs an increase in the number of detected O1s photoelectrons in the oxynitride film A (spectrum A) generally linearly from the energy loss value of about 3.5 eV represented in the drawing by a dotted line. In correspondence to this, straight lines of the same gradient are represented in FIG. 33 respectively as the upper limit reference and lower limit reference of the spectrum A. Further, similar straight lines of the same gradient are shown also in the spectrum B and the spectrum C as the upper limit reference and the lower limit reference of the data point.

Comparing the FFT-smoothed spectrum of the spectrum B with the foregoing upper limit reference and the lower limit reference, it can be seen that, while there is some difference with regard to the linearity of the FFT-smoothed spectrum over the case of the spectrum A, the parallelism is maintained for the FFT-smoothed spectrum and the upper and the lower references, similarly to the case of the spectrum A.

In the case of the spectrum C, on the other hand, there can be seen no clear rising up in the number of the detected O1s photoelectrons at the energy loss value of 3.5 eV, contrary to the spectrum A or spectrum B noted before, but the increase in the number of the photoelectrons takes place at the energy loss value of 9 eV.

Thus, it can be seen that there is caused a difference in the energy loss spectrum when forming an oxynitride film by nitriding an oxide film by the formation process of oxide film used for the base.

Figure 34:
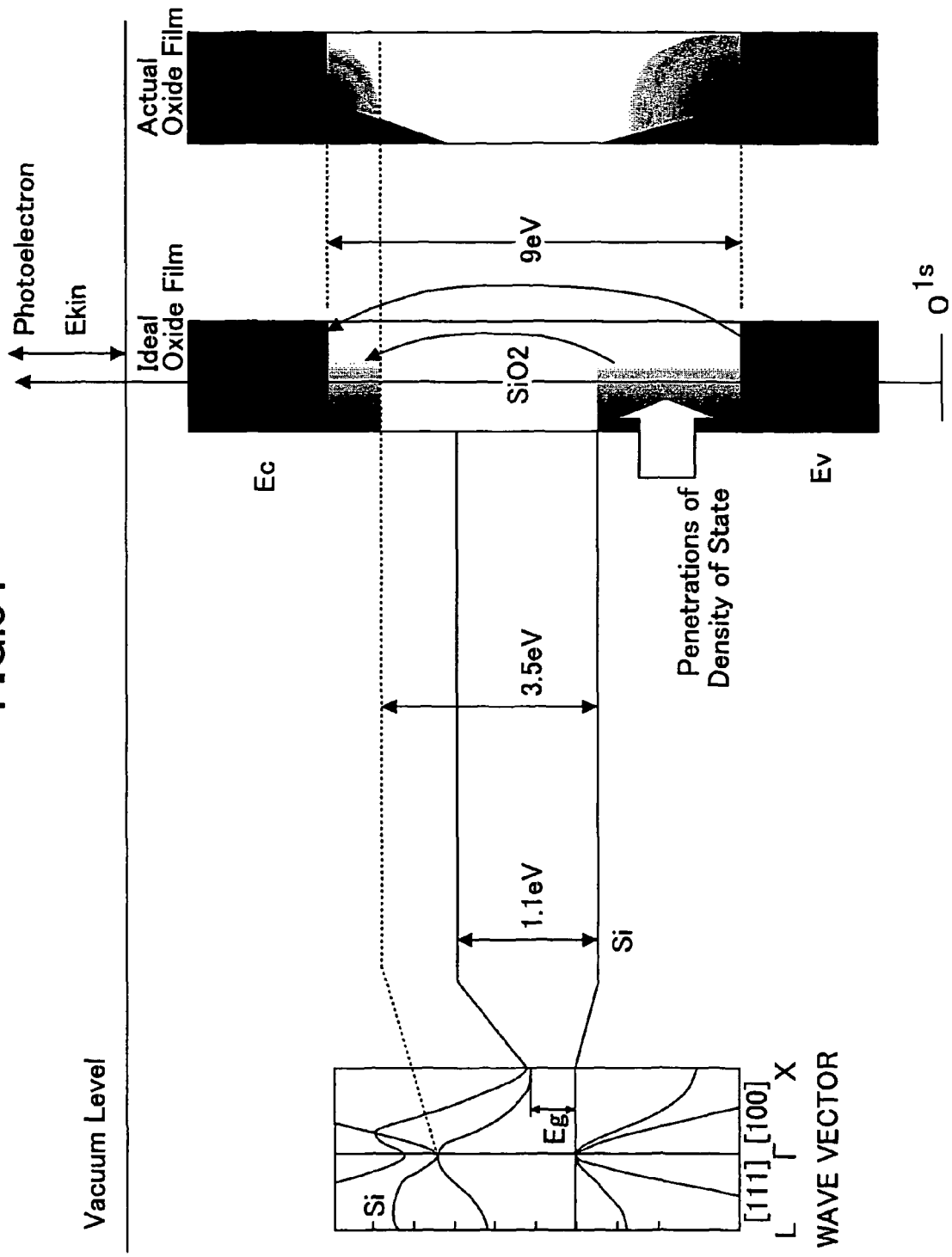
FIG. 34 is a diagram explaining the mechanism corresponding to the effect of FIG. 33.

FIG. 34 is a diagram explaining the mechanism that causes such a difference of energy loss spectrum in the oxynitride film by the formation process of the base oxide film.

Referring to FIG. 34, the rising of energy loss spectrum occurs at the energy loss value of about 9 eV corresponding to the bandgap of an ideal oxide film in the case the silicon oxide film has a sufficiently large thickness. This is because a part of the O1s photoelectrons causes non-elastic collision inside the oxide film and the energy of 9 eV necessary for exciting an electron in the valence band Ev to the conduction band Ec is used in this excitation process. Reference should be made to K. Takahashi, et al., Jpn. J. Appl. Phys. 41, L223, 2002.

When the thickness of the oxide film is decreased, on the other hand, the state density of the valence band Ev and the conduction band Ec in the silicon substrate, and hence the wavefunction, penetrates into the oxide film by tunneling effect, and the O1s photoelectrons formed in the oxide film undergoes energy loss also with inter-band transition that takes place between these state densities. Thus, the reason that the number of the O1s photoelectrons starts to increase at the energy low value of 3.5 eV with the spectrum A or spectrum B is attributed to the effect that there is caused penetration of the state density of substrate silicon with the oxynitride films A and B and that the energy loss is caused by the inter-band direct transition (transition at $\Gamma$ point) of silicon caused by the penetrating state density.

Contrary to this, penetration of the wavefunction, which causes the inter-band direct transition corresponding to the direct transition in the silicon substrate, is reduced with the oxynitride film C of the similar film thickness, and it is believed that this situation is reflected in the fact that the increase of the number of the O1s photoelectrons takes place at 9 eV, not at 3.5 eV. Further, such decrease of penetration of the wavefunction means that the oxynitride film C forms a steep rising potential barrier and that the interface characteristics between the oxynitride film and the silicon substrate, such as the surface roughness, are improved in the atomic layer level.

Figure 35:
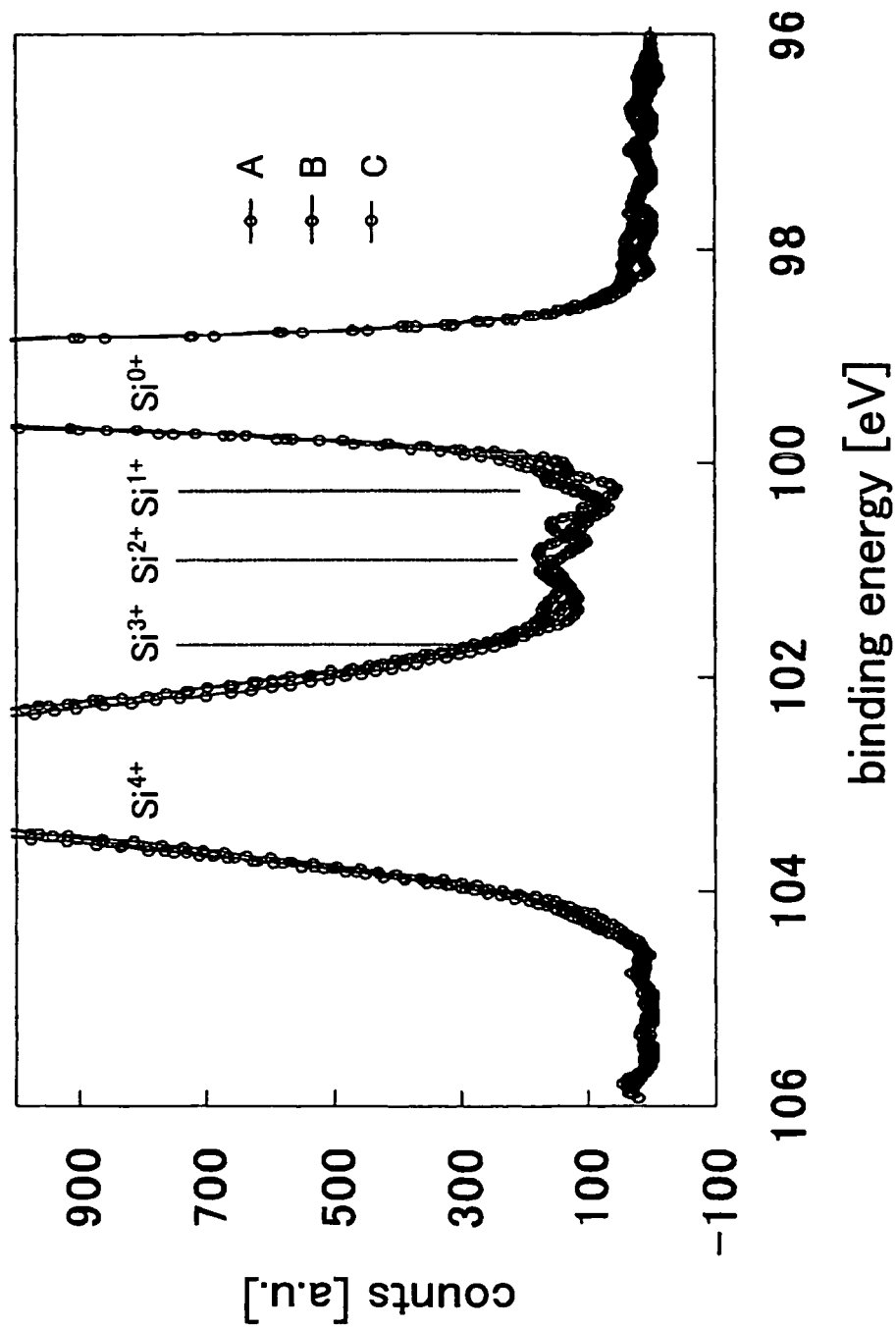
FIG. 35 is another diagram showing the effect of the present invention.

In fact, the difference of interface characteristics is evident also from the Si2p spectrum of the SiON films A, B and C shown in FIG. 35.

Referring to FIG. 35, it is recognized that there exists a slight difference between the oxynitride films A, B and C with regard to the peaks of Si1+, Si2+ and Si3+ showing the compositional transition layer at the interface between the silicon substrate and the SiON film. Particularly, with the oxynitride film C, it can be seen that the signal strength of the Si1+ peak of smaller oxidation valence number is decreased as compared with other oxynitride films A and B.

Figure 36:
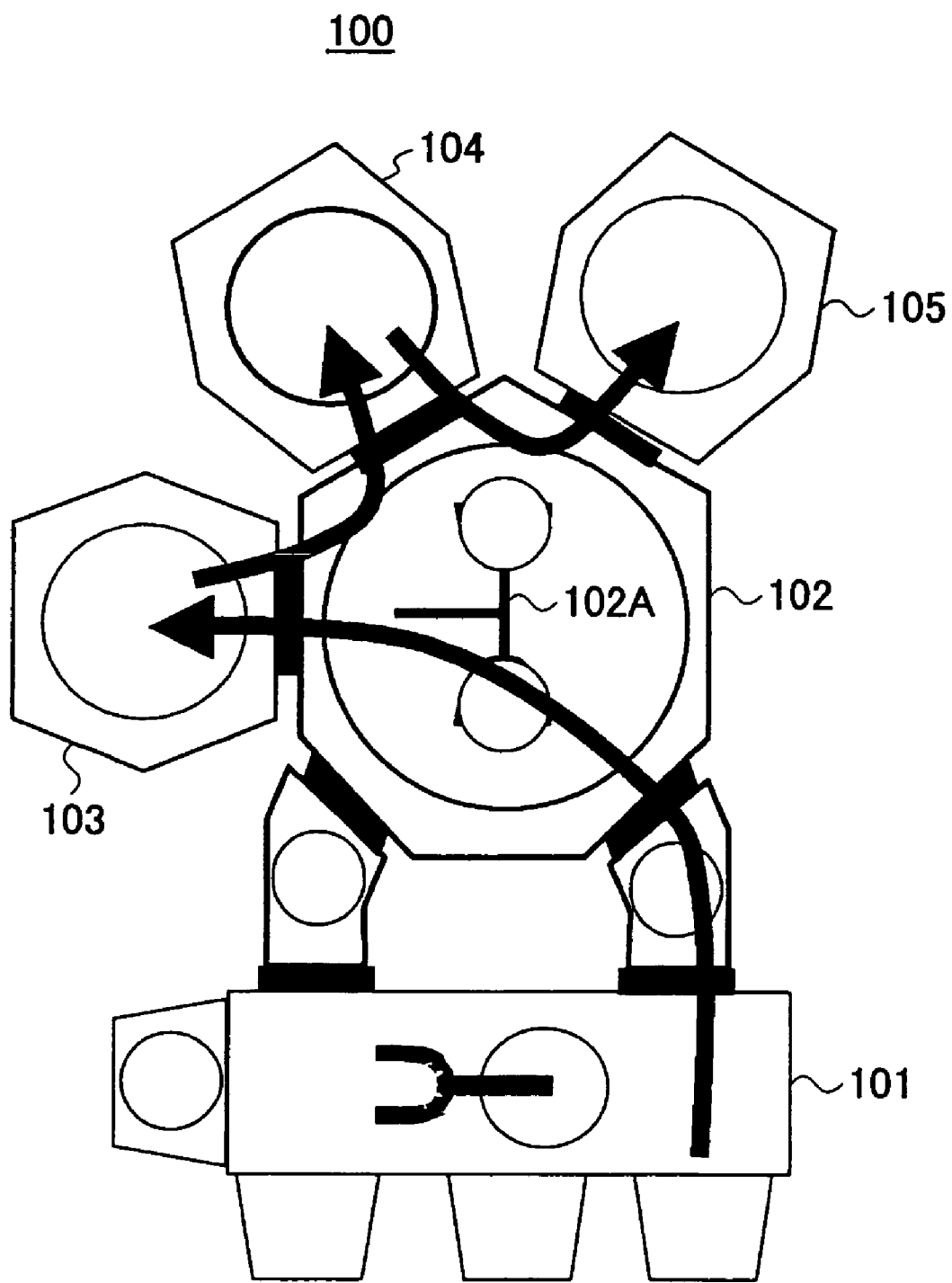
FIG. 36 is a diagram showing the construction of a substrate processing system according to a modification of the second embodiment of the present invention.

FIG. 36 shows a cluster type substrate processing system 100 suitable for carrying out the process of FIG. 24 or FIG. 25.

Referring to FIG. 36, the substrate processing system 100 includes a load-lock chamber 101 for loading and unloading a substrate and a vacuum substrate transportation chamber 102 having a transportation arm 102A and connected to the load-lock chamber 101, wherein the vacuum substrate transportation chamber 102 is connected with a processing chamber 103 formed of the substrate processing apparatus 20 of FIG. 1, a rapid thermal processing (RTP) chamber 104, and a CVD or ALD processing chamber 105 used for carrying out deposition of a high dielectric film.

Thus, the silicon substrate introduced into the load-lock chamber 101 is transported from the vacuum substrate transportation chamber 102 to the processing chamber 103, wherein there is formed a silicon oxide film of the thickness of about 0.4 nm is formed as a result of the UV-$O_2$ processing conducted at the temperature of 450° C. or less where there is caused no SiC formation, in correspondence to the step 3 of FIG. 23 or FIG. 23. The processing chamber may be the one that carries out the oxidation processing by damage-free ICP plasma or microwave plasma.

Thereafter, the silicon substrate is transported to the RTP processing chamber 104 via the vacuum substrate transportation chamber 102, and the thermal annealing process corresponding to step 4 of FIG. 24 or FIG. 25 is carried out.

Further, after the foregoing thermal annealing process, the silicon substrate is transported to processing chamber 105 via the vacuum substrate transportation chamber 102, and a high-K dielectric film such as $HfO_2$, $HfSiO_4$, $Al_2O_3$, or the like, or combination thereof, is deposited.

With the substrate processing system 100 of FIG. 36, it is also possible to carry out an RF nitridation processing corresponding to the step 5 of FIG. 24 in the processing chamber 103 according to the needs. Alternatively, this processing may be conducted by providing a separate processing chamber. Further, with the substrate processing system 200 of FIG. 36, it is also possible to carry out a further $UV-O_2$ processing or $RF-N_2$ processing in the processing chamber 104 at a temperature higher than in the processing chamber 103. The foregoing processing chamber may be an oxidation/nitridation processing chamber that uses damage-free ICP plasma or microwave plasma.

Further, with the substrate processing system 100 of FIG. 36, the thermal annealing process of the oxide film or oxynitride film formed in the processing chamber 103 may be conducted in the processing chamber 104 after forming the high-K dielectric film in the processing chamber 105 simultaneously to the thermal annealing process of the high-K dielectric film in one step. In this case, the silicon substrate may be transported along a path shown in FIG. 37.

Figure 38:
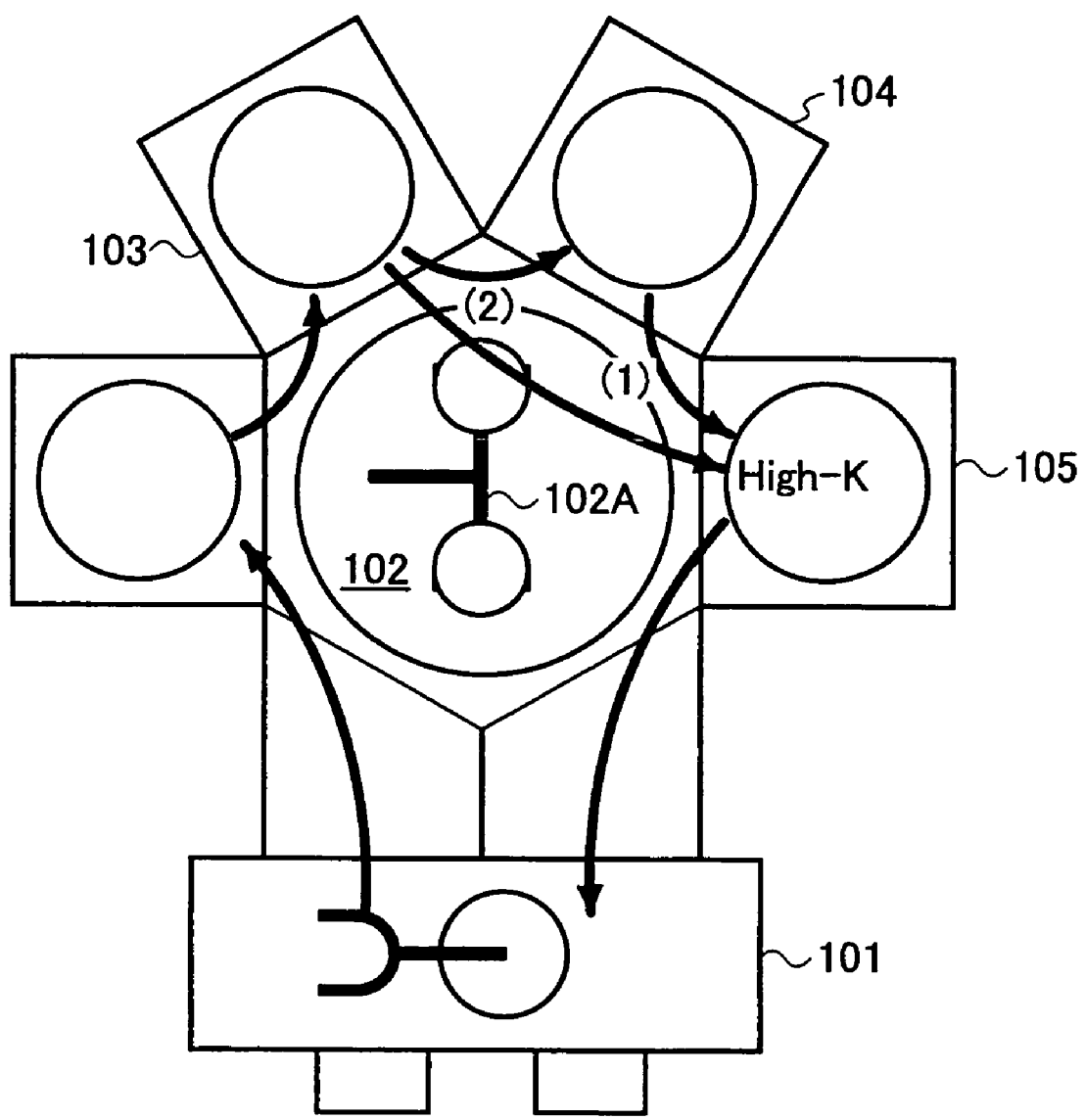
FIG. 38 is a diagram showing a furthermore modification of the substrate processing system of FIG. 36.

Further, while using another cluster-type processing apparatus shown in FIG. 38, it is possible to transport the substrate along various paths (1) and (2). In this case, it is possible to carry out the thermal oxidation (RT oxidation) processing, ICP oxidation processing, SPA oxidation processing, or the like, in the processing chamber 103, and similarly, it is possible to carry out the rapid thermal nitridation (RT nitridation) processing, ICP nitridation processing or SPA nitridation processing with the processing chamber 104.

In the first and second embodiments explained heretofore, it is also possible to supply a NO gas in place of the oxygen gas when processing the substrate surface with oxygen radicals or when forming an oxide film by irradiating ultraviolet radiation.

Further, while it is preferable to use an excimer lamp of the wavelength of 172 nm for the optical source 25, it is also possible to use an excimer lamp of other wavelength as long as it is possible to excite an oxygen gas or a NO gas to form oxygen radicals. Further, although efficiency is inferior, it is also possible to use a mercury lamp. present invention of controlling the temperature elevation process appropriately can be combined with various processes used for formation of silicon oxide film.

THIRD EXAMPLE

Figure 39A:
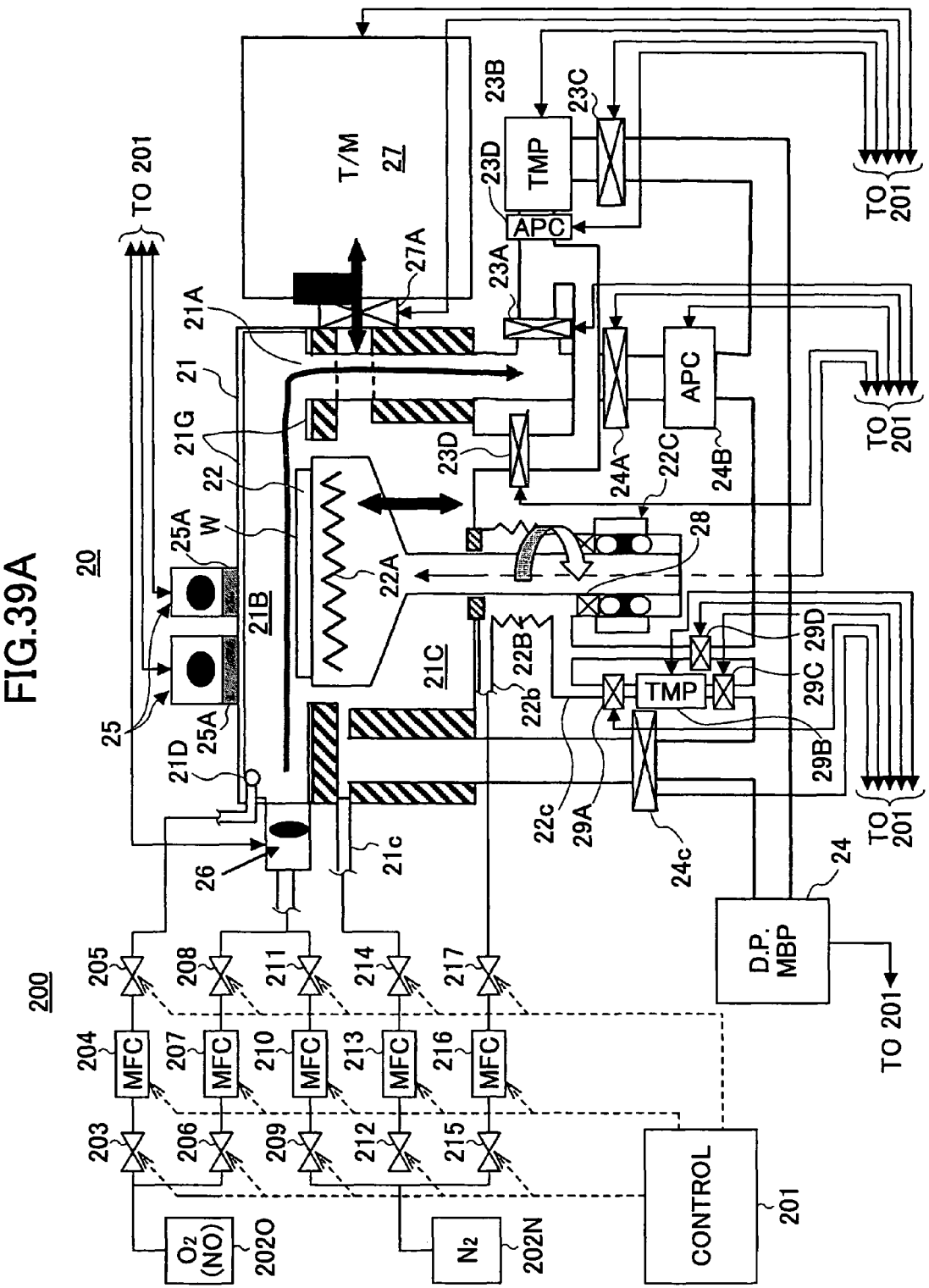
FIG. 39A is a diagram showing the construction of a substrate processing system according to a third embodiment of the present invention.
Figure 39B:
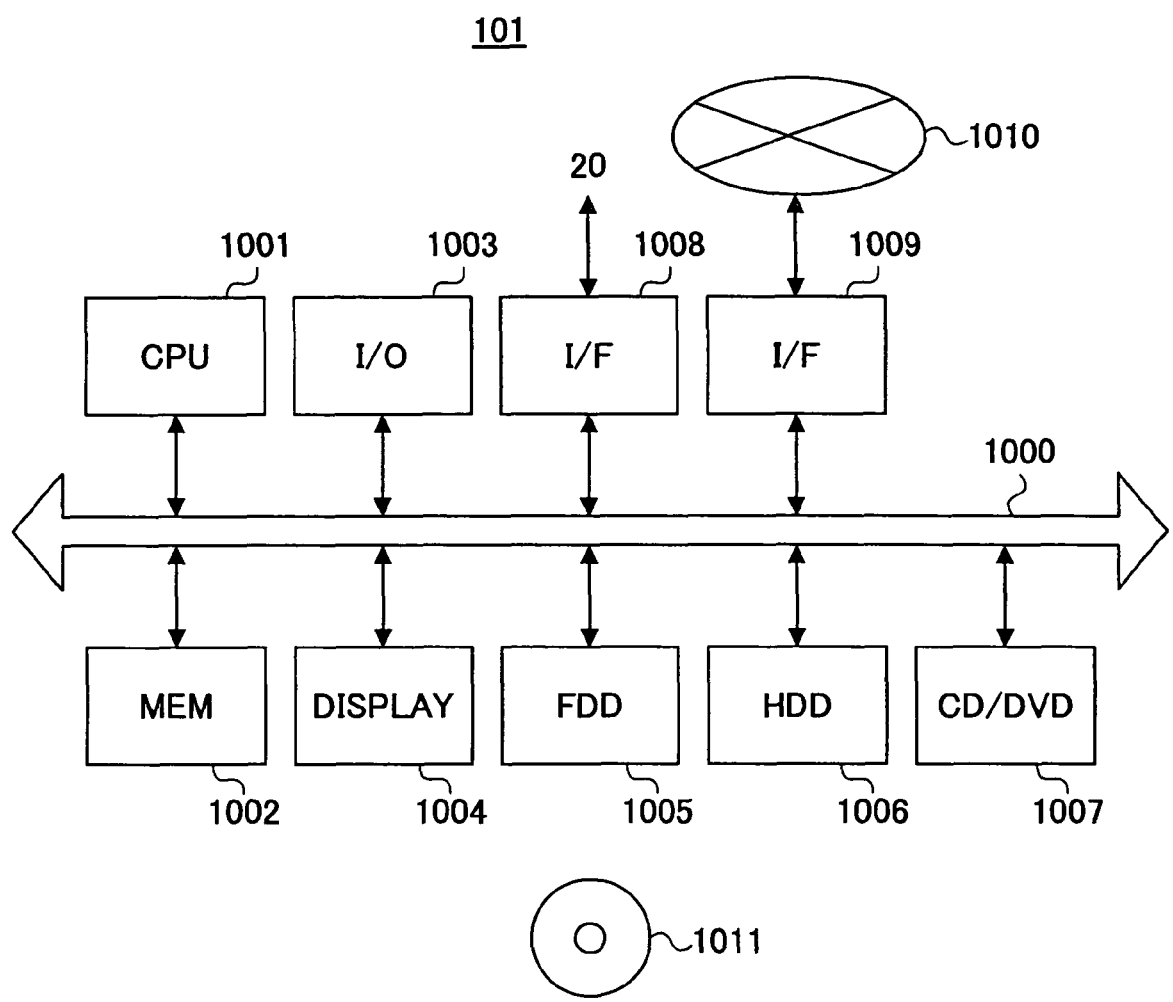
FIG. 39B is a diagram showing the construction of a control unit used with the substrate processing system of FIG. 39A.

FIG. 39A is a diagram showing the overall construction of a substrate processing system 200 including the substrate processing apparatus 20 of FIG. 1. Further, FIG. 39B shows the construction of a computer used for controlling the substrate processing apparatus 20 in the system 200 of FIG. 39A.

Referring to FIG. 39A, the substrate processing system 200 includes a gas supply system including an oxygen gas source 202O (NO gas source in some cases) and a nitrogen gas source 202N, wherein the oxygen gas in the oxygen gas source 202O is supplied to the gas nozzle 21D via a valve 203, a mass flow controller (MFC) 204 and further a valve 205, and further to the remote plasma source 26 via a valve 206, a mass flow controller (MFC) 207 and further a valve 208.

Further, the nitrogen gas in the nitrogen gas source 202N is supplied to the remote plasma source 26 via a valve 209, a mass flow controller (MFC) 210 and further a valve 211, to the purge line 21c via a valve 212, a mass flow controller (MFC) 213 and a valve 214, and further to another purge line 22b via the valve 215, the mass flow controller (MFC) 216 and the valve 217.

Further, the system 200 includes a system controller 201 that controls the valves 203, 205, 206, 208, 209, 211, 212, 214, 215 and 217 and the mass flow controllers (MFC) 204, 207, 210, 213 and 216.

The system controller 201 further controls the ultraviolet optical source 25, the remote plasma source 26, the heater 22A, the valves 23A, 23C, 23D, 24A, 24c, 27A, 29A, 29C and 29D, the turbo molecular pumps 23B and 29B, the APCs 23D and 24B, the dry pump 24, a lifter pin drive mechanism provided in the stage 22 although not illustrated, an elevation mechanism of the stage 22 not illustrated, or the like, and with this, the substrate processing apparatus 20 performs the substrate processing explained previously with reference to FIGS. 7-23 or the substrate processing explained previously with reference to FIGS. 24-37.

Figure 37:
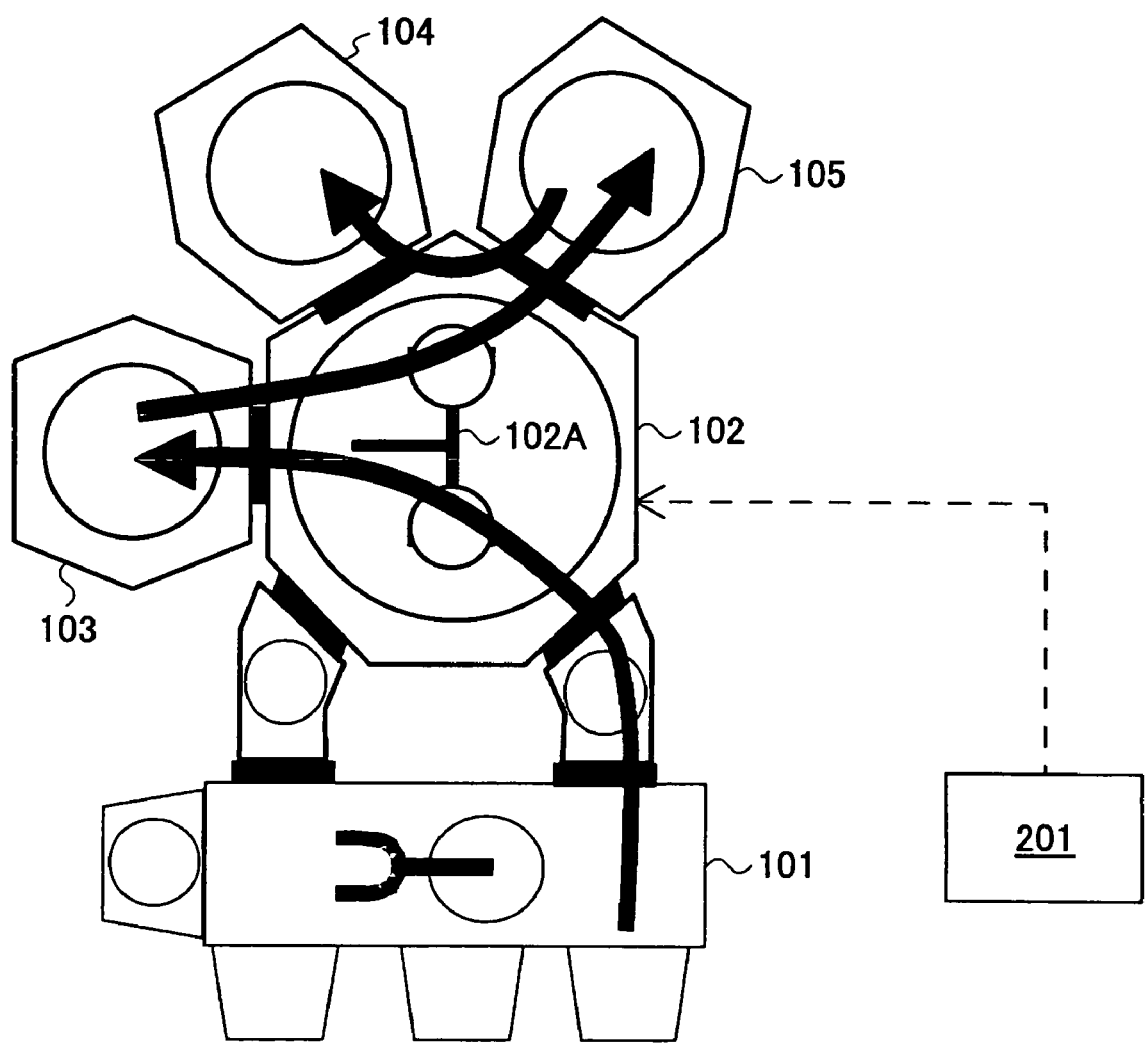
FIG. 37 is a diagram showing a modification of the substrate processing system of FIG. 36.

Further, the system controller 201 is used for controlling the cluster-type processing apparatus shown in FIG. 37 or FIG. 38.

FIG. 39B shows an example of the construction of such a system controller 201.

Referring to FIG. 39B, the system controller 201 is a general-purpose computer and includes a CPU 1001 connected to a system bus 1000, a memory 1002, an input-output interface 1003, a display device 1004 connected to an input device such as keyboard or mouse, a floppy-disk disc drive 1005, a hard disk drive 1006, a CD/DVD drive 1007, or the like.

A computer-readable storage medium 1011 such a floppy-disk or optical disk cooperates with the floppy-disk disc drive or CD/DVD drive 1007, and a control program of the substrate processing apparatus 20 recorded thereon is stored in the hard disk drive 1006.

The control program in the hard disk drive 1006 is expanded in the memory 1002 middle and the CPU 1001 carries out the processing according to the control program.

With the system controller 201 of FIG. 39B, an interface unit 1008 is mounted upon the system bus 1000, and the system controller 201 controls the substrate processing apparatus 20 via the interface unit 1008 as it carries out the processing in accordance with the control program. With this, the substrate processing apparatus 20 carries out the substrate processing explained previously.

With the system controller 201, a network interface unit 1009 connected to a network 1010 is connected to the system bus 1000, and thus, it is also possible to download the control program via the network 1010.

Further, while the foregoing embodiment was explained with regard to the example in which the control program is stored in the hard disk drive 1006, it is also possible to load the control program directly to the memory 1002 from the recording medium such as a floppy-disk disk or an optical disk. Further, it is also possible to load the control program in the memory 1002 directly from the network 1010 to via the network interface 1009. In this case, it is also possible remote control the substrate processing apparatus 20 via the network 1010.

Further, the system controller 201 is useful, when the substrate processing apparatus 20 is used to construct the cluster type substrate processing system 100 of FIG. 36 or 37, to control the substrate processing apparatus 20 including the control of transportation of the substrate via the substrate transportation chamber 102.

Further, while the present invention has been explained for preferred embodiments, the present invention is by no means limited to such specific embodiments and various variations and modifications may be made within the scope of the invention set forth in claims.

What is claimed is:

1. A film forming method for forming an oxide film on a surface of a substrate to be processed in a processing vessel at a predetermined processing temperature, said method comprising:
a step of elevating a temperature of said substrate incorporated into said processing vessel to a predetermined processing temperature,
said step of elevating a temperature being a first processing step performed on said substrate after said substrate is incorporated into said processing vessel,
said step of elevating the temperature including a step of holding said substrate in an atmosphere consisting of oxygen or oxygen and nitrogen before said substrate reaches a temperature of 450° C., and
wherein said film forming method further comprises, after said step of elevating the temperature, a film forming step of forming a radical oxide film by irradiating said substrate surface with energy capable of exciting an oxygen gas, and
wherein said temperature elevating step is carried out such that a surface of said substrate to be processed is covered, before formation of said oxide film at said predetermined temperature, with an oxide film of a thickness of about 0.4 nm.

2. The film forming method as claimed in claim 1, wherein said temperature elevating step of said substrate comprises the step of irradiating said substrate surface with energy capable of exciting an oxygen gas.

3. The film forming method as claimed in claim 1, wherein said step of irradiating energy comprises the step of irradiating ultraviolet radiation.

4. The film forming method as claimed in claim 3, wherein said ultraviolet radiation has a wavelength of 172 nm.

5. The film forming method as claimed in claim 1, wherein said substrate is rotated when held in said atmosphere consisting of oxygen or oxygen and nitrogen.

6. The film forming method as claimed in claim 1, wherein said substrate to be processed is a semiconductor substrate containing silicon as a primary component.

7. The film forming method as claimed in claim 1, wherein said atmosphere of the step of elevating temperature consisting of oxygen contains an oxygen gas.

8. The film forming method as claimed in claim 7, wherein said oxygen gas is contained with a concentration of 5 Pa or more in terms of partial pressure.

9. The film forming method as claimed in claim 1, wherein said atmosphere of the step of elevating temperature contains an NO gas.

10. The film forming method as claimed in claim 1, wherein said temperature elevating step is carried out such that a product of oxygen partial pressure and processing time is equal to or smaller than 199 Pa.sec.

11. The film forming method as claimed in claim 1, wherein said predetermined temperature is in a range of 450-750° C.

12. The film forming method as claimed in claim 1, wherein said predetermined temperature is 700° C. or higher.

13. The film forming method as claimed in claim 1, wherein said substrate is held, in said temperature elevating step, in said atmosphere containing oxygen at a first pressure, wherein said method further comprises an intermediate step, after said step of elevating temperature but before said step of forming said oxide film, of holding said substrate in an inert atmosphere at a second, lower pressure.

14. A film forming method for forming an oxide film on a surface of a substrate to be processed in a processing vessel at a predetermined processing temperature, said method comprising:
a step of elevating a temperature of said substrate incorporated into said processing vessel to a predetermined processing temperature,
said step of elevating a temperature being a first processing step performed on said substrate after said substrate is incorporated into said processing vessel,
said step of elevating the temperature including a step of holding said substrate in an atmosphere consisting of oxygen or oxygen and nitrogen before said substrate reaches a temperature of 450° C.,
wherein said film forming method further comprises, after said step of elevating the temperature, a film forming step of forming a radical oxide film by irradiating said substrate surface with energy capable of exciting an oxygen gas,
said temperature elevating step is carried out such that a surface of said substrate to be processed is covered, before formation of said oxide film at said predetermined temperature, with an oxide film of a thickness of about 0.4 nm,
said substrate is held, in said temperature elevating steps in said atmosphere containing oxygen at a first pressure, wherein said method further comprises an intermediate step, after said step of elevating temperature but before said step of forming said oxide film, of holding said substrate in an inert atmosphere at a second, lower pressure, and
wherein said intermediate step of holding said substrate at said second pressure is carried out in a state in which said substrate is lifted up from a substrate holding stage.

15. A film forming method, comprising the steps of:
forming an oxide film on a surface of said substrate to be processed; and
annealing said oxide film in an inert gas atmosphere,
said step of forming said oxide film comprising the steps of:
supplying a gas consisting of oxygen to said substrate surface when said substrate has been incorporated into a processing vessel,
said step of supplying a gas consisting of oxygen being a first processing step performed on said substrate after said substrate is incorporated into said processing vessel;
forming oxygen radicals by exciting said gas consisting of oxygen by ultraviolet radiation; and
oxidizing said substrate surface with said oxygen radicals,
wherein said step of oxidizing said substrate surface being carried out at a substrate processing temperature of 450° C. or less,
wherein said thermal annealing step being carried out at a temperature higher than said substrate processing temperature, and
wherein said temperature elevating step is carried out such that a surface of said substrate to be processed is covered, before formation of said oxide film at said predetermined temperature, with an oxide film of a thickness of about 0.4 nm.

16. The film forming method as claimed in claim 15, further comprising, after said step of forming said oxide film but before said thermal annealing step, the step of plasma nitriding said oxide film.

17. The film forming method as claimed in claim 15, wherein there is provided, after said thermal annealing step, a plasma nitriding step of said oxide film.

18. The film forming method as claimed in claim 15, wherein said step of forming said oxide film and said thermal annealing step are carried out in a same processing vessel.

19. The film forming method as claimed in claim 15, wherein said step of forming said oxide film is carried out in a first processing vessel, and wherein said thermal annealing step is carried out in a second processing vessel.

* * * * *